United States Patent
Yamada et al.

(10) Patent No.: US 9,628,046 B2
(45) Date of Patent: Apr. 18, 2017

(54) RESONATOR ELEMENT, RESONATOR, OSCILLATOR, ELECTRONIC APPARATUS, AND MOBILE OBJECT

(71) Applicant: SEIKO EPSON CORPORATION, Tokyo (JP)

(72) Inventors: Akinori Yamada, Ina (JP); Takashi Yamazaki, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 18 days.

(21) Appl. No.: 14/541,759

(22) Filed: Nov. 14, 2014

(65) Prior Publication Data

US 2015/0135931 A1    May 21, 2015

(30) Foreign Application Priority Data

Nov. 16, 2013 (JP) ................. 2013-237476
Nov. 16, 2013 (JP) ................. 2013-237477
Nov. 16, 2013 (JP) ................. 2013-237480

(51) Int. Cl.

| | |
|---|---|
| *H03H 9/02* | (2006.01) |
| *H03H 9/05* | (2006.01) |
| *H03H 9/21* | (2006.01) |
| *H03H 9/15* | (2006.01) |
| *H03H 3/04* | (2006.01) |
| *H03B 5/32* | (2006.01) |

(Continued)

(52) U.S. Cl.
CPC ......... *H03H 9/02157* (2013.01); *G01L 1/106* (2013.01); *H03B 5/32* (2013.01); *H03H 3/04* (2013.01); *H03H 9/0509* (2013.01); *H03H 9/0547* (2013.01); *H03H 9/15* (2013.01); *H03H 9/21* (2013.01); *H03H 9/215* (2013.01)

(58) Field of Classification Search
CPC ........ G01L 1/106; H03B 5/32; H03H 9/0547; H03H 9/21; H03H 9/215; H03H 3/04; H03H 9/15
USPC ............ 84/410; 331/156, 158; 310/370, 367
See application file for complete search history.

(56) References Cited

U.S. PATENT DOCUMENTS 5,757,107 A * 5/1998 Wakatuki ................. H03H 9/21
                                                   310/366
5,861,705 A * 1/1999 Wakatsuki ............... H03H 9/21
                                                   310/326

(Continued)

FOREIGN PATENT DOCUMENTS

| JP | A-11-51802 | 2/1999 |
| JP | A-2000-349181 | 12/2000 |

(Continued)

*Primary Examiner* — Christopher Uhlir
*Assistant Examiner* — Christina Schreiber
(74) *Attorney, Agent, or Firm* — Oliff PLC

(57) ABSTRACT

A resonator element includes a resonator blank having a base portion, a vibrating arm, a linking portion, and a connecting portion connects the base portion and the linking portion to each other, in which, when a thickness of the resonator blank is set to T, a width of the base portion is set to W1, and a width of the connecting portion is set to W2, a relationship of 50 µm≤T≤210 µm is satisfied, and a relationship of 0.067≤W2/W1≤0.335 is satisfied, and in which, when a width of the arm section of the vibrating arm is set to W3, and a width of the hammer head is set to W4, a relationship of W4≥2.8×W3 is satisfied.

20 Claims, 60 Drawing Sheets

(51) Int. Cl.
*G01L 1/10* (2006.01)
*H03H 9/215* (2006.01)

(56) References Cited

U.S. PATENT DOCUMENTS

| | | | | |
|---|---|---|---|---|
| 7,518,291 | B2* | 4/2009 | Tanaya | H03H 3/04 310/348 |
| 2006/0158067 | A1 | 7/2006 | Aratake et al. | |
| 2006/0284694 | A1* | 12/2006 | Kawashima | H03B 5/32 331/158 |
| 2007/0182289 | A1 | 8/2007 | Kigawa et al. | |
| 2008/0042523 | A1* | 2/2008 | Kuroda | H03H 9/0595 310/344 |
| 2008/0211350 | A1* | 9/2008 | Tanaya | H03H 3/04 310/328 |
| 2010/0084949 | A1 | 4/2010 | Ichikawa | |
| 2010/0301954 | A1* | 12/2010 | Fukuda | H01L 23/055 331/116 R |
| 2011/0063041 | A1* | 3/2011 | Yamada | H03H 9/0547 331/158 |
| 2011/0068876 | A1* | 3/2011 | Yamada | H03H 9/1021 331/158 |
| 2011/0140795 | A1 | 6/2011 | Yamaguchi et al. | |
| 2011/0148249 | A1* | 6/2011 | Yamaguchi | H03H 3/04 310/312 |
| 2011/0227658 | A1* | 9/2011 | Tanaya | H03H 9/0504 331/156 |
| 2011/0248600 | A1* | 10/2011 | Yamada | H03H 9/21 310/300 |
| 2012/0007684 | A1* | 1/2012 | Yamada | H03H 9/02102 331/156 |
| 2012/0137775 | A1* | 6/2012 | Yamada | H03H 9/21 73/504.16 |
| 2014/0118079 | A1* | 5/2014 | Yamada | H03H 9/205 331/155 |
| 2014/0225480 | A1* | 8/2014 | Yamada | H03H 9/21 310/367 |
| 2014/0292432 | A1* | 10/2014 | Yamada | G04F 5/063 331/156 |
| 2014/0292433 | A1* | 10/2014 | Yamada | H03H 9/0547 331/156 |
| 2014/0292435 | A1* | 10/2014 | Yamada | H03H 9/215 331/158 |
| 2014/0368287 | A1* | 12/2014 | Yamada | H03B 5/32 331/156 |
| 2014/0368288 | A1* | 12/2014 | Yamada | H03H 9/21 331/156 |
| 2014/0375176 | A1* | 12/2014 | Yamada | H03H 9/215 310/366 |
| 2014/0375177 | A1* | 12/2014 | Yamada | H03H 9/21 310/370 |
| 2014/0375178 | A1* | 12/2014 | Yamada | H03H 9/21 310/370 |
| 2015/0022061 | A1* | 1/2015 | Yamada | H03H 9/0547 310/370 |
| 2015/0022276 | A1* | 1/2015 | Yamada | H03H 9/0547 331/158 |
| 2015/0102703 | A1* | 4/2015 | Yamada | H03H 3/0072 310/309 |
| 2015/0135931 | A1* | 5/2015 | Yamada | H03H 9/02157 84/410 |
| 2015/0137899 | A1* | 5/2015 | Yamada | H03H 3/04 331/156 |
| 2015/0137900 | A1* | 5/2015 | Yamada | H03H 9/215 331/156 |
| 2015/0137901 | A1* | 5/2015 | Yamada | H03H 9/215 331/156 |
| 2015/0137902 | A1* | 5/2015 | Yamada | H03H 9/02023 331/156 |
| 2015/0188513 | A1* | 7/2015 | Yamada | G01L 1/106 331/156 |
| 2015/0188514 | A1* | 7/2015 | Yamada | G01L 1/106 331/156 |
| 2015/0188515 | A1* | 7/2015 | Yamada | H03B 5/32 331/156 |
| 2015/0188516 | A1* | 7/2015 | Yamada | H03H 9/19 331/156 |

FOREIGN PATENT DOCUMENTS

| | | |
|---|---|---|
| JP | A-2002-353766 | 12/2002 |
| JP | A-2006-129185 | 5/2006 |
| JP | A-2006-197278 | 7/2006 |
| JP | A-2007-81570 | 3/2007 |
| JP | A-2008-48273 | 2/2008 |
| JP | A-2008-57995 | 3/2008 |
| JP | A-2008-72705 | 3/2008 |
| JP | A-2010-93408 | 4/2010 |
| JP | A-2011-82956 | 4/2011 |
| JP | A-2011-87279 | 4/2011 |
| JP | A-2012-74938 | 4/2012 |
| JP | A-2012-120014 | 6/2012 |
| JP | A-2012-124693 | 6/2012 |
| JP | A-2013-17207 | 1/2013 |
| JP | A-2013-110492 | 6/2013 |
| WO | WO 2009/101733 A1 | 8/2009 |
| WO | WO 2010/023728 A1 | 3/2010 |
| WO | WO 2010/023729 A1 | 3/2010 |

* cited by examiner

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 50 | 20 | 0.067 | 1.99E+06 | 6.30 | 0.99 |
| | 40 | 0.134 | 2.30E+06 | 6.36 | 1.00 |
| | 60 | 0.201 | 2.01E+06 | 6.30 | 0.99 |
| | 80 | 0.268 | 1.03E+06 | 6.01 | 0.95 |
| | 100 | 0.335 | 5.15E+05 | 5.71 | 0.90 |
| | 140 | 0.469 | 2.91E+05 | 5.46 | 0.86 |
| | 180 | 0.603 | 4.18E+05 | 5.62 | 0.88 |
| | 220 | 0.737 | 1.07E+06 | 6.03 | 0.95 |
| | 260 | 0.871 | 9.97E+05 | 6.00 | 0.94 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 60 | 20 | 0.067 | 1.59E+06 | 6.20 | 0.99 |
| | 40 | 0.134 | 1.84E+06 | 6.27 | 1.00 |
| | 60 | 0.201 | 1.65E+06 | 6.22 | 0.99 |
| | 80 | 0.268 | 9.03E+05 | 5.96 | 0.95 |
| | 100 | 0.335 | 4.61E+05 | 5.66 | 0.90 |
| | 140 | 0.469 | 2.63E+05 | 5.42 | 0.87 |
| | 180 | 0.603 | 3.78E+05 | 5.58 | 0.89 |
| | 220 | 0.737 | 1.02E+06 | 6.01 | 0.96 |
| | 260 | 0.871 | 1.14E+06 | 6.06 | 0.97 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 70 | 20 | 0.067 | 1.29E+06 | 6.11 | 0.99 |
| | 40 | 0.134 | 1.49E+06 | 6.17 | 1.00 |
| | 60 | 0.201 | 1.39E+06 | 6.14 | 0.99 |
| | 80 | 0.268 | 7.98E+05 | 5.90 | 0.96 |
| | 100 | 0.335 | 4.20E+05 | 5.62 | 0.91 |
| | 140 | 0.469 | 2.44E+05 | 5.39 | 0.87 |
| | 180 | 0.603 | 3.47E+05 | 5.54 | 0.90 |
| | 220 | 0.737 | 9.48E+05 | 5.98 | 0.97 |
| | 260 | 0.871 | 1.11E+06 | 6.05 | 0.98 |

FIG. 10

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 80 | 20 | 0.067 | 1.09E+06 | 6.04 | 0.99 |
| | 40 | 0.134 | 1.25E+06 | 6.10 | 1.00 |
| | 60 | 0.201 | 1.18E+06 | 6.07 | 1.00 |
| | 80 | 0.268 | 7.23E+05 | 5.86 | 0.96 |
| | 100 | 0.335 | 3.95E+05 | 5.60 | 0.92 |
| | 140 | 0.469 | 2.29E+05 | 5.36 | 0.88 |
| | 180 | 0.603 | 3.19E+05 | 5.50 | 0.90 |
| | 220 | 0.737 | 7.69E+05 | 5.89 | 0.97 |
| | 260 | 0.871 | 9.06E+05 | 5.96 | 0.98 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 100 | 20 | 0.067 | 7.36E+05 | 5.87 | 0.99 |
| | 40 | 0.134 | 8.74E+05 | 5.94 | 1.00 |
| | 60 | 0.201 | 8.60E+05 | 5.93 | 1.00 |
| | 80 | 0.268 | 5.87E+05 | 5.77 | 0.97 |
| | 100 | 0.335 | 3.41E+05 | 5.53 | 0.93 |
| | 140 | 0.469 | 2.03E+05 | 5.31 | 0.89 |
| | 180 | 0.603 | 2.51E+05 | 5.40 | 0.91 |
| | 220 | 0.737 | 3.97E+05 | 5.60 | 0.94 |
| | 260 | 0.871 | 3.38E+05 | 5.53 | 0.93 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 110 | 20 | 0.067 | 7.58E+05 | 5.88 | 0.99 |
| | 40 | 0.134 | 8.56E+05 | 5.93 | 1.00 |
| | 60 | 0.201 | 8.10E+05 | 5.91 | 1.00 |
| | 80 | 0.268 | 5.02E+05 | 5.70 | 0.96 |
| | 100 | 0.335 | 3.11E+05 | 5.49 | 0.93 |
| | 140 | 0.469 | 1.82E+05 | 5.26 | 0.89 |
| | 180 | 0.603 | 1.97E+05 | 5.29 | 0.89 |
| | 220 | 0.737 | 2.33E+05 | 5.37 | 0.90 |
| | 260 | 0.871 | 1.68E+05 | 5.22 | 0.88 |

FIG. 11

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 120 | 20 | 0.067 | 6.55E+05 | 5.82 | 1.00 |
| | 40 | 0.134 | 6.96E+05 | 5.84 | 1.00 |
| | 60 | 0.201 | 6.29E+05 | 5.80 | 0.99 |
| | 80 | 0.268 | 4.43E+05 | 5.65 | 0.97 |
| | 100 | 0.335 | 2.73E+05 | 5.44 | 0.93 |
| | 140 | 0.469 | 1.57E+05 | 5.20 | 0.89 |
| | 180 | 0.603 | 1.50E+05 | 5.18 | 0.89 |
| | 220 | 0.737 | 1.25E+05 | 5.10 | 0.87 |
| | 260 | 0.871 | 7.43E+04 | 4.87 | 0.83 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 130 | 20 | 0.067 | 5.51E+05 | 5.74 | 1.00 |
| | 40 | 0.134 | 5.59E+05 | 5.75 | 1.00 |
| | 60 | 0.201 | 5.16E+05 | 5.71 | 0.99 |
| | 80 | 0.268 | 3.80E+05 | 5.58 | 0.97 |
| | 100 | 0.335 | 2.47E+05 | 5.39 | 0.94 |
| | 140 | 0.469 | 1.30E+05 | 5.11 | 0.89 |
| | 180 | 0.603 | 9.26E+04 | 4.97 | 0.86 |
| | 220 | 0.737 | 5.31E+04 | 4.73 | 0.82 |
| | 260 | 0.871 | 2.78E+04 | 4.44 | 0.77 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 140 | 20 | 0.067 | 4.43E+05 | 5.65 | 1.00 |
| | 40 | 0.134 | 4.24E+05 | 5.63 | 1.00 |
| | 60 | 0.201 | 3.83E+05 | 5.58 | 0.99 |
| | 80 | 0.268 | 3.27E+05 | 5.51 | 0.98 |
| | 100 | 0.335 | 2.21E+05 | 5.34 | 0.95 |
| | 140 | 0.469 | 9.54E+04 | 4.98 | 0.88 |
| | 180 | 0.603 | 5.50E+04 | 4.74 | 0.84 |
| | 220 | 0.737 | 4.15E+04 | 4.62 | 0.82 |
| | 260 | 0.871 | 3.75E+04 | 4.57 | 0.81 |

FIG. 12

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 150 | 20 | 0.067 | 3.35E+05 | 5.52 | 1.00 |
|  | 40 | 0.134 | 2.88E+05 | 5.46 | 0.99 |
|  | 60 | 0.201 | 2.86E+05 | 5.46 | 0.99 |
|  | 80 | 0.268 | 2.84E+05 | 5.45 | 0.99 |
|  | 100 | 0.335 | 1.97E+05 | 5.29 | 0.96 |
|  | 140 | 0.469 | 8.57E+04 | 4.93 | 0.89 |
|  | 180 | 0.603 | 7.24E+04 | 4.86 | 0.88 |
|  | 220 | 0.737 | 7.23E+04 | 4.86 | 0.88 |
|  | 260 | 0.871 | 6.68E+04 | 4.83 | 0.87 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 190 | 20 | 0.067 | 2.65E+05 | 5.42 | 0.98 |
|  | 40 | 0.134 | 3.35E+05 | 5.53 | 1.00 |
|  | 60 | 0.201 | 2.84E+05 | 5.45 | 0.99 |
|  | 80 | 0.268 | 2.15E+05 | 5.33 | 0.97 |
|  | 100 | 0.335 | 1.50E+05 | 5.18 | 0.94 |
|  | 140 | 0.469 | 9.84E+04 | 4.99 | 0.90 |
|  | 180 | 0.603 | 9.82E+04 | 4.99 | 0.90 |
|  | 220 | 0.737 | 1.03E+05 | 5.01 | 0.91 |
|  | 260 | 0.871 | 9.19E+04 | 4.96 | 0.90 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | LEAKAGE DIFFICULTY INDEX |
|---|---|---|---|---|---|
| 210 | 20 | 0.067 | 3.83E+05 | 5.58 | 1.00 |
|  | 40 | 0.134 | 3.66E+05 | 5.56 | 1.00 |
|  | 60 | 0.201 | 2.71E+05 | 5.43 | 0.97 |
|  | 80 | 0.268 | 1.91E+05 | 5.28 | 0.95 |
|  | 100 | 0.335 | 1.41E+05 | 5.15 | 0.92 |
|  | 140 | 0.469 | 9.80E+04 | 4.99 | 0.89 |
|  | 180 | 0.603 | 9.70E+04 | 4.99 | 0.89 |
|  | 220 | 0.737 | 1.04E+05 | 5.02 | 0.90 |
|  | 260 | 0.871 | 9.35E+04 | 4.97 | 0.89 |

FIG. 13

| PLATE THICKNESS [μm] | CONSTRICTED WIDTH W2 [μm] | CONSTRICTED WIDTH RATIO W2/W1 | FIRST MAIN STRESS [Pa] | log(FIRST MAIN STRESS) [Pa] | IMPACT RESISTANCE INDEX |
|---|---|---|---|---|---|
| 50 | 20 | 0.067 | 21410.9 | 4.3 | 0.75 |
| | 40 | 0.134 | 12482.2 | 4.1 | 0.79 |
| | 60 | 0.201 | 8416.9 | 3.9 | 0.82 |
| | 80 | 0.268 | 7122.8 | 3.9 | 0.84 |
| | 100 | 0.335 | 6111.3 | 3.8 | 0.85 |
| | 140 | 0.469 | 4917.9 | 3.7 | 0.87 |
| | 180 | 0.603 | 4456.9 | 3.6 | 0.88 |
| | 220 | 0.737 | 3761.2 | 3.6 | 0.90 |
| | 260 | 0.871 | 3432.5 | 3.5 | 0.91 |

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 60 | 20 | 0.067 | 18000.4 | 4.3 | 0.76 |
| | 40 | 0.134 | 10443.7 | 4.0 | 0.80 |
| | 60 | 0.201 | 7642.7 | 3.9 | 0.83 |
| | 80 | 0.268 | 6474.7 | 3.8 | 0.85 |
| | 100 | 0.335 | 5480.1 | 3.7 | 0.86 |
| | 140 | 0.469 | 4286.3 | 3.6 | 0.89 |
| | 180 | 0.603 | 3691.2 | 3.6 | 0.90 |
| | 220 | 0.737 | 3436.7 | 3.5 | 0.91 |
| | 260 | 0.871 | 3053.4 | 3.5 | 0.93 |

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 70 | 20 | 0.067 | 15966.0 | 4.2 | 0.77 |
| | 40 | 0.134 | 9610.9 | 4.0 | 0.81 |
| | 60 | 0.201 | 6694.1 | 3.8 | 0.84 |
| | 80 | 0.268 | 5382.6 | 3.7 | 0.87 |
| | 100 | 0.335 | 4775.7 | 3.7 | 0.88 |
| | 140 | 0.469 | 3672.4 | 3.6 | 0.91 |
| | 180 | 0.603 | 3332.3 | 3.5 | 0.92 |
| | 220 | 0.737 | 2991.3 | 3.5 | 0.93 |
| | 260 | 0.871 | 2774.4 | 3.4 | 0.94 |

FIG. 17

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 80 | 20 | 0.067 | 13191.0 | 4.1 | 0.78 |
| | 40 | 0.134 | 8039.9 | 3.9 | 0.83 |
| | 60 | 0.201 | 6074.3 | 3.8 | 0.85 |
| | 80 | 0.268 | 5007.5 | 3.7 | 0.87 |
| | 100 | 0.335 | 4320.3 | 3.6 | 0.89 |
| | 140 | 0.469 | 3603.7 | 3.6 | 0.91 |
| | 180 | 0.603 | 3142.8 | 3.5 | 0.92 |
| | 220 | 0.737 | 2690.1 | 3.4 | 0.94 |
| | 260 | 0.871 | 2485.3 | 3.4 | 0.95 |

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 100 | 20 | 0.067 | 10594.1 | 4.0 | 0.80 |
| | 40 | 0.134 | 6455.8 | 3.8 | 0.85 |
| | 60 | 0.201 | 4896.6 | 3.7 | 0.87 |
| | 80 | 0.268 | 4229.8 | 3.6 | 0.89 |
| | 100 | 0.335 | 3984.4 | 3.6 | 0.90 |
| | 140 | 0.469 | 3049.9 | 3.5 | 0.93 |
| | 180 | 0.603 | 2650.4 | 3.4 | 0.94 |
| | 220 | 0.737 | 2341.4 | 3.4 | 0.96 |
| | 260 | 0.871 | 2321.3 | 3.4 | 0.96 |

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 110 | 20 | 0.067 | 9530.7 | 4.0 | 0.81 |
| | 40 | 0.134 | 5794.5 | 3.8 | 0.86 |
| | 60 | 0.201 | 4553.1 | 3.7 | 0.88 |
| | 80 | 0.268 | 3863.3 | 3.6 | 0.90 |
| | 100 | 0.335 | 3396.8 | 3.5 | 0.91 |
| | 140 | 0.469 | 2855.7 | 3.5 | 0.93 |
| | 180 | 0.603 | 2565.5 | 3.4 | 0.95 |
| | 220 | 0.737 | 2291.2 | 3.4 | 0.96 |
| | 260 | 0.871 | 2102.7 | 3.3 | 0.97 |

FIG. 18

| PLATE THICKNESS [μm] | CONSTRICTED WIDTH W2 [μm] | CONSTRICTED WIDTH RATIO W2/W1 | FIRST MAIN STRESS [Pa] | log(FIRST MAIN STRESS) [Pa] | IMPACT RESISTANCE INDEX |
|---|---|---|---|---|---|
| 120 | 20 | 0.067 | 8841.5 | 3.9 | 0.82 |
| | 40 | 0.134 | 5477.8 | 3.7 | 0.86 |
| | 60 | 0.201 | 4280.3 | 3.6 | 0.89 |
| | 80 | 0.268 | 3602.4 | 3.6 | 0.91 |
| | 100 | 0.335 | 3309.4 | 3.5 | 0.92 |
| | 140 | 0.469 | 2754.7 | 3.4 | 0.94 |
| | 180 | 0.603 | 2481.1 | 3.4 | 0.95 |
| | 220 | 0.737 | 2261.8 | 3.4 | 0.96 |
| | 260 | 0.871 | 1984.6 | 3.3 | 0.98 |

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 130 | 20 | 0.067 | 8236.0 | 3.9 | 0.82 |
| | 40 | 0.134 | 5150.2 | 3.7 | 0.87 |
| | 60 | 0.201 | 3966.3 | 3.6 | 0.90 |
| | 80 | 0.268 | 3213.9 | 3.5 | 0.92 |
| | 100 | 0.335 | 3141.2 | 3.5 | 0.92 |
| | 140 | 0.469 | 2651.1 | 3.4 | 0.94 |
| | 180 | 0.603 | 2247.9 | 3.4 | 0.96 |
| | 220 | 0.737 | 2121.0 | 3.3 | 0.97 |
| | 260 | 0.871 | 1973.2 | 3.3 | 0.98 |

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 140 | 20 | 0.067 | 7571.7 | 3.9 | 0.83 |
| | 40 | 0.134 | 4562.4 | 3.7 | 0.88 |
| | 60 | 0.201 | 3725.0 | 3.6 | 0.90 |
| | 80 | 0.268 | 3422.1 | 3.5 | 0.91 |
| | 100 | 0.335 | 2849.9 | 3.5 | 0.93 |
| | 140 | 0.469 | 2545.6 | 3.4 | 0.95 |
| | 180 | 0.603 | 2349.0 | 3.4 | 0.96 |
| | 220 | 0.737 | 2179.1 | 3.3 | 0.97 |
| | 260 | 0.871 | 1883.7 | 3.3 | 0.99 |

FIG. 19

| PLATE THICKNESS [μm] | CONSTRICTED WIDTH W2 [μm] | CONSTRICTED WIDTH RATIO W2/W1 | FIRST MAIN STRESS [Pa] | log(FIRST MAIN STRESS) [Pa] | IMPACT RESISTANCE INDEX |
|---|---|---|---|---|---|
| 150 | 20 | 0.067 | 7057.5 | 3.8 | 0.84 |
| | 40 | 0.134 | 4476.9 | 3.7 | 0.88 |
| | 60 | 0.201 | 3433.6 | 3.5 | 0.91 |
| | 80 | 0.268 | 2967.1 | 3.5 | 0.93 |
| | 100 | 0.335 | 2779.5 | 3.4 | 0.94 |
| | 140 | 0.469 | 2488.8 | 3.4 | 0.95 |
| | 180 | 0.603 | 2136.3 | 3.3 | 0.97 |
| | 220 | 0.737 | 2095.3 | 3.3 | 0.97 |
| | 260 | 0.871 | 1949.0 | 3.3 | 0.98 |

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 190 | 20 | 0.067 | 5724.9 | 3.8 | 0.86 |
| | 40 | 0.134 | 3430.0 | 3.5 | 0.91 |
| | 60 | 0.201 | 2902.3 | 3.5 | 0.93 |
| | 80 | 0.268 | 2577.3 | 3.4 | 0.95 |
| | 100 | 0.335 | 2485.5 | 3.4 | 0.95 |
| | 140 | 0.469 | 2231.5 | 3.3 | 0.96 |
| | 180 | 0.603 | 2105.9 | 3.3 | 0.97 |
| | 220 | 0.737 | 1827.6 | 3.3 | 0.99 |
| | 260 | 0.871 | 1758.3 | 3.2 | 0.99 |

| PLATE THICKNESS [μm] | CONSTRICTED WIDTH W2 [μm] | CONSTRICTED WIDTH RATIO W2/W1 | FIRST MAIN STRESS [Pa] | Log(FIRST MAIN STRESS) [Pa] | IMPACT RESISTANCE INDEX |
|---|---|---|---|---|---|
| 210 | 20 | 0.067 | 5262.6 | 3.7 | 0.87 |
| | 40 | 0.134 | 3185.2 | 3.5 | 0.92 |
| | 60 | 0.201 | 2548.5 | 3.4 | 0.95 |
| | 80 | 0.268 | 2316.9 | 3.4 | 0.96 |
| | 100 | 0.335 | 2199.9 | 3.3 | 0.97 |
| | 140 | 0.469 | 2194.9 | 3.3 | 0.97 |
| | 180 | 0.603 | 1932.9 | 3.3 | 0.98 |
| | 220 | 0.737 | 1910.5 | 3.3 | 0.98 |
| | 260 | 0.871 | 1690.8 | 3.2 | 1.00 |

FIG. 20

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 50 | 20 | 0.067 | 1.99E+06 | 6.30 | 0.99 |
| | 40 | 0.134 | 2.30E+06 | 6.36 | 1.00 |
| | 60 | 0.201 | 2.01E+06 | 6.30 | 0.99 |
| | 80 | 0.268 | 1.03E+06 | 6.01 | 0.95 |
| | 100 | 0.335 | 5.15E+05 | 5.71 | 0.90 |
| | 140 | 0.469 | 2.91E+05 | 5.46 | 0.86 |
| | 180 | 0.603 | 4.18E+05 | 5.62 | 0.88 |
| | 220 | 0.737 | 1.07E+06 | 6.03 | 0.95 |
| | 260 | 0.871 | 9.97E+05 | 6.00 | 0.94 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 60 | 20 | 0.067 | 1.59E+06 | 6.20 | 0.99 |
| | 40 | 0.134 | 1.84E+06 | 6.27 | 1.00 |
| | 60 | 0.201 | 1.65E+06 | 6.22 | 0.99 |
| | 80 | 0.268 | 9.03E+05 | 5.96 | 0.95 |
| | 100 | 0.335 | 4.61E+05 | 5.66 | 0.90 |
| | 140 | 0.469 | 2.63E+05 | 5.42 | 0.87 |
| | 180 | 0.603 | 3.78E+05 | 5.58 | 0.89 |
| | 220 | 0.737 | 1.02E+06 | 6.01 | 0.96 |
| | 260 | 0.871 | 1.14E+06 | 6.06 | 0.97 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 70 | 20 | 0.067 | 1.29E+06 | 6.11 | 0.99 |
| | 40 | 0.134 | 1.49E+06 | 6.17 | 1.00 |
| | 60 | 0.201 | 1.39E+06 | 6.14 | 0.99 |
| | 80 | 0.268 | 7.98E+05 | 5.90 | 0.96 |
| | 100 | 0.335 | 4.20E+05 | 5.62 | 0.91 |
| | 140 | 0.469 | 2.44E+05 | 5.39 | 0.87 |
| | 180 | 0.603 | 3.47E+05 | 5.54 | 0.90 |
| | 220 | 0.737 | 9.48E+05 | 5.98 | 0.97 |
| | 260 | 0.871 | 1.11E+06 | 6.05 | 0.98 |

FIG. 23

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 80 | 20 | 0.067 | 1.09E+06 | 6.04 | 0.99 |
| | 40 | 0.134 | 1.25E+06 | 6.10 | 1.00 |
| | 60 | 0.201 | 1.18E+06 | 6.07 | 1.00 |
| | 80 | 0.268 | 7.23E+05 | 5.86 | 0.96 |
| | 100 | 0.335 | 3.95E+05 | 5.60 | 0.92 |
| | 140 | 0.469 | 2.29E+05 | 5.36 | 0.88 |
| | 180 | 0.603 | 3.19E+05 | 5.50 | 0.90 |
| | 220 | 0.737 | 7.69E+05 | 5.89 | 0.97 |
| | 260 | 0.871 | 9.06E+05 | 5.96 | 0.98 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 100 | 20 | 0.067 | 7.36E+05 | 5.87 | 0.99 |
| | 40 | 0.134 | 8.74E+05 | 5.94 | 1.00 |
| | 60 | 0.201 | 8.60E+05 | 5.93 | 1.00 |
| | 80 | 0.268 | 5.87E+05 | 5.77 | 0.97 |
| | 100 | 0.335 | 3.41E+05 | 5.53 | 0.93 |
| | 140 | 0.469 | 2.03E+05 | 5.31 | 0.89 |
| | 180 | 0.603 | 2.51E+05 | 5.40 | 0.91 |
| | 220 | 0.737 | 3.97E+05 | 5.60 | 0.94 |
| | 260 | 0.871 | 3.38E+05 | 5.53 | 0.93 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 110 | 20 | 0.067 | 7.58E+05 | 5.88 | 0.99 |
| | 40 | 0.134 | 8.56E+05 | 5.93 | 1.00 |
| | 60 | 0.201 | 8.10E+05 | 5.91 | 1.00 |
| | 80 | 0.268 | 5.02E+05 | 5.70 | 0.96 |
| | 100 | 0.335 | 3.11E+05 | 5.49 | 0.93 |
| | 140 | 0.469 | 1.82E+05 | 5.26 | 0.89 |
| | 180 | 0.603 | 1.97E+05 | 5.29 | 0.89 |
| | 220 | 0.737 | 2.33E+05 | 5.37 | 0.90 |
| | 260 | 0.871 | 1.68E+05 | 5.22 | 0.88 |

FIG. 24

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 120 | 20 | 0.067 | 6.55E+05 | 5.82 | 1.00 |
| | 40 | 0.134 | 6.96E+05 | 5.84 | 1.00 |
| | 60 | 0.201 | 6.29E+05 | 5.80 | 0.99 |
| | 80 | 0.268 | 4.43E+05 | 5.65 | 0.97 |
| | 100 | 0.335 | 2.73E+05 | 5.44 | 0.93 |
| | 140 | 0.469 | 1.57E+05 | 5.20 | 0.89 |
| | 180 | 0.603 | 1.50E+05 | 5.18 | 0.89 |
| | 220 | 0.737 | 1.25E+05 | 5.10 | 0.87 |
| | 260 | 0.871 | 7.43E+04 | 4.87 | 0.83 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 130 | 20 | 0.067 | 5.51E+05 | 5.74 | 1.00 |
| | 40 | 0.134 | 5.59E+05 | 5.75 | 1.00 |
| | 60 | 0.201 | 5.16E+05 | 5.71 | 0.99 |
| | 80 | 0.268 | 3.80E+05 | 5.58 | 0.97 |
| | 100 | 0.335 | 2.47E+05 | 5.39 | 0.94 |
| | 140 | 0.469 | 1.30E+05 | 5.11 | 0.89 |
| | 180 | 0.603 | 9.26E+04 | 4.97 | 0.86 |
| | 220 | 0.737 | 5.31E+04 | 4.73 | 0.82 |
| | 260 | 0.871 | 2.78E+04 | 4.44 | 0.77 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 140 | 20 | 0.067 | 4.43E+05 | 5.65 | 1.00 |
| | 40 | 0.134 | 4.24E+05 | 5.63 | 1.00 |
| | 60 | 0.201 | 3.83E+05 | 5.58 | 0.99 |
| | 80 | 0.268 | 3.27E+05 | 5.51 | 0.98 |
| | 100 | 0.335 | 2.21E+05 | 5.34 | 0.95 |
| | 140 | 0.469 | 9.54E+04 | 4.98 | 0.88 |
| | 180 | 0.603 | 5.50E+04 | 4.74 | 0.84 |
| | 220 | 0.737 | 4.15E+04 | 4.62 | 0.82 |
| | 260 | 0.871 | 3.75E+04 | 4.57 | 0.81 |

FIG. 25

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 150 | 20 | 0.067 | 3.35E+05 | 5.52 | 1.00 |
| | 40 | 0.134 | 2.88E+05 | 5.46 | 0.99 |
| | 60 | 0.201 | 2.86E+05 | 5.46 | 0.99 |
| | 80 | 0.268 | 2.84E+05 | 5.45 | 0.99 |
| | 100 | 0.335 | 1.97E+05 | 5.29 | 0.96 |
| | 140 | 0.469 | 8.57E+04 | 4.93 | 0.89 |
| | 180 | 0.603 | 7.24E+04 | 4.86 | 0.88 |
| | 220 | 0.737 | 7.23E+04 | 4.86 | 0.88 |
| | 260 | 0.871 | 6.68E+04 | 4.83 | 0.87 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 190 | 20 | 0.067 | 2.65E+05 | 5.42 | 0.98 |
| | 40 | 0.134 | 3.35E+05 | 5.53 | 1.00 |
| | 60 | 0.201 | 2.84E+05 | 5.45 | 0.99 |
| | 80 | 0.268 | 2.15E+05 | 5.33 | 0.97 |
| | 100 | 0.335 | 1.50E+05 | 5.18 | 0.94 |
| | 140 | 0.469 | 9.84E+04 | 4.99 | 0.90 |
| | 180 | 0.603 | 9.82E+04 | 4.99 | 0.90 |
| | 220 | 0.737 | 1.03E+05 | 5.01 | 0.91 |
| | 260 | 0.871 | 9.19E+04 | 4.96 | 0.90 |

| PLATE THICKNESS [μm] | CONSTRICTED WIDTH W2 [μm] | CONSTRICTED WIDTH RATIO W2/W1 | $Q_{Leak}$ | $\log(Q_{Leak})$ | IMPACT RESISTANCE INDEX |
|---|---|---|---|---|---|
| 210 | 20 | 0.067 | 3.83E+05 | 5.58 | 1.00 |
| | 40 | 0.134 | 3.66E+05 | 5.56 | 1.00 |
| | 60 | 0.201 | 2.71E+05 | 5.43 | 0.97 |
| | 80 | 0.268 | 1.91E+05 | 5.28 | 0.95 |
| | 100 | 0.335 | 1.41E+05 | 5.15 | 0.92 |
| | 140 | 0.469 | 9.80E+04 | 4.99 | 0.89 |
| | 180 | 0.603 | 9.70E+04 | 4.99 | 0.89 |
| | 220 | 0.737 | 1.04E+05 | 5.02 | 0.90 |
| | 260 | 0.871 | 9.35E+04 | 4.97 | 0.89 |

FIG. 26

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 50 | 20 | 0.067 | 0.75 | 0.99 | 0.74 | 0.79 |
| | 40 | 0.134 | 0.79 | 1.00 | 0.79 | 0.85 |
| | 60 | 0.201 | 0.82 | 0.99 | 0.81 | 0.88 |
| | 80 | 0.268 | 0.84 | 0.95 | 0.79 | 0.85 |
| | 100 | 0.335 | 0.85 | 0.90 | 0.77 | 0.82 |
| | 140 | 0.469 | 0.87 | 0.86 | 0.75 | 0.81 |
| | 180 | 0.603 | 0.88 | 0.88 | 0.78 | 0.84 |
| | 220 | 0.737 | 0.90 | 0.95 | 0.86 | 0.92 |
| | 260 | 0.871 | 0.91 | 0.94 | 0.86 | 0.93 |

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 60 | 20 | 0.067 | 0.76 | 0.99 | 0.75 | 0.81 |
| | 40 | 0.134 | 0.80 | 1.00 | 0.80 | 0.86 |
| | 60 | 0.201 | 0.83 | 0.99 | 0.82 | 0.89 |
| | 80 | 0.268 | 0.85 | 0.95 | 0.81 | 0.87 |
| | 100 | 0.335 | 0.86 | 0.90 | 0.78 | 0.84 |
| | 140 | 0.469 | 0.89 | 0.87 | 0.77 | 0.83 |
| | 180 | 0.603 | 0.90 | 0.89 | 0.81 | 0.87 |
| | 220 | 0.737 | 0.91 | 0.96 | 0.88 | 0.94 |
| | 260 | 0.871 | 0.93 | 0.97 | 0.90 | 0.96 |

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 70 | 20 | 0.067 | 0.77 | 0.99 | 0.76 | 0.82 |
| | 40 | 0.134 | 0.81 | 1.00 | 0.81 | 0.87 |
| | 60 | 0.201 | 0.84 | 0.99 | 0.84 | 0.90 |
| | 80 | 0.268 | 0.87 | 0.96 | 0.83 | 0.89 |
| | 100 | 0.335 | 0.88 | 0.91 | 0.80 | 0.86 |
| | 140 | 0.469 | 0.91 | 0.87 | 0.79 | 0.85 |
| | 180 | 0.603 | 0.92 | 0.90 | 0.82 | 0.88 |
| | 220 | 0.737 | 0.93 | 0.97 | 0.90 | 0.97 |
| | 260 | 0.871 | 0.94 | 0.98 | 0.92 | 0.99 |

FIG. 29

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 80 | 20 | 0.067 | 0.78 | 0.99 | 0.78 | 0.83 |
|  | 40 | 0.134 | 0.83 | 1.00 | 0.83 | 0.89 |
|  | 60 | 0.201 | 0.85 | 1.00 | 0.85 | 0.91 |
|  | 80 | 0.268 | 0.87 | 0.96 | 0.84 | 0.90 |
|  | 100 | 0.335 | 0.89 | 0.92 | 0.82 | 0.88 |
|  | 140 | 0.469 | 0.91 | 0.88 | 0.80 | 0.86 |
|  | 180 | 0.603 | 0.92 | 0.90 | 0.83 | 0.90 |
|  | 220 | 0.737 | 0.94 | 0.97 | 0.91 | 0.98 |
|  | 260 | 0.871 | 0.95 | 0.98 | 0.93 | 1.00 |

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 100 | 20 | 0.067 | 0.80 | 0.99 | 0.79 | 0.85 |
|  | 40 | 0.134 | 0.85 | 1.00 | 0.85 | 0.91 |
|  | 60 | 0.201 | 0.87 | 1.00 | 0.87 | 0.94 |
|  | 80 | 0.268 | 0.89 | 0.97 | 0.86 | 0.93 |
|  | 100 | 0.335 | 0.90 | 0.93 | 0.83 | 0.90 |
|  | 140 | 0.469 | 0.93 | 0.89 | 0.83 | 0.89 |
|  | 180 | 0.603 | 0.94 | 0.91 | 0.86 | 0.92 |
|  | 220 | 0.737 | 0.96 | 0.94 | 0.90 | 0.97 |
|  | 260 | 0.871 | 0.96 | 0.93 | 0.89 | 0.96 |

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 110 | 20 | 0.067 | 0.81 | 0.99 | 0.80 | 0.86 |
|  | 40 | 0.134 | 0.86 | 1.00 | 0.86 | 0.92 |
|  | 60 | 0.201 | 0.88 | 1.00 | 0.88 | 0.94 |
|  | 80 | 0.268 | 0.90 | 0.96 | 0.86 | 0.93 |
|  | 100 | 0.335 | 0.91 | 0.93 | 0.85 | 0.91 |
|  | 140 | 0.469 | 0.93 | 0.89 | 0.83 | 0.89 |
|  | 180 | 0.603 | 0.95 | 0.89 | 0.85 | 0.91 |
|  | 220 | 0.737 | 0.96 | 0.90 | 0.87 | 0.93 |
|  | 260 | 0.871 | 0.97 | 0.88 | 0.86 | 0.92 |

FIG. 30

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 120 | 20 | 0.067 | 0.82 | 1.00 | 0.81 | 0.88 |
|  | 40 | 0.134 | 0.86 | 1.00 | 0.86 | 0.93 |
|  | 60 | 0.201 | 0.89 | 0.99 | 0.88 | 0.95 |
|  | 80 | 0.268 | 0.91 | 0.97 | 0.88 | 0.94 |
|  | 100 | 0.335 | 0.92 | 0.93 | 0.85 | 0.92 |
|  | 140 | 0.469 | 0.94 | 0.89 | 0.83 | 0.90 |
|  | 180 | 0.603 | 0.95 | 0.89 | 0.84 | 0.91 |
|  | 220 | 0.737 | 0.96 | 0.87 | 0.84 | 0.90 |
|  | 260 | 0.871 | 0.98 | 0.83 | 0.82 | 0.88 |

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 130 | 20 | 0.067 | 0.82 | 1.00 | 0.82 | 0.89 |
|  | 40 | 0.134 | 0.87 | 1.00 | 0.87 | 0.93 |
|  | 60 | 0.201 | 0.90 | 0.99 | 0.89 | 0.96 |
|  | 80 | 0.268 | 0.92 | 0.97 | 0.89 | 0.96 |
|  | 100 | 0.335 | 0.92 | 0.94 | 0.87 | 0.93 |
|  | 140 | 0.469 | 0.94 | 0.89 | 0.84 | 0.90 |
|  | 180 | 0.603 | 0.96 | 0.86 | 0.83 | 0.89 |
|  | 220 | 0.737 | 0.97 | 0.82 | 0.80 | 0.86 |
|  | 260 | 0.871 | 0.98 | 0.77 | 0.76 | 0.81 |

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 140 | 20 | 0.067 | 0.83 | 1.00 | 0.83 | 0.89 |
|  | 40 | 0.134 | 0.88 | 1.00 | 0.88 | 0.94 |
|  | 60 | 0.201 | 0.90 | 0.99 | 0.89 | 0.96 |
|  | 80 | 0.268 | 0.91 | 0.98 | 0.89 | 0.96 |
|  | 100 | 0.335 | 0.93 | 0.95 | 0.88 | 0.95 |
|  | 140 | 0.469 | 0.95 | 0.88 | 0.84 | 0.90 |
|  | 180 | 0.603 | 0.96 | 0.84 | 0.80 | 0.86 |
|  | 220 | 0.737 | 0.97 | 0.82 | 0.79 | 0.85 |
|  | 260 | 0.871 | 0.99 | 0.81 | 0.80 | 0.86 |

FIG. 31

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 160 | 20 | 0.067 | 0.84 | 1.00 | 0.84 | 0.90 |
|  | 40 | 0.134 | 0.88 | 0.99 | 0.87 | 0.94 |
|  | 60 | 0.201 | 0.91 | 0.99 | 0.90 | 0.97 |
|  | 80 | 0.268 | 0.93 | 0.99 | 0.92 | 0.99 |
|  | 100 | 0.335 | 0.94 | 0.96 | 0.90 | 0.97 |
|  | 140 | 0.469 | 0.95 | 0.89 | 0.85 | 0.91 |
|  | 180 | 0.603 | 0.97 | 0.88 | 0.85 | 0.92 |
|  | 220 | 0.737 | 0.97 | 0.88 | 0.85 | 0.92 |
|  | 260 | 0.871 | 0.98 | 0.87 | 0.86 | 0.92 |

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 190 | 20 | 0.067 | 0.86 | 0.98 | 0.84 | 0.91 |
|  | 40 | 0.134 | 0.91 | 1.00 | 0.91 | 0.98 |
|  | 60 | 0.201 | 0.93 | 0.99 | 0.92 | 0.99 |
|  | 80 | 0.268 | 0.95 | 0.97 | 0.91 | 0.98 |
|  | 100 | 0.335 | 0.95 | 0.94 | 0.89 | 0.96 |
|  | 140 | 0.469 | 0.96 | 0.90 | 0.87 | 0.94 |
|  | 180 | 0.603 | 0.97 | 0.90 | 0.88 | 0.94 |
|  | 220 | 0.737 | 0.99 | 0.91 | 0.90 | 0.97 |
|  | 260 | 0.871 | 0.99 | 0.90 | 0.89 | 0.96 |

| PLATE THICKNESS T [μm] | CONSTRICTED WIDTH W2 [μm] | CONSTRICTED WIDTH RATIO W2/W1 | IMPACT RESISTANCE INDEX | LEAKAGE DIFFICULTY INDEX | HIGH PERFORMANCE INDEX | NORMALIZED HIGH PERFORMANCE INDEX |
|---|---|---|---|---|---|---|
| 210 | 20 | 0.067 | 0.87 | 1.00 | 0.87 | 0.93 |
|  | 40 | 0.134 | 0.92 | 1.00 | 0.92 | 0.99 |
|  | 60 | 0.201 | 0.95 | 0.97 | 0.92 | 0.99 |
|  | 80 | 0.268 | 0.96 | 0.95 | 0.91 | 0.98 |
|  | 100 | 0.335 | 0.97 | 0.92 | 0.89 | 0.96 |
|  | 140 | 0.469 | 0.97 | 0.89 | 0.86 | 0.93 |
|  | 180 | 0.603 | 0.98 | 0.89 | 0.88 | 0.94 |
|  | 220 | 0.737 | 0.98 | 0.90 | 0.88 | 0.95 |
|  | 260 | 0.871 | 1.00 | 0.89 | 0.89 | 0.96 |

FIG. 32

RESONATOR ELEMENT, RESONATOR, OSCILLATOR, ELECTRONIC APPARATUS, AND MOBILE OBJECT

CROSS REFERENCE

The entire disclosures of Japanese Patent Application No. 2013-237480, filed Nov. 16, 2013, Japanese Patent Application No. 2013-237476, filed Nov. 16, 2013, and Japanese Patent Application No. 2013-237477, filed Nov. 16, 2013, are expressly incorporated by reference herein.

BACKGROUND

1. Technical Field

The present invention relates to a resonator element, a resonator, an oscillator, an electronic apparatus, and a mobile object.

2. Related Art

In the related art, a resonator element using a quartz crystal is known. Such a resonator element has excellent frequency-temperature characteristics and is thus widely used as a reference frequency source or a transmission source of various electronic apparatuses.

A resonator element disclosed in JP-A-2008-72705 is a tuning fork type and has a resonator element (also referred to as a resonator blank) which includes a base portion, a pair of vibrating arms which extend from one end side of the base portion, a linking portion which is located on the other end side of the base portion, a connecting portion which is located between the base portion and the linking portion which are connected via the connecting portion, and a support arm which extends from the linking portion.

JP-A-2008-72705 discloses that e/r which is a ratio of a width r of the connecting portion and a width e of the base portion is preferably equal to or less than 40%, and is more preferably 23% to 40%. As an effect achieved as a result of satisfying this range, it is disclosed that impact resistance can be maintained while minimizing vibration leakage. However, even if the ratio e/r is satisfied, there is a case where the vibration leakage cannot be sufficiently minimized and a resonator element with a favorable vibration characteristic cannot be obtained, depending on design conditions (for example, a thickness of the resonator blank). In addition, JP-A-2008-72705 discloses that a thickness of the resonator blank is preferably 70 μm to 130 μm (refer to paragraph [0042] of JP-A-2008-72705), but a relationship between the thickness and the ratio e/r is unclear.

SUMMARY

An advantage of some aspects of the invention is to provide a resonator element capable of minimizing vibration leakage, and a resonator, an oscillator, an electronic apparatus, and a mobile object, with high reliability, having the resonator element.

The invention can be implemented as the following application examples.

APPLICATION EXAMPLE 1

This application example is directed to a resonator element including a resonator blank having a base portion; a vibrating arm that extends from one end side of the base portion in a plan view; a linking portion that is disposed on the other end side of the base portion in the plan view; and a connecting portion that is disposed between the base portion and the linking portion, and connects the base portion and the linking portion to each other, in which the vibrating arm includes a weight section; and an arm section that is disposed between the base portion and the weight section, in which, when a thickness of the resonator blank is set to T, a width of the base portion in a direction intersecting the extending direction is set to W1, and a width of the connecting portion in the intersecting direction is set to W2, a relationship of 50 μm≤T≤210 μm is satisfied, and a relationship of 0.067≤W2/W1≤0.335 is satisfied, and in which, when a width of the arm section in the intersecting direction is set to W3, and a width of the weight section in the intersecting direction is set to W4, a relationship of W4≥2.8×W3 is satisfied.

According to this configuration, it is possible to provide a resonator element which can reduce vibration leakage.

APPLICATION EXAMPLE 2

In the resonator element according to the application example described above, it is preferable that a relationship of 110 T 210 μm is satisfied.

According to this configuration, it is possible to further improve vibration characteristics.

APPLICATION EXAMPLE 3

This application example is directed to a resonator element including a resonator blank having a base portion; a vibrating arm that extends from one end side of the base portion in a plan view; a linking portion that is disposed on the other end side of the base portion in the plan view; and a connecting portion that is disposed between the base portion and the linking portion, and connects the base portion and the linking portion to each other, in which the vibrating arm includes a weight section; and an arm section that is disposed between the base portion and the weight section, in which, when a thickness of the resonator blank is set to T, a width of the base portion in a direction intersecting the extending direction is set to W1, and a width of the connecting portion in the intersecting direction is set to W2, a relationship of 50 μm≤T≤100 μm is satisfied, and a relationship of 0.603≤W2/W1≤0.871 is satisfied, and in which, when a width of the arm section in the intersecting direction is set to W3, and a width of the weight section in the intersecting direction is set to W4, a relationship of W4≥2.8×W3 is satisfied.

According to this configuration, it is possible to provide a resonator element which can reduce vibration leakage.

APPLICATION EXAMPLE 4

In the resonator element according to the application example described above, it is preferable that a relationship of 50 μm≤T≤80 μm is satisfied.

According to this configuration, it is possible to further improve a vibration characteristic.

APPLICATION EXAMPLE 5

This application example is directed to a resonator element including a resonator blank having a base portion; a vibrating arm that extends from one end side of the base portion in a plan view; a linking portion that is disposed on the other end side of the base portion in the plan view; and a connecting portion that is disposed between the base portion and the linking portion, and connects the base portion and the linking portion to each other, in which the vibrating arm includes a weight section; and an arm section that is disposed between the base portion and the weight section, in which, when a thickness of the resonator blank is set to T, a width of the base portion in a direction intersecting the extending direction is set to W1, and a width of the connecting portion in the intersecting direction is set to W2, a relationship of 110 $\mu m \le T \le 210$ $\mu m$ is satisfied, and a relationship of $0.134 \le W2/W1 \le 0.335$ is satisfied, and in which, when a width of the arm section in the intersecting direction is set to W3, and a width of the weight section in the intersecting direction is set to W4, a relationship of $W4 \ge 2.8 \times W3$ is satisfied.

According to this configuration, it is possible to provide a resonator element which can reduce vibration leakage and has excellent impact resistance.

APPLICATION EXAMPLE 6

This application example is directed to a resonator element including a resonator blank having a base portion; a vibrating arm that extends from one end side of the base portion in a plan view; a linking portion that is disposed on the other end side of the base portion in the plan view; and a connecting portion that is disposed between the base portion and the linking portion, and connects the base portion and the linking portion to each other, in which the vibrating arm includes a weight section; and an arm section that is disposed between the base portion and the weight section, in which, when a thickness of the resonator blank is set to T, a width of the base portion in a direction intersecting the extending direction is set to W1, and a width of the connecting portion in the intersecting direction is set to W2, a relationship of 150 $\mu m \le T \le 210$ $\mu m$ is satisfied, and a relationship of $0.067 \le W2/W1 \le 0.871$ is satisfied, and in which, when a width of the arm section in a width direction of the resonator blank is set to W3, and a width of the weight section in the intersecting direction is set to W4, a relationship of $W4 \ge 2.8 \times W3$ is satisfied.

According to this configuration, it is possible to provide a resonator element which can reduce vibration leakage and has excellent impact resistance.

APPLICATION EXAMPLE 7

In the resonator element according to the application example described above, it is preferable that the linking portion extends in the intersection direction, and the resonator element further includes a support arm that is linked to the linking portion and extends in the extending direction of the vibrating arm.

According to this configuration, for example, the resonator element can be fixed to a base via the support arm, and thus it is possible to lengthen a separation distance (vibration propagation distance) between this fixed portion and the vibrating arm. For this reason, it is possible to effectively reduce vibration leakage of the resonator element.

APPLICATION EXAMPLE 8

In the resonator element according to the application example described above, it is preferable that a groove is provided on at least one main surface side of a pair of main surfaces which are front and rear surfaces with respect to each other in the arm section.

According to this configuration, it is possible to improve a vibration characteristic.

APPLICATION EXAMPLE 9

In the resonator element according to the application example described above, it is preferable that, when a length of the vibrating arm in the extending direction is set to L, and a length of the weight section in the extending direction is set to H, the vibrating arm satisfies $0.183 \le H/L \le 0.597$.

According to this configuration, it is possible to reduce air resistance applied to the resonator element and thus to provide the resonator element which has a notably high Q value.

APPLICATION EXAMPLE 10

In the resonator element according to the application example described above, it is preferable that, when a length of the vibrating arm in the extending direction is set to L, and a length of the weight section in the extending direction is set to H, the vibrating arm satisfies $0.012 < H/L < 0.30$.

According to this configuration, it is possible to reduce air resistance applied to the resonator element and also to reduce an increase in a CI value, and thus to provide the resonator element which has a notably high Q value.

APPLICATION EXAMPLE 11

This application example is directed to a resonator including the resonator element according to the application example described above, and a package in which the resonator element is mounted.

According to this configuration, it is possible to provide a resonator with high reliability.

APPLICATION EXAMPLE 12

In the resonator according to the application example described above, it is preferable that the vibrating arm vibrates in a flexural vibration mode, and atmospheric pressure in the package is equal to or lower than 100 Pa.

According to this configuration, it is possible to reduce deterioration in a Q value due to air resistance applied to the resonator element and thus to improve a Q value. As a result, it is possible to provide the resonator which can exhibit an excellent vibration characteristic.

APPLICATION EXAMPLE 13

In the resonator according to the application example described above, it is preferable that an atmospheric pressure in the package is equal to or lower than 10 Pa.

According to this configuration, it is possible to further reduce deterioration in a Q value due to air resistance applied to the resonator element. As a result, it is possible to provide the resonator which can exhibit a more excellent vibration characteristic.

APPLICATION EXAMPLE 14

In the resonator according to the application example described above, it is preferable that an atmospheric pressure in the package is equal to or higher than $7 \times 10^{-4}$ Pa.

According to this configuration, it is possible to reduce inadvertent warpage or deflection of the package due to a difference between atmospheric pressures inside the package and outside the package and the occurrence of cracks caused thereby.

APPLICATION EXAMPLE 15

This application example is directed to an oscillator including the resonator element according to the application example described above, and a circuit.

According to this configuration, it is possible to provide an oscillator with high reliability.

APPLICATION EXAMPLE 16

This application example is directed to an electronic apparatus including the resonator element according to the application example described above.

According to this configuration, it is possible to provide an electronic apparatus with high reliability.

APPLICATION EXAMPLE 17

This application example is directed to a mobile object including the resonator element according to the application example described above.

According to this configuration, it is possible to provide a mobile object with high reliability.

BRIEF DESCRIPTION OF THE DRAWINGS

The invention will be described with reference to the accompanying drawings, wherein like numbers reference like elements.

FIG. 10 is a table illustrating a simulation result.

FIG. 11 is a table illustrating a simulation result.

FIG. 12 is a table illustrating a simulation result.

FIG. 13 is a table illustrating a simulation result.

FIG. 17 is a table illustrating a simulation result of the impact resistance.

FIG. 18 is a table illustrating a simulation result of the impact resistance.

FIG. 19 is a table illustrating a simulation result of the impact resistance.

FIG. 20 is a table illustrating a simulation result of the impact resistance.

FIG. 23 is a table illustrating a simulation result of vibration leakage.

FIG. 24 is a table illustrating a simulation result of vibration leakage.

FIG. 25 is a table illustrating a simulation result of vibration leakage.

FIG. 26 is a table illustrating a simulation result of vibration leakage.

FIG. 29 is a table illustrating a result of combining the simulation result of the impact resistance with the simulation result of the vibration leakage.

FIG. 30 is a table illustrating a result of combining the simulation result of the impact resistance with the simulation result of the vibration leakage.

FIG. 31 is a table illustrating a result of combining the simulation result of the impact resistance with the simulation result of the vibration leakage.

FIG. 32 is a table illustrating a result of combining the simulation result of the impact resistance with the simulation result of the vibration leakage.

FIG. 43 is a graph illustrating a relationship between W and $Q_{TED}$a.

FIG. 53 is a perspective view for explaining an effective width a.

DESCRIPTION OF EXEMPLARY EMBODIMENTS

Hereinafter, detailed descriptions will be made of a resonator element, a resonator, an oscillator, an electronic apparatus, and a mobile object according to embodiments of the invention with reference to the drawings.

1. Resonator

First Embodiment

First, a resonator according to a first embodiment of the invention will be described.

Figure 1:
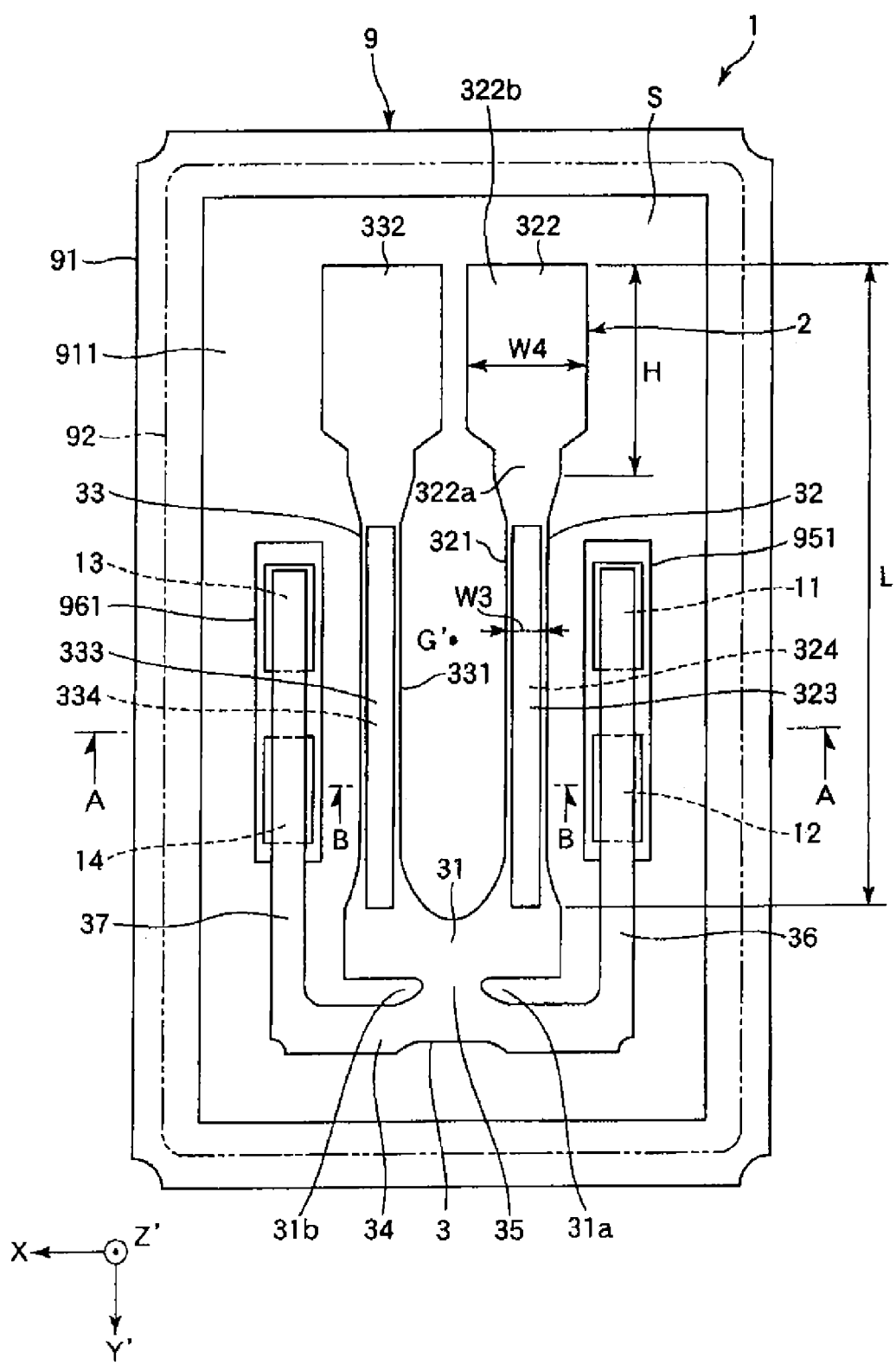
FIG. 1 is a plan view of a resonator according to a first embodiment of the invention.
Figure 2:
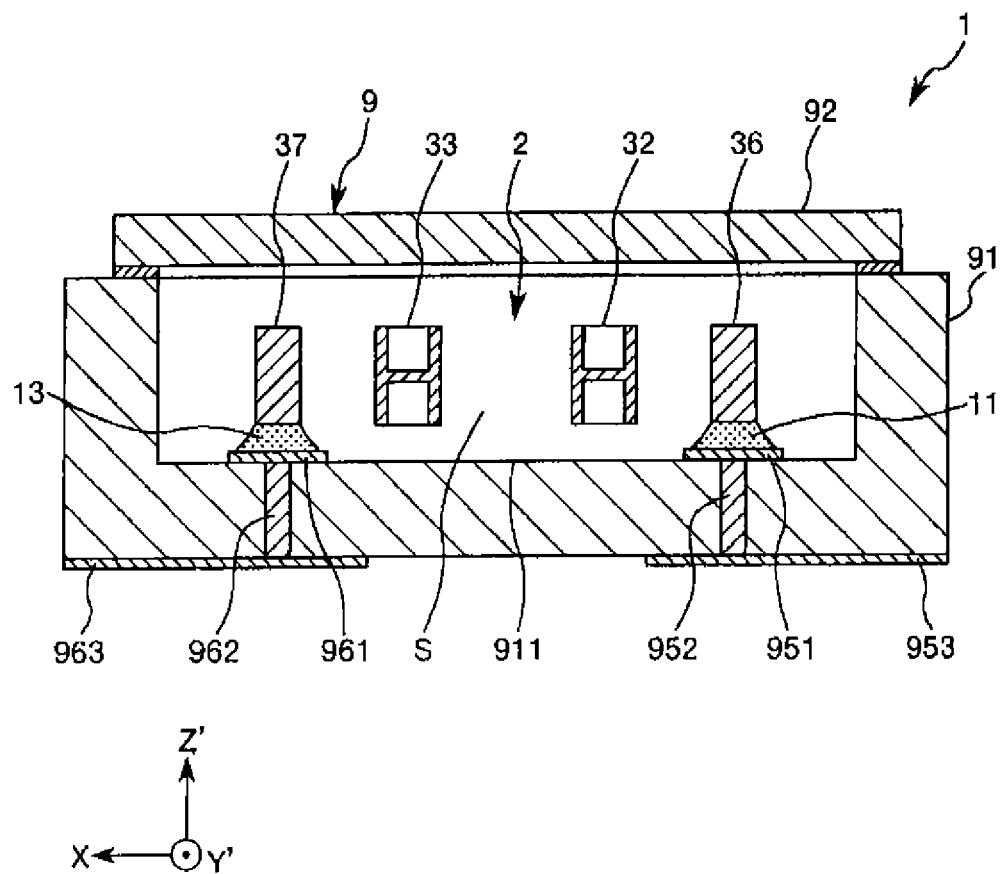
FIG. 2 is a cross-sectional view taken along the line A-A of FIG. 1.
Figure 3:
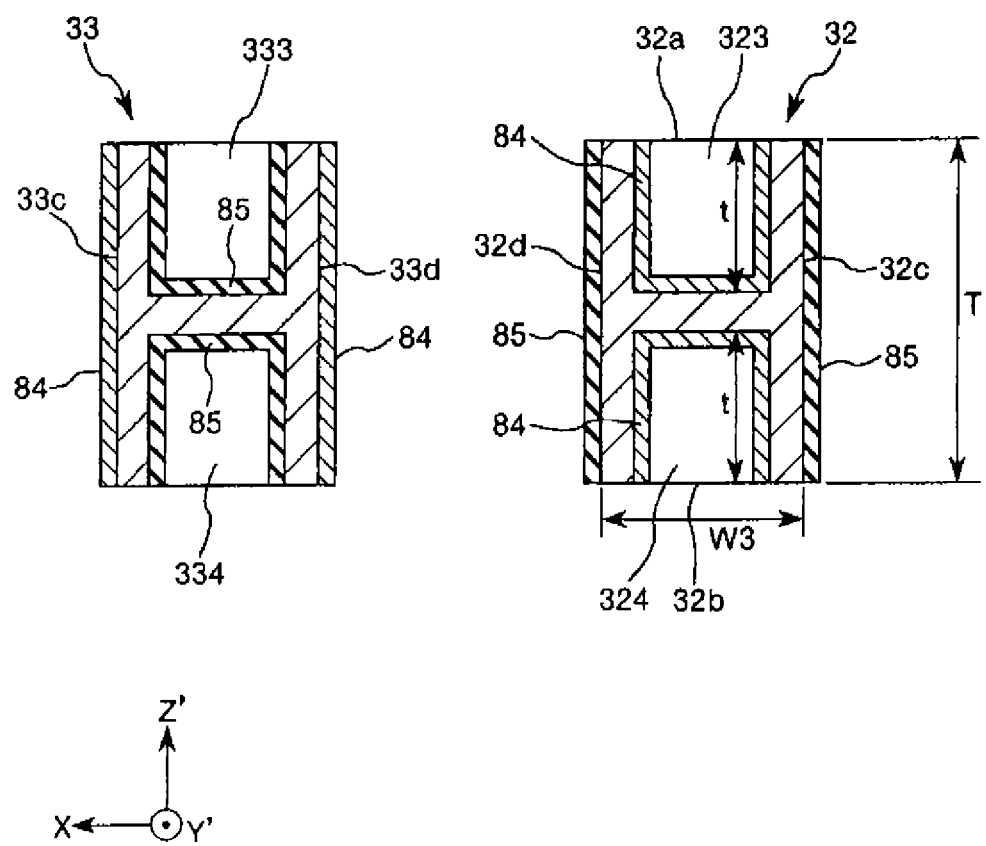
FIG. 3 is a cross-sectional view taken along the line B-B of FIG. 1.
Figure 4:
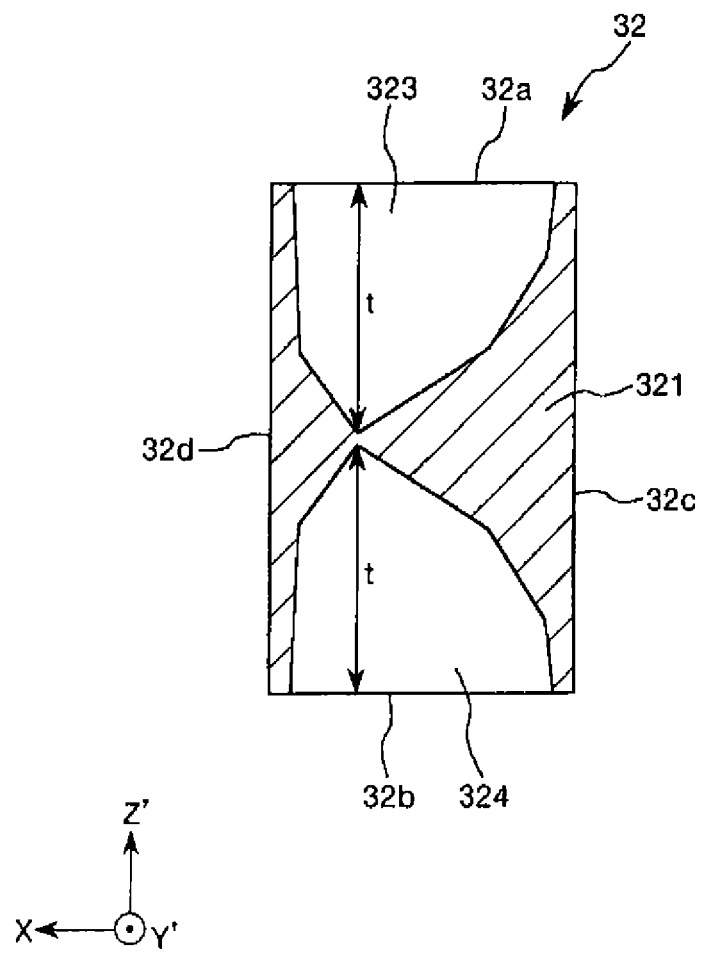
FIG. 4 is a cross-sectional view illustrating a vibrating arm which is formed through wet etching.
Figure 5:
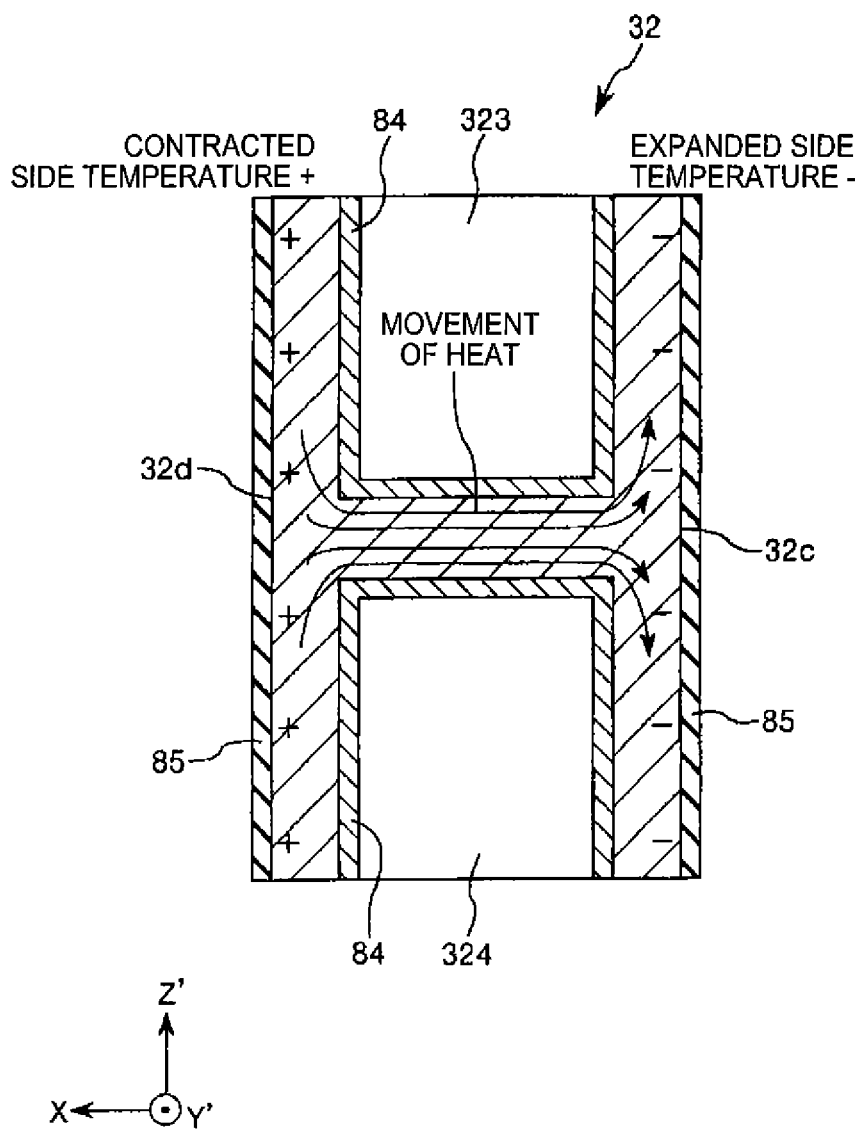
FIG. 5 is a cross-sectional view of the vibrating arm for explaining thermal conduction during flexural vibration.
Figure 6:
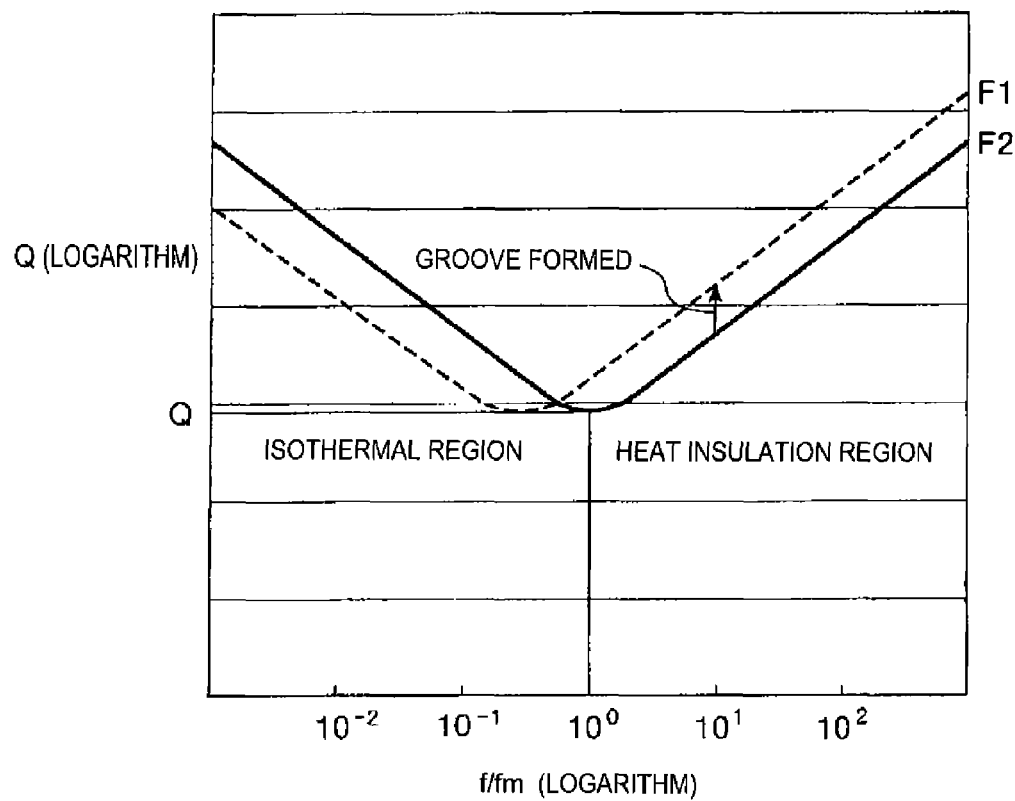
FIG. 6 is a graph illustrating a relationship between a Q value and f/fm.
Figure 7:
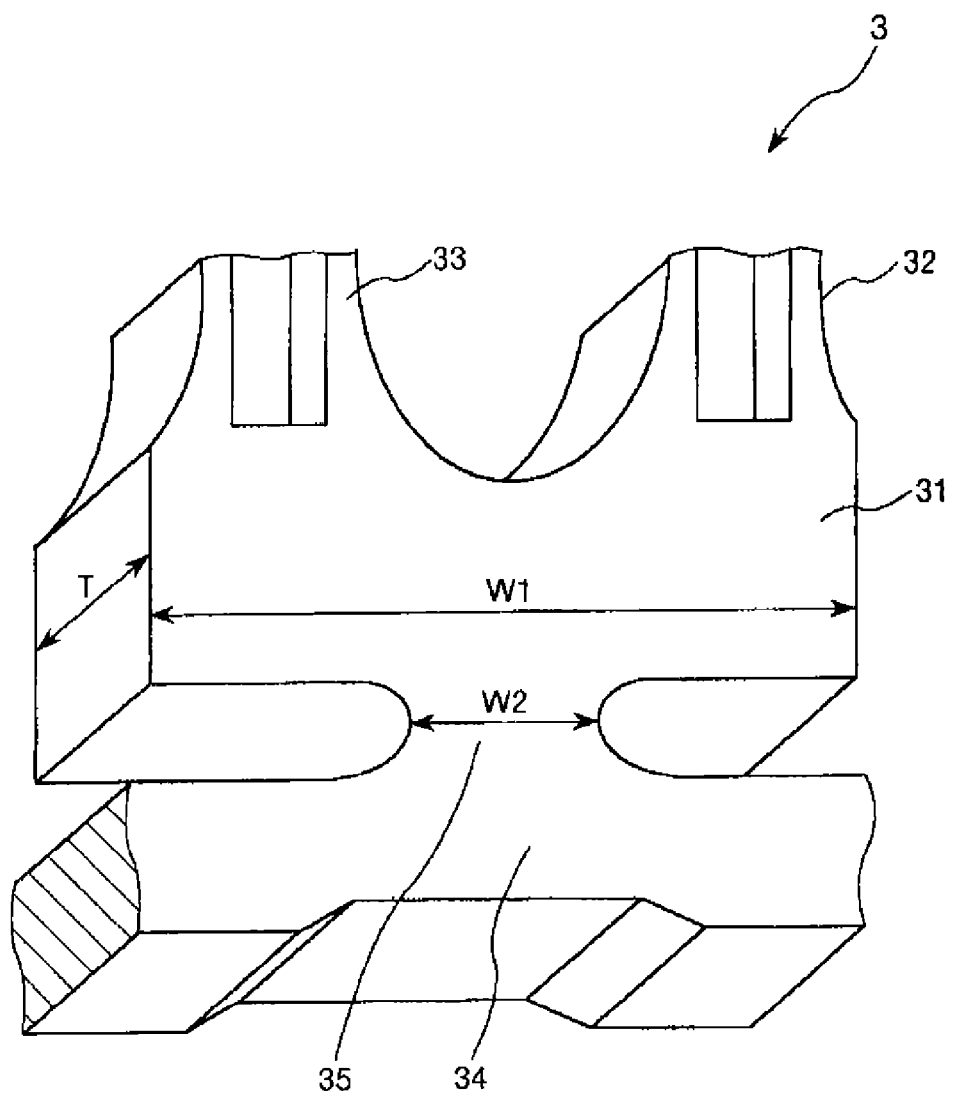
FIG. 7 is a perspective view illustrating a thickness T, and widths W1 and W2.
Figure 8:
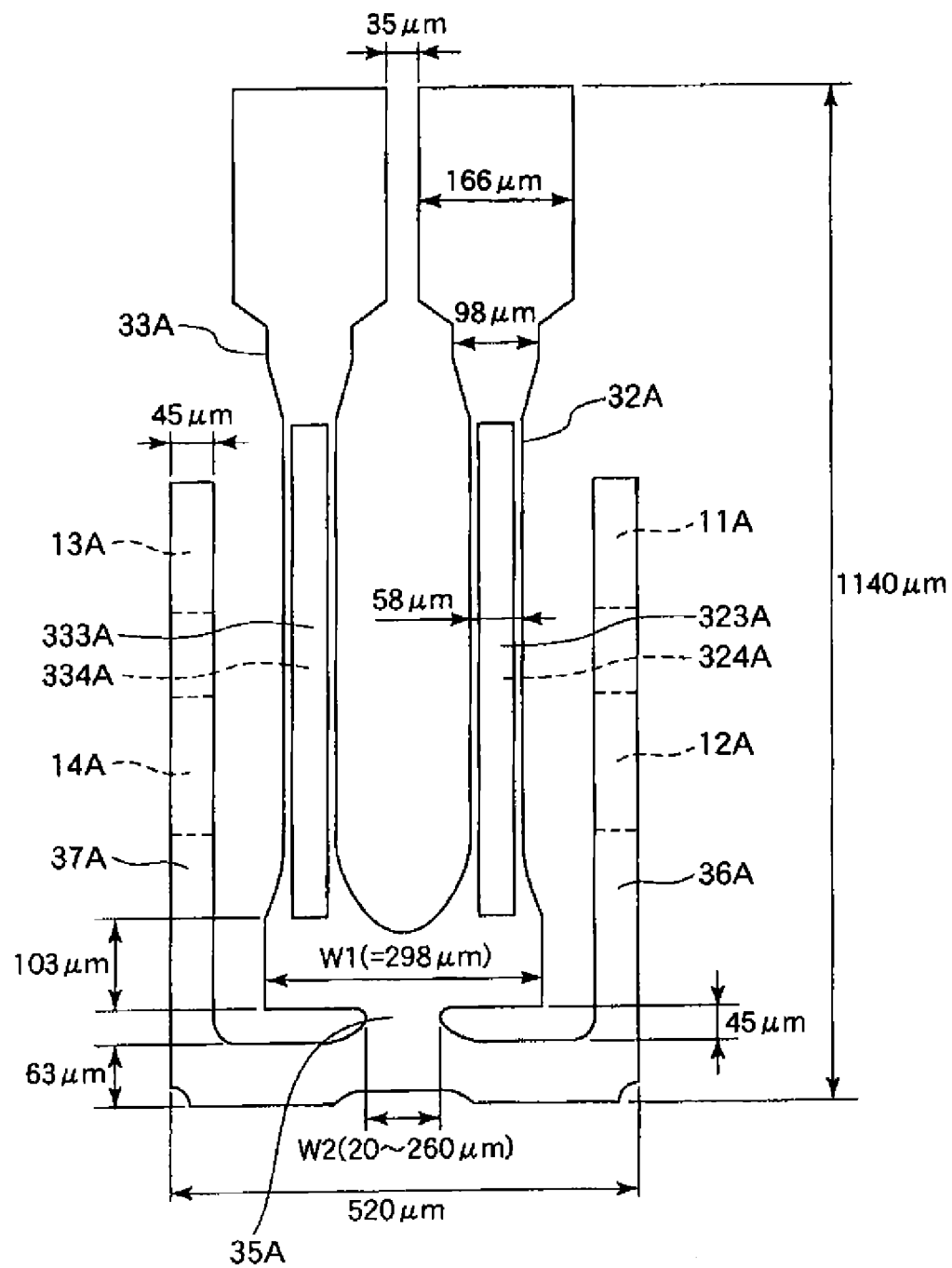
FIG. 8 is a plan view illustrating dimensions of a quartz crystal resonator blank used in a simulation.
Figure 9:
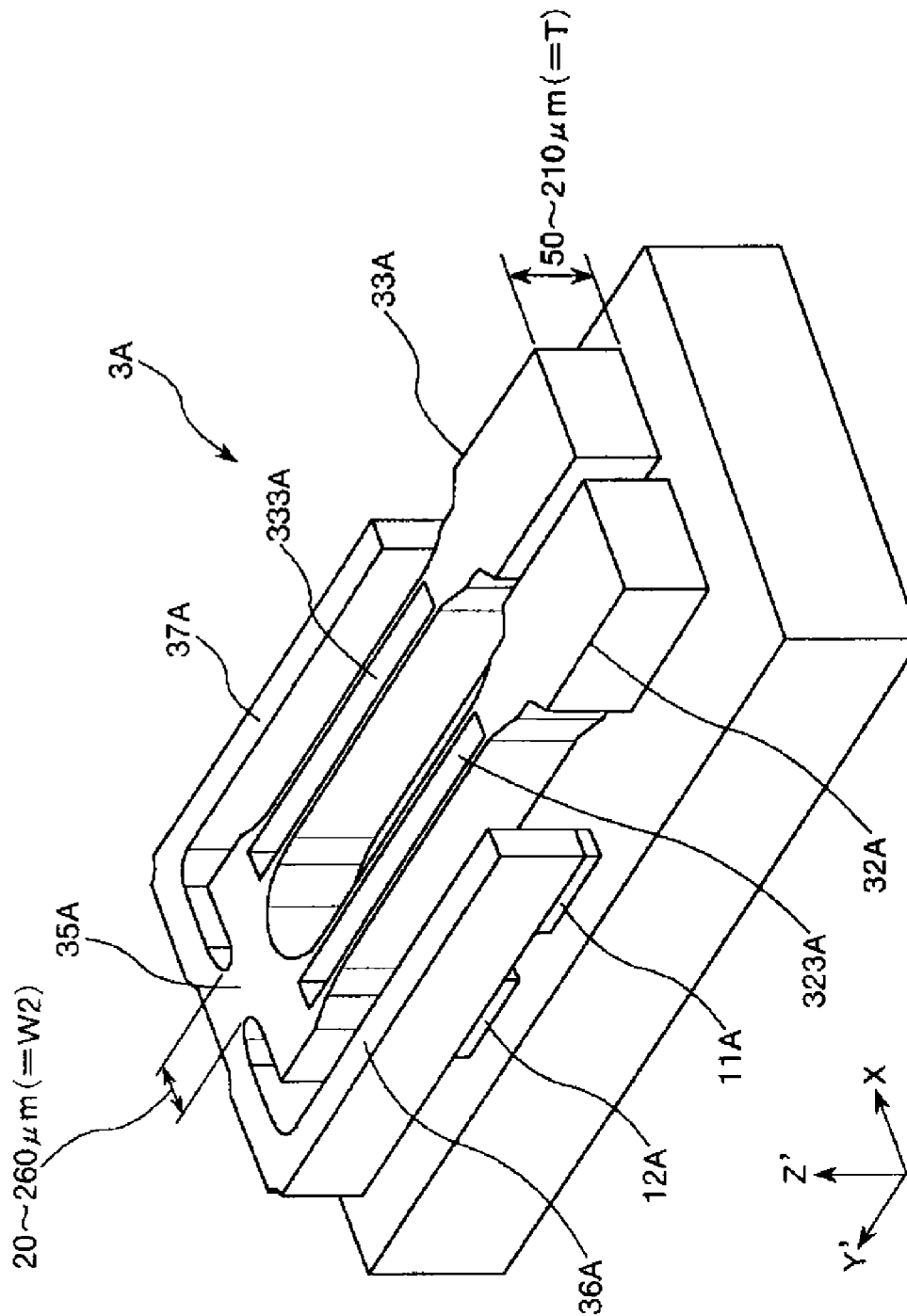
FIG. 9 is a perspective view for explaining a simulation method.
Figure 14:
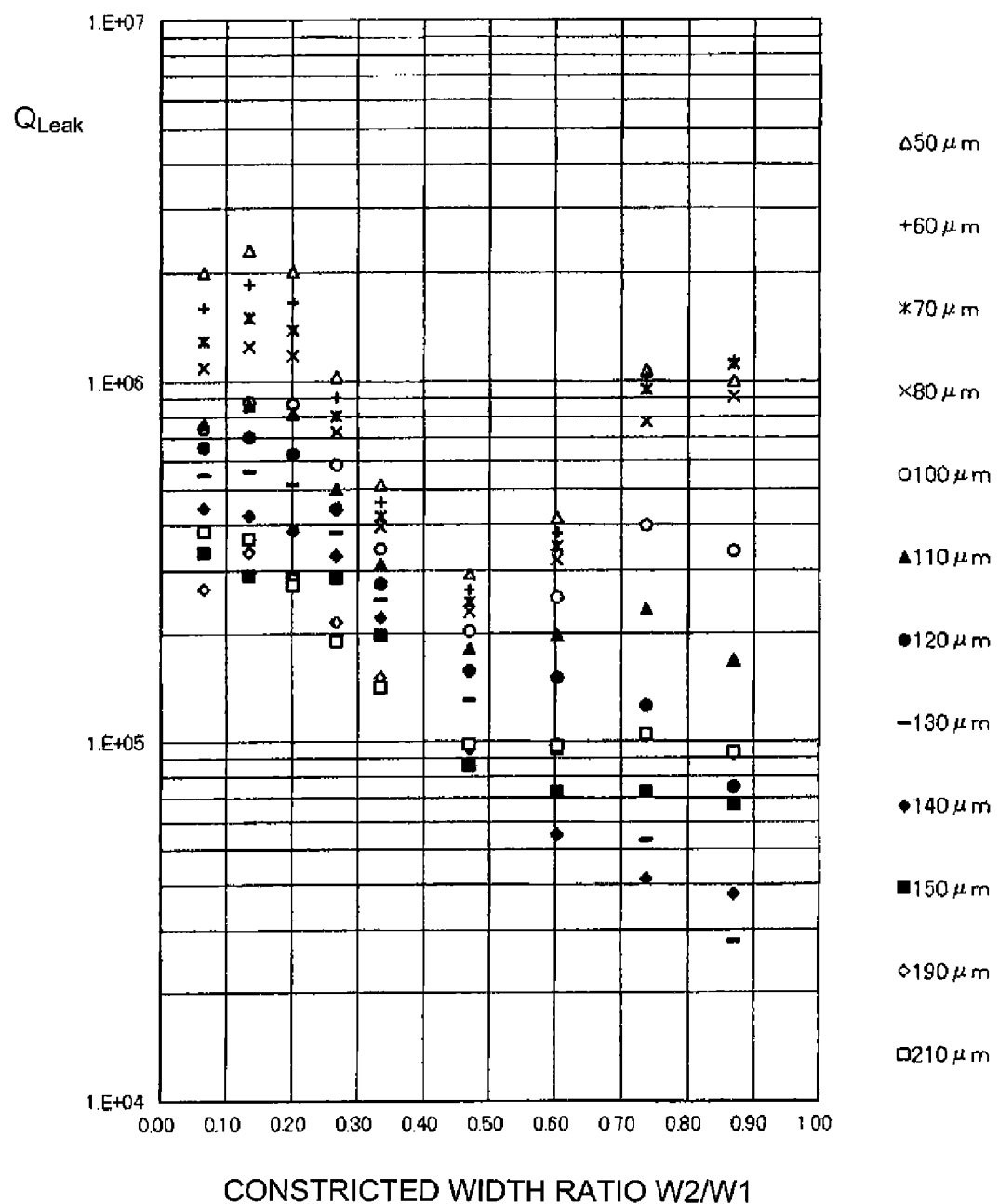
FIG. 14 is a graph illustrating a relationship between W2/W1 and $Q_{Leak}$.
Figure 15:
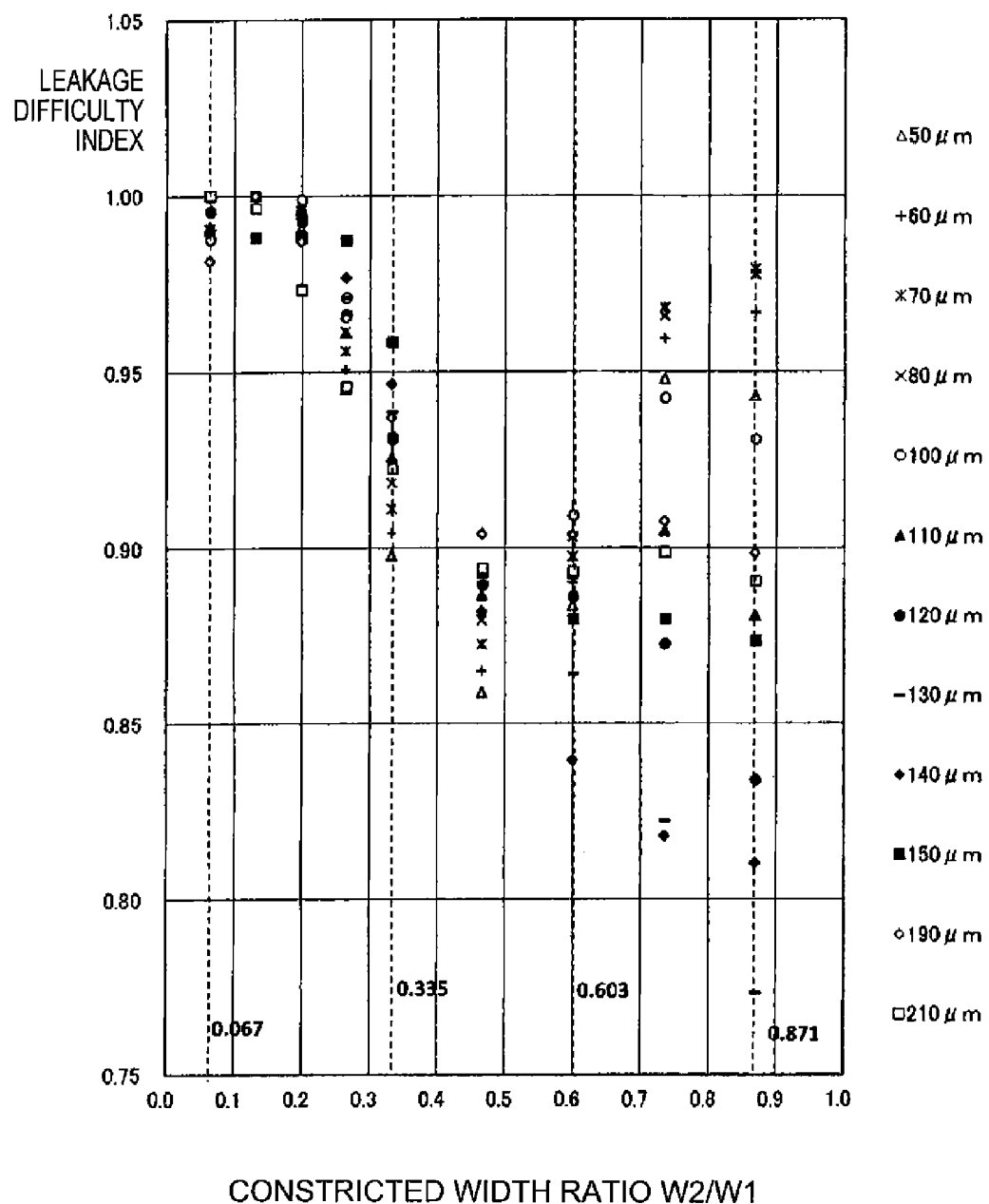
FIG. 15 is a graph illustrating a relationship between W2/W1 and a leakage difficulty index.
Figure 16:
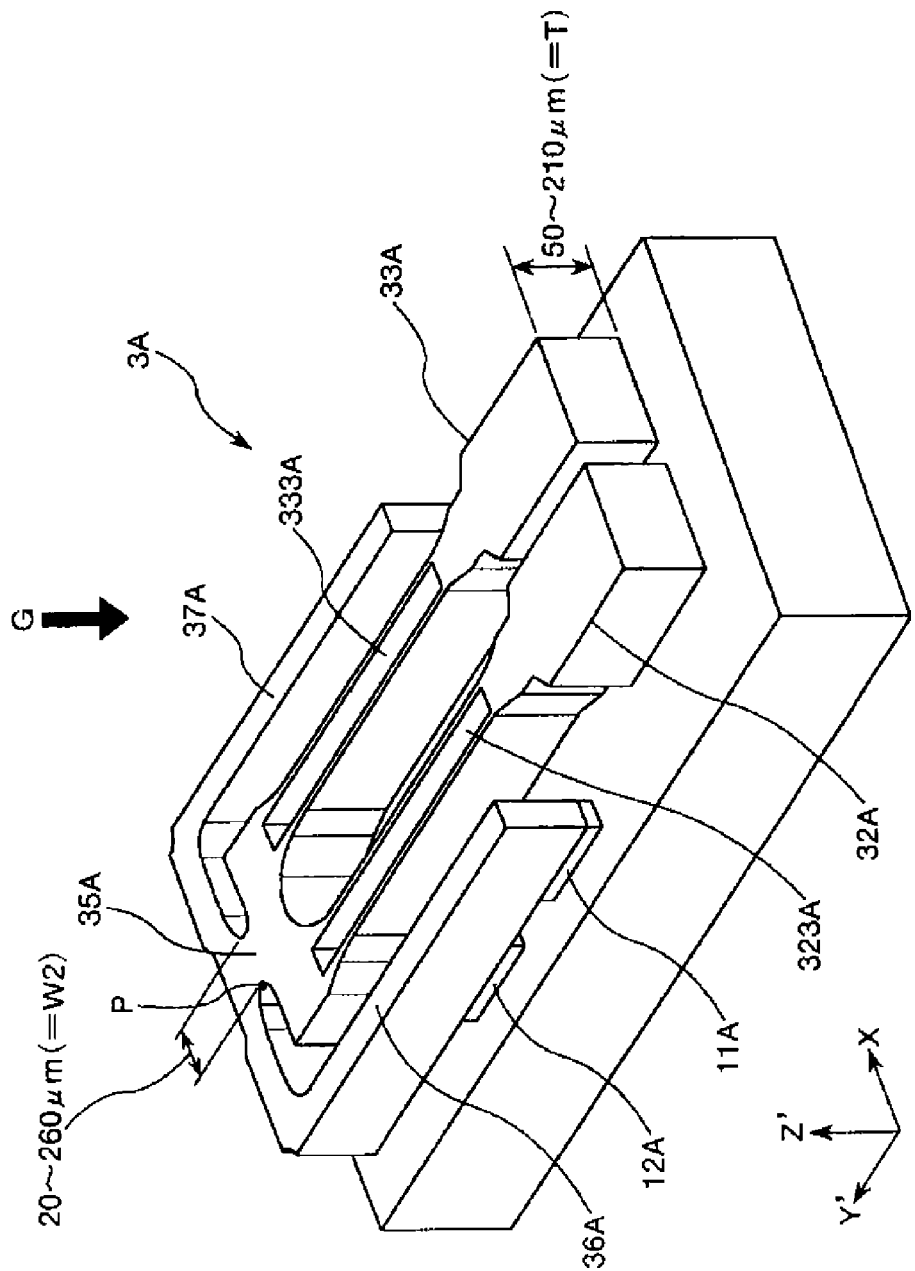
FIG. 16 is a perspective view for explaining another simulation method.
Figure 21:
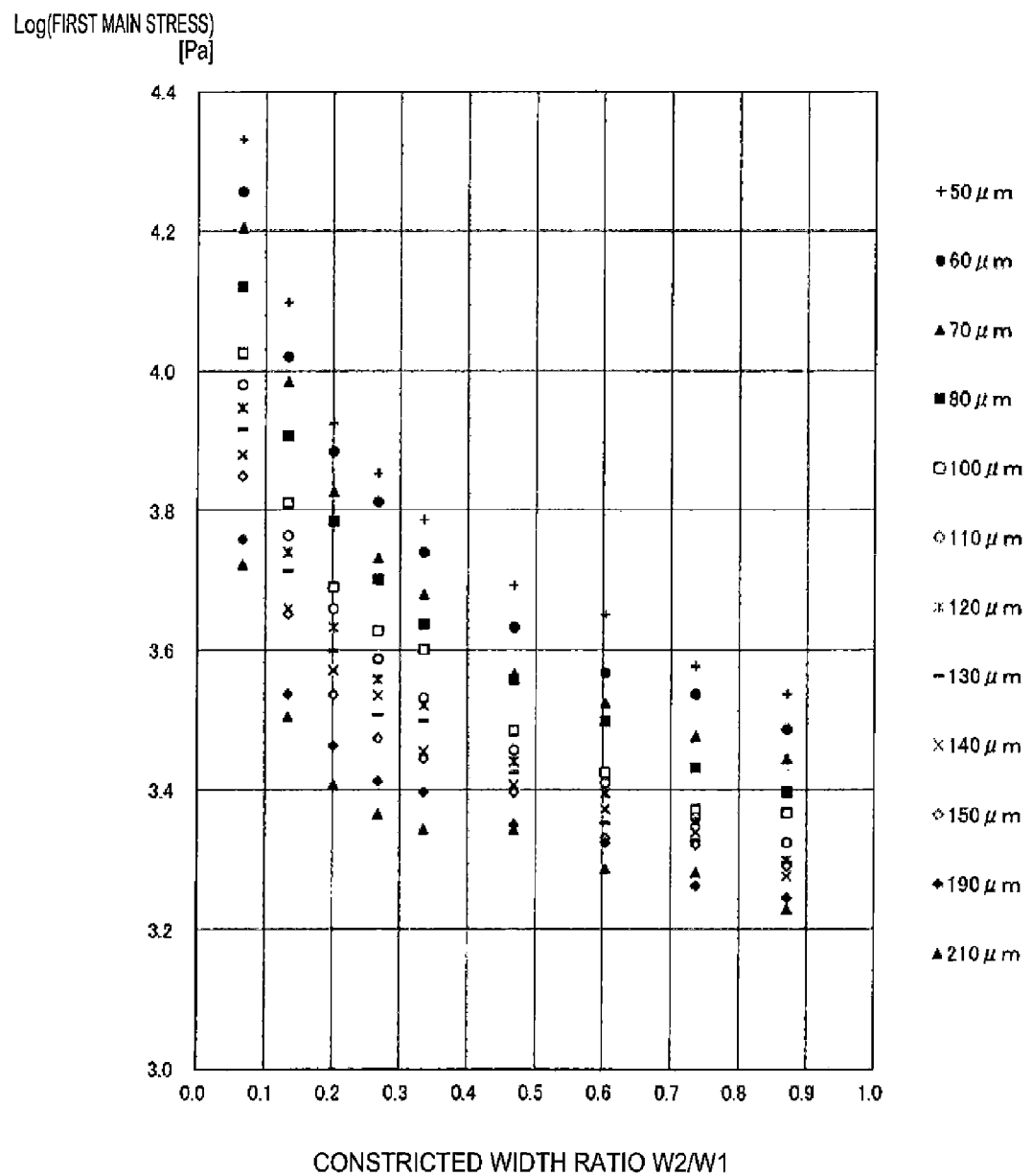
FIG. 21 is a graph illustrating a relationship between W2/W1 and log F.
Figure 22:
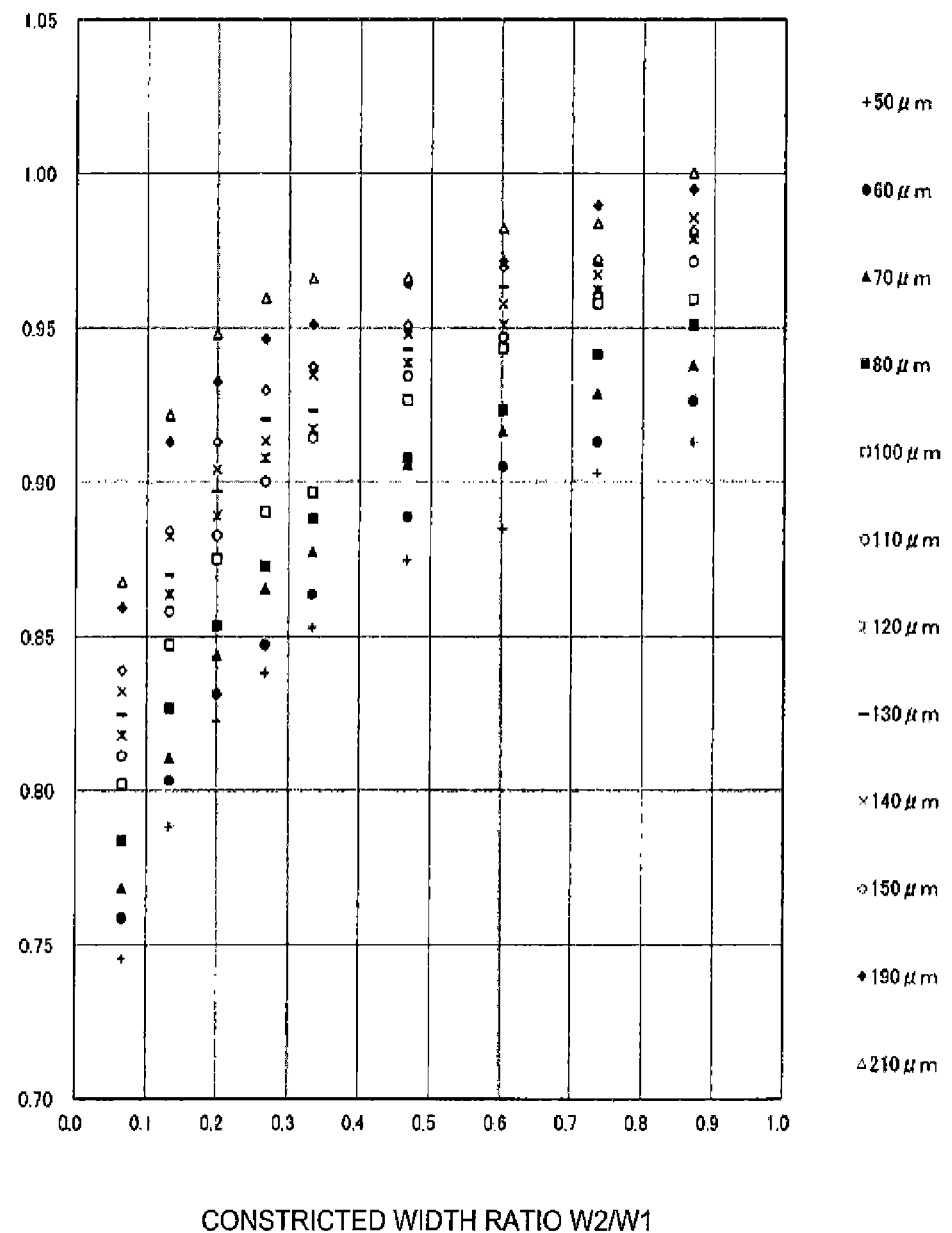
FIG. 22 is a graph illustrating a relationship between W2/W1 and an impact resistance index.
Figure 27:
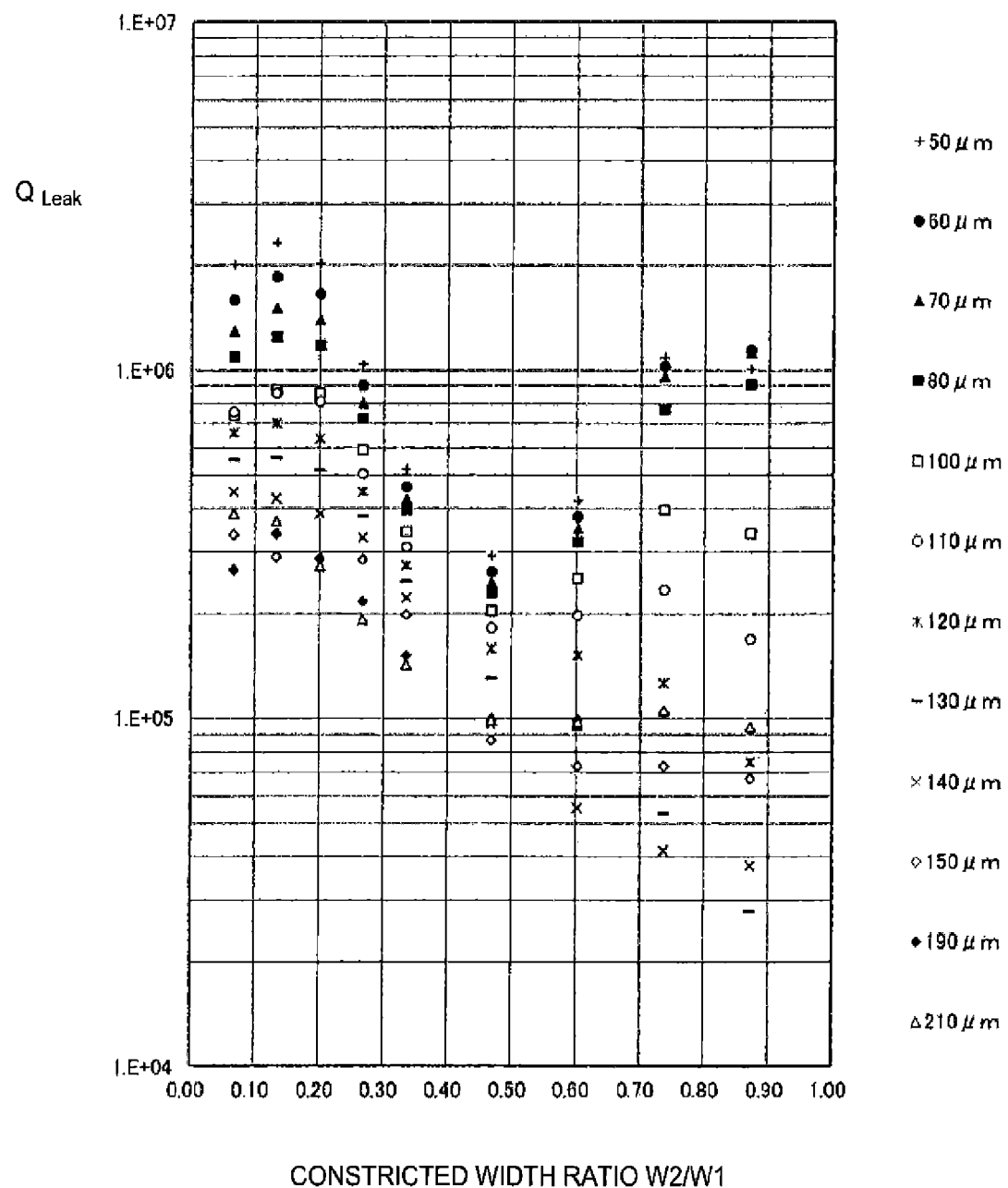
FIG. 27 is a graph illustrating a relationship between W2/W1 and $Q_{Leak}$.
Figure 28:
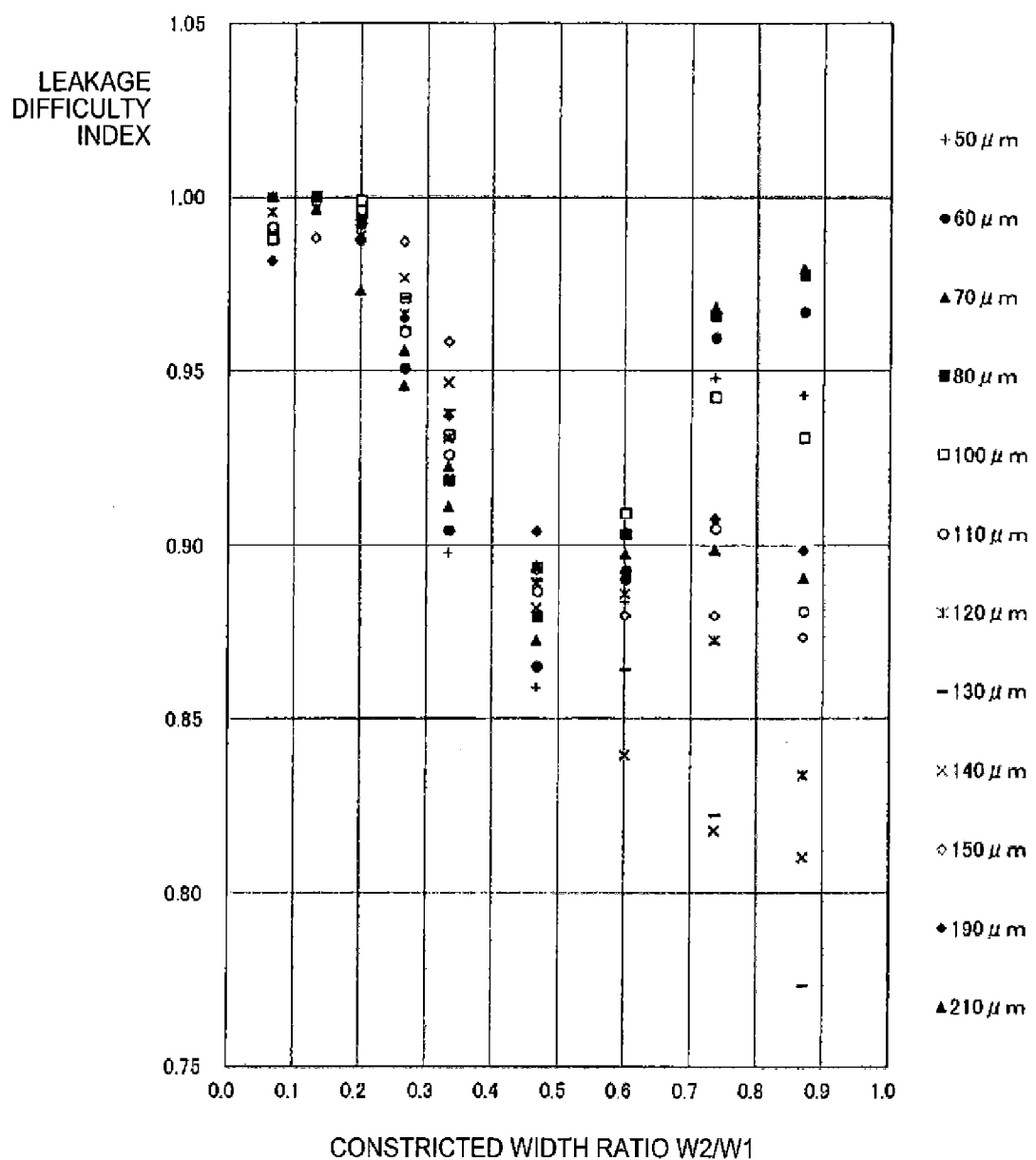
FIG. 28 is a graph illustrating a relationship between W2/W1 and a leakage difficulty index.
Figure 33:
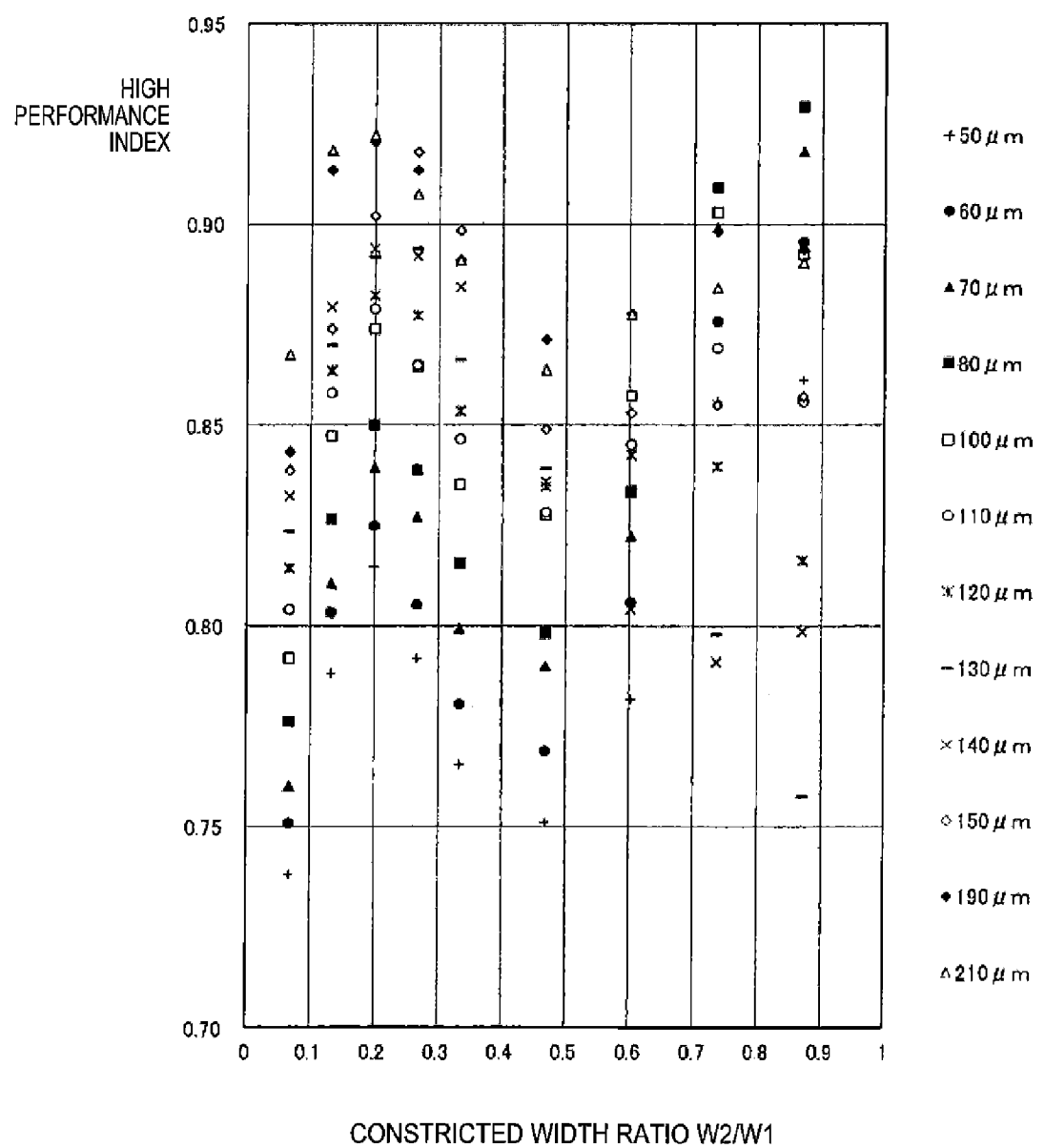
FIG. 33 is a graph illustrating W2/W1 and a high performance index.
Figure 34:
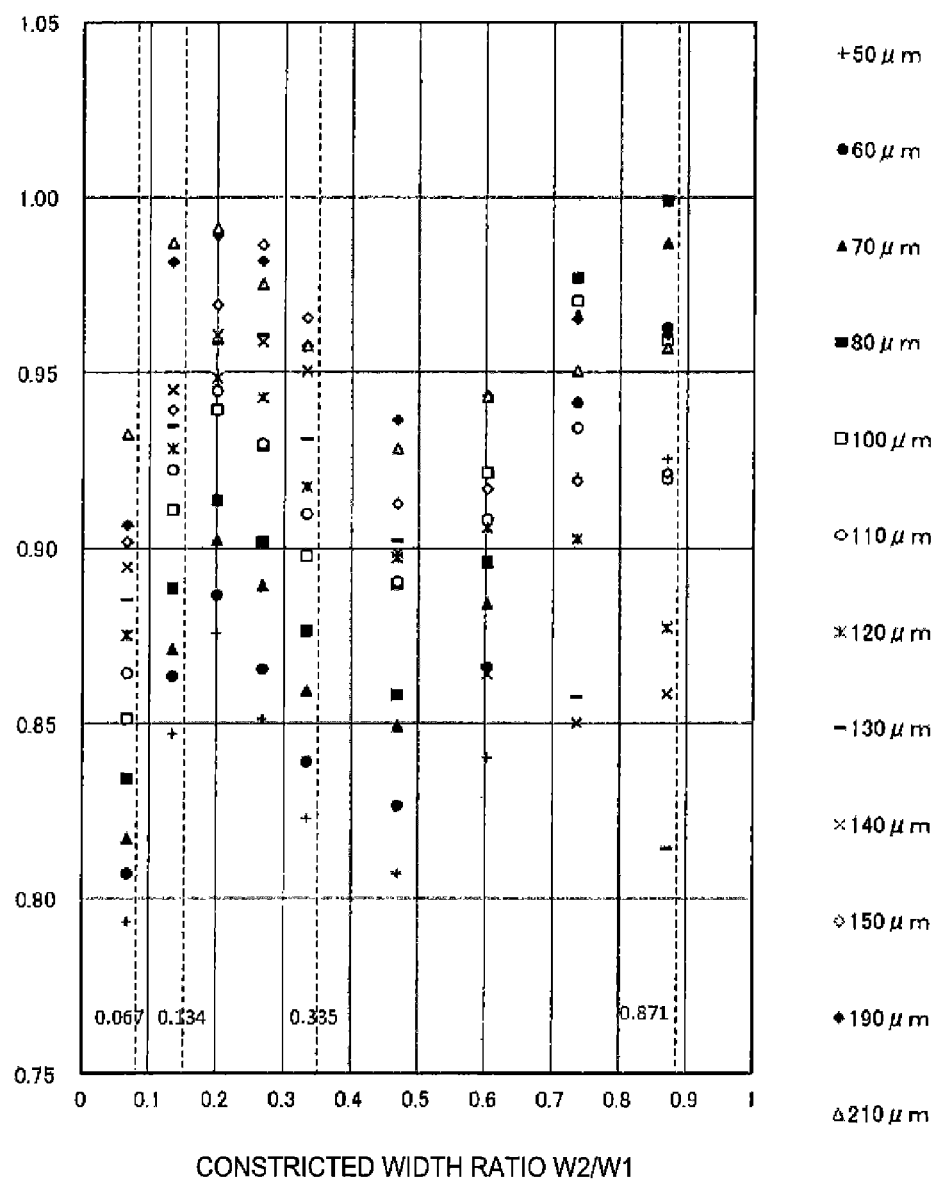
FIG. 34 is a graph illustrating W2/W1 and a normalized high performance index.

FIG. 1 is a plan view illustrating the resonator according to the first embodiment of the invention. FIG. 2 is a cross-sectional view taken along the line A-A of FIG. 1. FIG. 3 is a cross-sectional view taken along the line B-B of FIG. 1. FIG. 4 is a cross-sectional view illustrating a vibrating arm which is formed through wet etching. FIG. 5 is a cross-sectional view of the vibrating arm for explaining thermal conduction during flexural vibration. FIG. 6 is a graph illustrating a Q value and f/fm. FIG. 7 is a perspective view illustrating a thickness T, and widths W1 and W2. FIG. 8 is a plan view illustrating dimensions of a quartz crystal resonator blank used in a simulation. FIG. 9 is a perspective view for explaining a simulation method. FIGS. 10 to 13 are tables illustrating simulation results. FIG. 14 is a graph illustrating a relationship between W2/W1 and $Q_{Leak}$. FIG. 15 is a graph illustrating a relationship between W2/W1 and a leakage difficulty index. FIG. 16 is a perspective view for explaining another simulation method. FIGS. 17 to 20 are tables illustrating simulation results regarding the impact resistance. FIG. 21 is a graph illustrating a relationship between W2/W1 and log F. FIG. 22 is a graph illustrating a relationship between W2/W1 and an impact resistance index. FIGS. 23 to 26 are tables illustrating simulation results regarding vibration leakage. FIG. 27 is a graph illustrating a relationship between W2/W1 and $Q_{Leak}$. FIG. 28 is a graph illustrating a relationship between W2/W1 and a leakage difficulty index. FIG. 29 is a table illustrating a result of combining the simulation result of the impact resistance with the simulation result of the vibration leakage. FIGS. 30 to 32 are tables illustrating a result of combining the simulation result of the impact resistance with the simulation result of the vibration leakage. FIG. 33 is a graph illustrating W2/W1 and a high performance index. FIG. 34 is a graph illustrating W2/W1 and a high performance index.

Hereinafter, for convenience of description, the top side of FIG. 2 is referred to as an "upper side", and the bottom side thereof is referred to as a "lower side". In addition, the top side of FIG. 1 is referred to as a "distal end", and the bottom side thereof is referred to as a "basal end".

As illustrated in FIG. 1, a resonator 1 includes a resonator element 2, and a package 9 which stores the resonator element 2 therein.

Package

As illustrated in FIGS. 1 and 2, the package 9 includes a box-like base 91 having a recess 911 which is open upward, and a tabular lid 92 which closes an opening of the recess 911 and is joined to the base 91. The package 9 has an accommodation space S which is formed as a result of the recess 911 being closed by the lid 92, and the resonator element 2 is accommodated in an air-tight manner in the accommodation space S. An atmosphere of the accommodation space S is not particularly limited, but a decompressed state (vacuum state) is preferable. Consequently, air resistance to driving of the resonator element 2 is reduced, and thus it is possible to obtain a good vibration characteristic. A vacuum degree of the accommodation space S is not particularly limited, but is preferably equal to or lower than about 100 Pa, and is more preferably equal to or lower than about 10 Pa. Instead of the vacuum state, an inert gas such as nitrogen, helium, or argon may be sealed into the accommodation space S.

A material forming the base 91 is not particularly limited, but may use various ceramics such as aluminum oxide. A material forming the lid 92 is not particularly limited, but may be a material having a linear expansion coefficient similar to that of a material forming the base 91. For example, in a case where a material forming the base 91 uses the above-described ceramics, an alloy such as Kovar is preferably used. Joining between the base 91 and the lid 92 is not preferably limited, and the base 91 and the lid 92 may be joined to each other via, for example, a metalized layer.

In addition, connection terminals 951 and 961 are formed on a bottom surface of the recess 911 of the base 91. Conductive adhesive materials 11 and 12 are provided on the connection terminal 951, and conductive adhesive materials 13 and 14 are provided on the connection terminal 961. The resonator element 2 is installed on the base 91, the connection terminal 951 is electrically connected to a first driving electrode 84, described later, and the connection terminal 961 is electrically connected to a second driving electrode 85, described later, via the conductive adhesive materials 11 to 14.

The conductive adhesive materials 11 to 14 are not particularly limited as long as the materials are conductive and adhesive, and, for example, there may be a use of a conductive adhesive material in which conductive pillars such as silver particles are mixed with an epoxy-based, acryl-based, silicon-based, polyimide-based, bismaleimide-based, polyester-based or polyurethane-based resin. As mentioned above, since a relatively soft adhesive material is used, thermal stress caused by a difference between linear expansion coefficients of the base 91 and the resonator element 2 can be absorbed and alleviated by the conductive adhesive materials 11 to 14, and thus it is possible to reduce deterioration or variation in a vibration characteristic of the resonator element 2. If the resonator element 2 can be directly installed at the base 91, a gold bump, solder, or the like may be used instead of each of the conductive adhesive materials 11 to 14.

The connection terminal 951 is electrically connected to an external terminal 953 provided on a lower surface of the base 91 via a through electrode 952 which penetrates through the bottom of the base 91. Similarly, the connection terminal 961 is electrically connected to an external terminal 963 provided on the lower surface of the base 91 via a through electrode 962 which penetrates through the bottom of the base 91. A material forming each of the connection terminals 951 and 961, the through electrodes 952 and 962, and the external terminals 953 and 963 is not particularly limited as long as the material is conductive, and there may be a configuration in which, for example, a plating layer such as gold (Au), silver (Ag), or copper (Cu) is formed on a base layer such as chromium (Cr), nickel (Ni), tungsten (W), or molybdenum (Mo).

Resonator Element

As illustrated in FIGS. 1 to 3, the resonator element 2 includes a quartz crystal resonator blank (resonator blank) 3, and the first and second driving electrodes 84 and 85 formed on the quartz crystal resonator blank 3. In FIGS. 1 and 2, for convenience of description, the first and second driving electrodes 84 and 85 are not illustrated.

The quartz crystal resonator blank 3 is formed of a Z-cut quartz crystal plate. The Z-cut quartz crystal plate is a quartz crystal plate which has a Z axis substantially in a thickness direction. In the quartz crystal resonator blank 3, the thickness direction may match the Z axis, but the Z axis is slightly tilted with respect to the thickness direction from the viewpoint of reducing a frequency-temperature variation around a normal temperature. In other words, in a case where a tilt angle is set to θ degrees (−5°≤θ≤15°), when, in an orthogonal coordinate system which has the electrical axis of the quartz crystal as an X axis, the mechanical axis thereof as a Y axis, and the optical axis thereof as a Z axis, an axis which is tilted by θ degrees so that a +Z side of the Z axis is rotated in a −Y direction of the Y axis with the X axis as a rotation axis is set to a Z' axis, and an axis which is tilted by θ degrees so that a +Y side of the Y axis is rotated in a +Z direction of the Z axis is set to a Y' axis, the quartz crystal resonator blank 3 has a thickness in a direction along the Z' axis, and has a plane including the X axis and the Y' axis as a main surface. In each drawing, the X axis, the Y' axis, and the Z' axis are illustrated.

The quartz crystal resonator blank 3 has the Y' axis direction as a length direction, the X axis direction as a width direction, and the Z' axis direction as a thickness direction. The quartz crystal resonator blank 3 has almost the same thickness substantially in all regions (except for regions where grooves 323, 324, 333 and 334 are formed). A thickness T of the quartz crystal resonator blank 3 is not particularly limited, but is preferably about equal to or greater than 50 μm and equal to or smaller than 210 μm. If the thickness is smaller than the lower limit value, there is a concern that a mechanical strength may be insufficient and thus the quartz crystal resonator blank 3 may be damaged, and if the thickness is greater than the upper limit value, it is hard to create a micro-pattern by using wet etching and thus a size of the resonator element 2 is excessively increased.

The quartz crystal resonator blank 3 includes a base portion 31, a pair of vibrating arms 32 and 33 which extend in the −Y' axis direction from an end of the base portion 31 on the −Y' axis side, a linking portion 34 which is disposed on the +Y' axis side of the base portion 31 and extends in the X axis direction, a connecting portion 35 which is disposed between the base portion 31 and the linking portion 34 and connects the base portion 31 and the linking portion 34 to each other, and a pair of support arms 36 and 37 which extend in the −Y' axis direction from both ends of the linking portion 34. The base portion 31, the vibrating arms 32 and 33, the linking portion 34, the connecting portion 35, and the support arms 36 and 37 are integrally formed with each other.

The base portion 31 is formed in a plate shape which has an expanse on the XY' plane and a thickness in the Z' axis direction. The connecting portion 35 extends in the +Y' axis direction from the end of the base portion 31 on the +Y' axis side. The linking portion 34 is linked to an end of the connecting portion 35 on the +Y' axis side, and the linking portion 34 extends toward both sides of the X axis direction from the connecting portion 35. The support arm 36 extends in the −Y' axis direction from an end of the linking portion 34 on the −X axis side, and the support arm 37 extends in the −Y' axis direction from an end thereof on the +X axis side. The support arms 36 and 37 are disposed outside the vibrating arms 32 and 33, and thus the vibrating arms 32 and 33 are disposed between the support arms 36 and 37. Distal ends (ends on the −Y' axis side) of the support arms 36 and 37 are located further toward the +Y' axis side than the distal ends (ends on the −Y' axis side) of the vibrating arms 32 and 33.

The support arm 36 is installed at the base 91 via the conductive adhesive materials 11 and 12, and the support arm 37 is installed at the base 91 via the conductive adhesive materials 13 and 14. The conductive adhesive materials 11 and 12 are disposed to be separated from each other in the extending direction of the support arm 36, and the conductive adhesive materials 13 and 14 are disposed to be separated from each other in the extending direction of the support arm 37. As mentioned above, it is possible to more stably install the resonator element 2 at the base 91 by using the four conductive adhesive materials 11, 12, 13 and 14. Preferably, at least parts of the conductive adhesive materials 11 and 13 located on the distal end side are located further toward the distal end side than a centroid G' of the resonator element 2, and at least parts of the conductive adhesive materials 12 and 14 located on the basal end side are located further toward the basal end side than the centroid G' of the resonator element 2. Consequently, it is possible to further more stably install the resonator element 2 at the base 91.

Here, a width of the connecting portion 35 is smaller than that of the base portion 31. In other words, the connecting portion 35 is narrower than the base portion 31. It can also be said that the connecting portion 35 is formed by cut sections 31a and 31b which are formed by partially reducing dimensions of both edges of the base portion 31 in the width direction at positions which are sufficiently separated from the ends of the base portion. 31 on the sides of the vibrating arms 32 and 33. As a result of providing the connecting portion 35, the vibration leakage is prevented from propagating toward the support arms 36 and 37 when the vibrating arms 32 and 33 perform flexural vibration, and thus it is possible to reduce a CI value (equivalent series resistance). In other words, the connecting portion 35 is provided, and thus the resonator element 2 has an excellent vibration characteristic.

The vibrating arms 32 and 33 are arranged in the X axis direction, and extend in the −Y' axis direction from the end of the base portion 31 on the −Y' axis side so as to be parallel to each other. Each of the vibrating arms 32 and 33 is rectangular, and a basal end thereof (an end on the +Y' axis side) is a fixed end, and a distal end thereof (an end on the −Y' axis side) is a free end. The vibrating arms 32 and 33 respectively have arm sections 321 and 331 which extend from the base portion 31, and hammer heads (wide sections) 322 and 332 which are provided at distal ends of the arm sections 321 and 331 and are weight sections wider than the arm sections 321 and 331. As mentioned above, the hammer heads 322 and 332 are provided at the distal ends of the vibrating arms 32 and 33, and therefore it is possible to shorten the vibrating arms 32 and 33 and thus to miniaturize the resonator element 2. As the vibrating arms 32 and 33 are shortened, vibration speeds of the vibrating arms 32 and 33 can be made lower than those in the related art when the vibrating arms 32 and 33 are made to vibrate at the same frequency. Therefore, air resistance can be reduced when the vibrating arms 32 and 33 vibrate, and thus a Q value increases, thereby improving a vibration characteristic.

Hereinafter, the vibrating arms 32 and 33 will be described in detail, and the vibrating arms 32 and 33 have the same configuration as each other. Therefore, in the following description, the vibrating arm 32 will be described as a representative thereof, and description of the vibrating arm 33 will be omitted.

As illustrated in FIG. 3, the arm section 321 has a pair of main surfaces 32a and 32b which are formed of the XY' plane and are front and rear surfaces with respect to each other, and a pair of side surfaces 32c and 32d which are formed of the Y'Z' plane and connect the pair of main surfaces 32a and 32b to each other. In addition, the arm section 321 has a bottomed groove 323 which is open to the main surface 32a, and a bottomed groove 324 which is open to the main surface 32b. As mentioned above, since the grooves 323 and 324 are formed in the vibrating arm 32, it is possible to reduce thermoelastic loss and thus to show an excellent vibration characteristic. A length of each of the grooves 323 and 324 is not particularly limited, and, for example, a distal end thereof may extend to the hammer head 322, and a basal end thereof may extend to the base portion 31. With this configuration, stress concentration on a boundary between the arm section 321 and the hammer head 322 and a boundary between the arm section 321 and the base portion 31 is alleviated, and thus a concern about the occurrence of breaking or chipping is recued when an impact is applied thereto. The groove may be formed in either one of the main surfaces 32a and 32b, and may be omitted.

A depth t of each of the grooves 323 and 324 preferably satisfies a relationship of 0.292≤t/T≤0.483. If this relationship is satisfied, a heat movement path is lengthened, and thus it is possible to more effectively reduce a thermoelastic loss in a heat insulation region, described later. The depth t more preferably satisfies a relationship of 0.455≤t/T≤0.483.

If this relationship is satisfied, a heat movement path is further lengthened. For this reason, it is possible to further reduce a thermoelastic loss and thus to improve a Q value and to reduce a CI value. In addition, it is possible to increase an area of an electrode for applying an electric field to a region which is flexurally deformed and thus to reduce a CI value.

In a case where the quartz crystal resonator blank 3 is produced by patterning a quartz crystal plate through wet etching, a cross section of the arm section 321 has a shape in which a surface of the quartz crystal is exposed as illustrated in FIG. 4. Specifically, since an etching rate in the −X axis direction is lower than an etching rate in the +X axis direction, the side surface in the −X axis direction is tilted relatively smoothly, and the side surface in the +X axis direction is tilted approximately vertically. The depth t of each of the grooves 323 and 324 in this case indicates a depth at the deepest position as illustrated in FIG. 4.

The grooves 323 and 324 are preferably formed in the vibrating arm 32 by adjusting positions thereof in the X axis direction so that a cross section centroid of the vibrating arm 32 matches a center of a cross-sectional shape of the vibrating arm 32. In the above-described manner, unnecessary vibration (specifically, vibration having an out-of-surface component) of the vibrating arm 32 is reduced, and thus it is possible to reduce the vibration leakage. In this case, since unnecessary excitation is reduced, an excitation region is relatively increased, and thus a CI value can be reduced.

A width W3 (a length in the X axis direction) of the arm section 321 is not particularly limited, but is preferably equal to or greater than 16 μm and equal to or smaller than 300 μm, and is more preferably equal to or greater than 45 μm and equal to or smaller than 60 μm. If the width W3 is smaller than the lower limit value, there are cases where it is difficult to form the grooves 323 and 324 in the arm section 321 depending on manufacturing techniques, and the vibrating arm 32 cannot be formed as a heat insulation region. On the other hand, if the width W3 is greater than the upper limit value, there are cases where the rigidity of the arm section 321 becomes too high depending on a thickness of the quartz crystal resonator blank 3, and thus flexural vibration of the arm section 321 cannot be smoothly performed. The width W3 mentioned here is a width of a section which is located at the center of the arm section 321 and extends with a substantially constant width, and is not a width of a tapered section located at both ends thereof.

When the entire length (a length in the Y' axis direction) of the vibrating arm 32 is set to L, and the entire length (a length in the Y' axis direction) of the hammer head 322 is set to H, a relationship of 0.183≤H/L≤0.597 is preferably satisfied, and a relationship of 0.238≤H/L≤0.531 is more preferably satisfied. Consequently, it is possible to provide the resonator element 2 which can achieve both miniaturization and improvement in a vibration characteristic. The hammer head 322 is a region which has a width which is 1.5 times or greater the width (a length in the X axis direction) of the arm section 321. The basal end of the vibrating arm 32 is an end point of a tapered section located outside the basal end section of the vibrating arm 32.

A width (a length in the X axis direction) W4 of the hammer head 322 is not particularly limited, but is preferably 2.8 times or greater the width W3 of the arm section 321. In other words, a relationship of W4≥2.8W3 is preferably satisfied. Consequently, the mass effect of the hammer head 322 can be sufficiently achieved, and thus the above-described effect (achievement of both miniaturization and improvement in a vibration characteristic) can be more effectively achieved. The hammer head 322 of the present embodiment has a basal end section 322a located on the basal end side, and a distal end section 322b which is located on the distal end side of the basal end section 322a and is wider than the basal end section 322a. The width W4 indicates a width of the distal end section 322b.

The above description relates to a shape of the quartz crystal resonator blank 3.

As illustrated in FIG. 3, the vibrating arm 32 of the quartz crystal resonator blank 3 is provided with a pair of first driving electrodes 84 and a pair of second driving electrodes 85. One of the first driving electrodes 84 is formed on the inner surface of the groove 323, and the other thereof is formed on the groove 324. One of the second driving electrodes 85 is formed on the side surface 32c, and the other thereof is formed on the side surface 32d. Similarly, the vibrating arm 33 is also provided with a pair of first driving electrodes 84 and a pair of second driving electrodes 85. One of the first driving electrodes 84 is formed on a side surface 33c, and the other thereof is formed on a side surface 33d. One of the second driving electrodes 85 is formed on an inner surface of the groove 333, and the other thereof is formed on an inner surface of the groove 334. The respective first driving electrodes 84 are extracted up to the support arm 36 via wires (not illustrated), and are electrically connected to the connection terminal 951 via the conductive adhesive materials 11 and 12. Similarly, the respective second driving electrodes 85 are extracted up to the support arm 37 via wires (not illustrated), and are electrically connected to the connection terminal 961 via the conductive adhesive materials 13 and 14. If alternating voltages are applied to the first and second driving electrodes 84 and 85, the vibrating arms 32 and 33 vibrate in the X axis direction (in-surface direction) at a predetermined frequency so as to repeatedly come close to or separate from each other.

A material forming each of the first and second driving electrodes 84 and 85 is not particularly limited as long as the material is conductive, and there may be a configuration in which, for example, a coating layer such as gold (Au), silver (Ag), or copper (Cu) is formed on a base layer such as chromium (Cr), nickel (Ni), tungsten (W), or molybdenum (Mo).

A specific configuration of the first and second driving electrodes 84 and 85 may be a configuration in which, for example, an Au layer of 700 angstrom or smaller is formed on a Cr layer of 700 angstrom or smaller. Particularly, Cr or Au has a high thermoelastic loss, and thus the Cr layer or the Au layer preferably has a thickness of 200 angstrom or smaller. In a case where insulation breakdown resistance is to be increased, the Cr layer or the Au layer preferably has a thickness of 1000 angstrom or greater. In addition, since Ni has a thermal expansion coefficient similar to that of the quartz crystal, if a Ni layer is used as a base layer instead of the Cr layer, thermal stress caused by the electrode is reduced, and thus it is possible to provide a resonator element with long-term reliability (aging characteristics).

The above description relates to a configuration of the resonator element 2. As described above, since the grooves 323, 324, 333 and 334 are formed in the respective vibrating arms 32 and 33 of the resonator element 2, a thermoelastic loss can be reduced, and thus it is possible to obtain an excellent vibration characteristic. Hereinafter, this will be described in detail by exemplifying the vibrating arm 32.

As described above, the vibrating arm 32 flexurally vibrates in the in-surface direction by applying alternating voltages between the first and second driving electrodes 84 and 85. As illustrated in FIG. 5, during the flexural vibration, if the side surface 32c of the arm section 321 is contracted, the side surface 32d is expanded, and, conversely, if the side surface 32c is expanded, the side surface 32d is contracted. In a case where the vibrating arm 32 does not show a Gough-Joule effect (energy elasticity is more dominant than entropy elasticity), of the side surfaces 32c and 32d, a temperature of a contracted surface side increases, and a temperature of an expanded surface side decreases. For this reason, a temperature difference occurs between the side surface 32c and the side surface 32d, that is, inside the arm section 321. A loss of vibration energy occurs due to thermal conduction caused by the temperature difference, and thus a Q value of the resonator element 2 is reduced. A loss of energy caused by the reduction in the Q value is referred to as a thermoelastic loss.

In a resonator element which vibrates in a flexural vibration mode, such as the resonator element 2 with the configuration, when a flexural vibration frequency (mechanical flexural vibration frequency) f of the vibrating arm 32 changes, a Q value becomes the minimum in a case where the flexural vibration frequency f of the vibrating arm 32 matches a heat relaxation frequency fm. The heat relaxation frequency fm can be obtained from the following Equation (1). Here, in Equation (1), π is a circular constant, and τ is a relaxation time which is required for a temperature difference to become a multiple of $e^{-1}$ when e is a Napier's constant.

$$fm = \frac{1}{2\pi\tau} \quad (1)$$

If a heat relaxation frequency fm of a plate structure (whose cross-sectional shape is rectangular) is set to fm0, fm0 can be obtained from the following Equation (2). In Equation (2), π is a circular constant, k is thermal conductivity of the vibrating arm 32 in a vibration direction, ρ is mass density of the vibrating arm 32, Cp is heat capacity of the vibrating arm 32, and a is a width of the vibrating arm 32 in the vibration direction. In a case where constants of a material (that is, quartz crystal) of the vibrating arm 32 are assigned to the thermal conductivity k, the mass density ρ, and the heat capacity Cp of Equation (2), the heat relaxation frequency fm0 becomes a value in a case where the grooves 323 and 324 are not provided in the vibrating arm 32.

$$fm0 = \frac{\pi k}{2\rho C p a^2} \quad (2)$$

The grooves 323 and 324 are formed in the vibrating arm 32 so as to be located between the side surfaces 32c and 32d. For this reason, heat movement paths for thermally balancing a thermal difference between the side surfaces 32c and 32d occurring during flexural vibration of the vibrating arm 32, through thermal conduction, are formed so as to bypass the grooves 323 and 324, and thus the heat movement paths are longer than a linear distance (shortest distance) between the side surfaces 32c and 32d. For this reason, the relaxation time t becomes longer than that in a case where the grooves 323 and 324 are not provided in the vibrating arm 32, and thus the heat relaxation frequency fm is reduced.

FIG. 6 is a graph illustrating an f/fm dependency of a Q value of the resonator element in a flexural vibration mode. In the graph, a curve F1 denoted by a dashed line indicates a case where a groove is formed in a vibrating arm as in the resonator element 2, and a curve F2 denoted by a solid line indicates a case where a groove is not formed in a vibrating arm. As illustrated in FIG. 6, shapes of the curves F1 and F2 are the same as each other, but the curve F1 is shifted to the curve F2 in a frequency reduction direction due to the above-described reduction in the heat relaxation frequency fm. Therefore, when a heat relaxation frequency is set to fm1 in a case where a groove is formed in a vibrating arm as in the resonator element 2, if the following Equation (3) is satisfied, a Q value of a resonator element in which a groove is formed in a vibrating arm is always higher than a Q value of a resonator element in which a groove is not formed in a vibrating arm.

$$f > \sqrt{fm0 \cdot fm1} \quad (3)$$

Further, if the following (4) is satisfied, a higher Q value can be obtained.

$$\frac{f}{fm0} > 1 \quad (4)$$

In FIG. 6, a region of f/fm<1 is referred to as an isothermal region. In this isothermal region, the smaller the value of f/fm, the higher the Q value. This is because the above-described temperature difference hardly occurs in the vibrating arm as a result of the decrease in a mechanical frequency of the vibrating arm (vibration of the vibrating arm is delayed). Therefore, in a limit in which f/fm endlessly approaches 0 (zero), an isothermal quasistatic operation occurs, and a thermoelastic loss endlessly approaches 0 (zero). On the other hand, a region of f/fm>1 is referred to a heat insulation region. In this heat insulation region, the greater the value of f/fm, the higher the Q value. This is because switching between a temperature increase and a temperature effect of each side surface is performed at a high speed as a result of the increase in a mechanical frequency of the vibrating arm, and thus there is no time for the above-described thermal conduction. Therefore, in a limit in which f/fm is endlessly increased, a heat insulation operation occurs, and a thermoelastic loss endlessly approaches 0 (zero). From this fact, it can be said that a region satisfying the relationship of f/fm>1 is a heat insulation region.

The above description relates to a thermoelastic loss.

In this resonator element 2, when a relationship between a thickness (a length in the Z' axis direction) T of the quartz crystal resonator blank 3, a width (a length in the X axis direction) W1 of the base portion 31, and a width (a length in the X axis direction) W2 of the connecting portion 35, illustrated in FIG. 7, has one of the following patterns 1 and 2, the vibration leakage of the resonator element 2 can be more reliably reduced. In other words, as described above, if the connecting portion 35 is provided, the vibration leakage can be reduced, but if only the connecting portion 35 is provided, there is a case where the vibration leakage cannot be reduced. Therefore, one of the patterns 1 and 2 is employed, and thus it is possible to more reliably reduce the resonator element 2. The width W2 of the connecting portion 35 indicates a width of a section whose width is smallest. It is assumed that both the width W1 of the base portion 31 and the width W2 of the connecting portion 35 are defined on contours of the front and rear main surfaces.

Pattern 1

In the pattern 1, the thickness T satisfies a relationship of 50 μm≤T≤210 μm, and the widths W1 and W2 satisfy a relationship of 0.067≤W2/W1≤0.335.

Pattern 2

In the pattern 2, the thickness T satisfies a relationship of 50 μm≤T≤100 μm, and the widths W1 and W2 satisfy a relationship of 0.603≤W2/W1≤0.871.

Hereinafter, it will be proven that, if one of the patterns 1 and 2 is satisfied, the resonator element 2 of which the vibration leakage is reduced and which has an excellent vibration characteristic is obtained, on the basis of results of simulation performed by the present inventors. A quartz crystal resonator blank 3A used in the present simulation is obtained by patterning a Z-cut quartz crystal plate through wet etching, and has dimensions illustrated in FIG. 8. Each of grooves 323A, 324A, 333A and 334A has 45% of a thickness T of the quartz crystal resonator blank 3A.

Since the quartz crystal resonator blank 3A which has been patterned through the wet etching was used in the present simulation, the grooves 323A, 324A, 333A and 334A formed in vibrating arms 32A and 33A have shapes in which a surface of the quartz crystal is exposed as illustrated in FIG. 4. The first and second driving electrodes 84 and 85 and other wires are not formed in the quartz crystal resonator blank 3A used in the present simulation. In addition, it has been confirmed by the present inventors that, even if a dimension of each section is changed, there was little difference from the results of the present simulation (the same tendency was shown).

As illustrated in FIG. 9, the present simulation was performed by calculating the vibration leakage when the vibrating arms 32 and 33 were driven to vibrate at a driving frequency of 32.768 kHz in a state in which the quartz crystal resonator blank 3A was installed on the base at two locations including support arms 36A and 37A by using conductive adhesive materials 11A, 12A, 13A and 14A (here, the conductive adhesive materials 13A and 14A are not illustrated). A thickness T of the quartz crystal resonator blank 3A is any one of 50 μm to 210 μm (T=50 μm, 60 μm, 70 μm, 80 μm, 100 μm, 110 μm, 120 μm, 130 μm, 140 μm, 150 μm, 190 μm, and 210 μm), and a width W2 thereof is 20 μm to 260 μm (20 μm, 40 μm, 60 μm, 80 μm, 100 μm, 140 μm, 180 μm, 220 μm, and 260 μm).

As each of the conductive adhesive materials 11A to 14A, a bismaleimide adhesive material was assumed which has a thickness of 20 μm, a Young's modulus of 3.4 GPa, a Poisson's ratio of 0.33, and mass density of 4070 kg/m³. As the base, a ceramic base was assumed which has a Young's modulus of 320 GPa, a Poisson's ratio of 0.23, and mass density of 3800 kg/m³. The vibration leakage was calculated assuming that energy reaching rear surfaces of the conductive adhesive materials 11A to 14A leaked to the base.

It has been confirmed by the present inventors that, even if a driving frequency is changed (for example, even at a frequency of 32.768 kHz±1 kHz), there was little difference from results of the present simulation (the same tendency was shown).

FIGS. 10 to 14 illustrate results of the present simulation. FIGS. 10 to 13 are tables illustrating simulation results, and FIG. 14 is a graph in which numerical values illustrated in FIGS. 10 to 13 are plotted. A longitudinal axis of FIG. 14 expresses a Q value "$Q_{Leak}$" in which only the vibration leakage is taken into consideration, and a transverse axis thereof expresses W2/W1. It is shown that the greater the value of $Q_{Leak}$, the smaller the vibration leakage.

Next, FIG. 15 illustrates a graph obtained by plotting a "leakage difficulty index" in which a logarithm of each value of $Q_{Leak}$ is taken, and each plate thickness is normalized with the maximum value thereof as "1". A longitudinal axis of FIG. 15 expresses a leakage difficulty index, and a transverse axis thereof expresses W2/W1. It is shown that as the leakage difficulty index is closer to 1.0, the vibration leakage can be reduced. Here, if the leakage difficulty index is equal to or higher than 0.88, it is possible to provide the resonator element 2 in which the vibration leakage is sufficiently reduced.

It can be seen from FIGS. 11 to 13 and 15 that in a case of 50 µm≤T≤210 µm, the leakage difficulty index is equal to or higher than 0.88 in a range of 0.067≤W2/W1≤0.335. Therefore, as in the above-described pattern 1, if the relationship of 50 µm≤T≤210 µm is satisfied, and the relationship of 0.067≤W2/W1≤0.335 is satisfied, it is proven that it is possible to provide the quartz crystal resonator blank 3 (the resonator element 2) capable of more reliably reducing the vibration leakage. In the pattern 1, if the relationship of 110 µm≤T≤210 µm is also satisfied, it is possible to further achieve a reduction in a CI value and improvement of impact resistance in addition to the above-described effect. Specifically, if the relationship of 110 µm≤T≤210 µm is satisfied, a sufficient thickness of the quartz crystal resonator blank 3 can be secured, and thus it is possible to increase areas of the electrodes formed on the side surfaces 32c, 32d, 33c and 33d. For this reason, the vibrating arms 32 and 33 can be made to efficiently vibrate, and thus a CI value can be reduced. A sufficient thickness of the quartz crystal resonator blank 3 is secured, and thus impact resistance in the Z' axis direction can be increased.

In addition, it can be seen that in a case where the thickness T is 50 µm≤T≤100 µm the leakage difficulty index is equal to or higher than 0.88 in a range of 0.603≤W2/W1≤0.871. Therefore, as in the above-described pattern 2, if the relationship of 50 µm≤T≤100 µm is satisfied, and the relationship of 0.603≤W2/W1≤0.871 is satisfied, it is proven that it is possible to provide the quartz crystal resonator blank 3 (the resonator element 2) capable of more reliably reducing the vibration leakage. In the pattern 2, if the relationship of 50 µm≤T≤80 µm is also satisfied, it is possible to increase the leakage difficulty index to 0.94 or higher, and thus the above-described effect is more remarkably exhibited.

From the above description, if one of the patterns 1 and 2 is satisfied, it is possible to provide the resonator element 2 which can more reliably reduce the vibration leakage.

In the resonator element 2, if a relationship between the thickness T of the quartz crystal resonator blank 3, the width W1 of the base portion 31, and the width W2 of the connecting portion 35, illustrated in FIG. 7, has one of the following patterns 3 and 4, it is possible to provide the resonator element 2 which can reduce the vibration leakage and has excellent impact resistance.

Pattern 3

In the pattern 3, the thickness T satisfies a relationship of 110 µm≤T≤210 µm, and the widths W1 and W2 satisfy a relationship of 0.134≤W2/W1≤0.335.

Pattern 4

In the pattern 4, the thickness T satisfies a relationship of 150 µm≤T≤210 µm, and the widths W1 and W2 satisfy a relationship of 0.067≤W2/W1≤0.871.

Hereinafter, it will be proven that if one of the patterns 3 and 4 is satisfied, the resonator element 2 which can reduce the vibration leakage and has excellent impact resistance is obtained, on the basis of results of simulation performed by the present inventors. The quartz crystal resonator blank 3A which was used in the simulation of the patterns 1 and 2 was also used in the present simulation. In addition, it has been confirmed by the present inventors that, even if a dimension of each section is changed, there was little difference from the results of the present simulation (the same tendency was shown).

As illustrated in FIG. 16, the present simulation was performed in a state in which the quartz crystal resonator blank 3A was installed on the base at two locations including support arms 36A and 37A by using conductive adhesive materials 11A, 12A, 13A and 14A (here, the conductive adhesive materials 13A and 14A are not illustrated). A thickness T of the quartz crystal resonator blank 3A is any one of 50 µm to 210 µm (T=50 µm, 60 µm, 70 µm, 80 µm, 100 µm, 110 µm, 120 µm, 130 µm, 140 µm, 150 µm, 190 µm, and 210 µm), and a width W2 thereof is 20 µm to 260 µm (20 µm, 40 µm, 60 µm, 80 µm, 100 µm, 140 µm, 180 µm, 220 µm and 260 µm). As each of the conductive adhesive materials 11A to 14A, a bismaleimide adhesive material was assumed which has a thickness of 20 µm, a Young's modulus of 3.4 GPa, a Poisson's ratio of 0.33, and mass density of 4070 kg/m³. As the base, a ceramic base was assumed which has a Young's modulus of 320 GPa, a Poisson's ratio of 0.23, and mass density of 3800 kg/m³.

Simulation Regarding Impact Resistance

As illustrated in FIG. 16, the present simulation was performed by applying acceleration G of 1 G to the quartz crystal resonator blank 3A in the −Z' axis direction and by calculating first main stress F which is applied to a part (an end of the narrowest part of the connecting portion 35) indicated by a point P of FIG. 16 when the acceleration G is applied. The part indicated by the point P is a part on which the stress concentrates the most in the connecting portion 35A when the acceleration G is applied thereto. Also in a case where acceleration higher than 1 G is applied, the present inventor has confirmed that a magnitude relation of the first main stress F is not variable, and the case has the same tendency as in the results of the present simulation.

FIGS. 17 to 21 illustrate results of the present simulation. FIGS. 17 to 20 are tables illustrating simulation results, and FIG. 21 is a graph in which numerical values illustrated in FIGS. 17 to 20 are plotted. A longitudinal axis of FIG. 21 expresses a logarithm (log F) of the first main stress F and a transverse axis thereof expresses W2/W1. As can be seen from FIGS. 17 to 21, in all cases of the thickness T, as W2/W1 is closer to 1.0 (that is, a width of the connecting portion 35A is increased), the first main stress F which is applied to the point P tends to be reduced. In other words, as W2/W1 is closer to 1.0, the impact resistance (mechanical strength) of the quartz crystal resonator blank 3A tends to be improved. Next, FIG. 22 is a graph obtained by plotting an impact resistance index in which an inverse of each log F is taken and is normalized with the maximum value thereof as "1". A longitudinal axis of FIG. 22 expresses an impact resistance index, and a transverse axis thereof expresses W2/W1. FIG. 22 shows that as the impact resistance index is closer to 1.0, the impact resistance increases.

Simulation regarding Vibration Leakage

The present simulation was performed by calculating the vibration leakage when the vibrating arms 32 and 33 were driven to vibrate at a driving frequency of 32.768 kHz. The vibration leakage was calculated assuming that energy reaching rear surfaces of the conductive adhesive materials 11A to 14A leaked to the base. It has been confirmed by the present inventors that, even if a driving frequency is changed (for example, even at a frequency of 32.768 kHz±1 kHz), there was little difference from the results of the present simulation (the same tendency was shown).

FIGS. 23 to 27 illustrate results of the present simulation. FIGS. 23 to 26 are tables illustrating simulation results, and FIG. 27 is a graph in which numerical values illustrated in FIGS. 23 to 26 are plotted. A longitudinal axis of FIG. 27 expresses a Q value "$Q_{Leak}$" in which only the vibration leakage is taken into consideration, and a transverse axis thereof expresses W2/W1. It is shown that the greater the value of $Q_{Leak}$, the smaller the vibration leakage. Next, FIG. 28 illustrates a graph obtained by plotting a "leakage difficulty index" in which a logarithm of each value of $Q_{Leak}$ is taken, and each plate thickness is normalized with the maximum value thereof as "1". A longitudinal axis of FIG. 28 expresses a leakage difficulty index, and a transverse axis thereof expresses W2/W1. It is shown that as the leakage difficulty index is closer to 1.0, the vibration leakage can be reduced.

Integration of Simulation Results

Next, the results of the simulation regarding the impact resistance were combined with the results of the simulation regarding the vibration leakage. Specifically, for the quartz crystal resonator blank 3A under the same condition (that is, the same plate thickness T, and the same constricted width ratio W2/W1), a high performance index was obtained by multiplying the impact resistance index by the leakage difficulty index. In other words, [high performance index]= [impact resistance index]×[leakage difficulty index]. This result is illustrated in FIGS. 29 to 33. FIGS. 29 to 32 are tables showing results of the multiplication, and FIG. 33 is a graph in which numerical values illustrated in FIGS. 29 to 32 are plotted. Next, FIG. 34 is a graph obtained by plotting a normalized high performance index in which each high performance index is normalized with the maximum value thereof as "1". A longitudinal axis of FIG. 34 expresses a normalized high performance index, and a transverse axis thereof expresses W2/W1. FIG. 34 shows that as the normalized high performance indexes become closer to 1.0, the vibration leakage is reduced and thus the impact resistance is also excellent. Here, if the normalized high performance index is equal to or higher than 0.9, it is possible to provide the resonator element 2 which can sufficiently reduce the vibration leakage and has the sufficiently excellent impact resistance.

It can be seen from FIGS. 29 to 32 and 34 that in a case of 110 µm≤T≤210 µm, the normalized high performance index is equal to or higher than 0.9 in a range of 0.134≤W2/W1≤0.335. Therefore, as in the above-described pattern 3, if the relationship of 110 µm≤T≤210 µm is satisfied, and the relationship of 0.134≤W2/W1≤0.335 is satisfied, it is proven that it is possible to provide the quartz crystal resonator blank 3 (the resonator element 2) which can sufficiently reduce the vibration leakage and has sufficiently excellent impact resistance. There is a case where the normalized high performance index exceeds 0.9 even at the thickness T of below 110 µm, but there is a case where, at the thickness T of below 110 µm, heights (areas) of the electrodes (the first and second driving electrodes 84 and 85) formed on the side surfaces of the vibrating arms 32 and 33 cannot be increased, and a CI value cannot also be reduced. For this reason, in the pattern 3, when the thickness T is equal to or greater than 110 µm, it is possible to provide the resonator element 2 which can effectively achieve a reduction in a CI value in addition to the above-described effects, and has a more excellent vibration characteristic. Conversely, there is a case where the normalized high performance index exceeds 0.9 even at the thickness T of above 210 µm, but, if the thickness T exceeds 210 µm, it is hard to create a micro-pattern by using wet etching and thus a size of the quartz crystal resonator blank 3 (resonator element 2) is excessively increased. For this reason, in the pattern 3, when the thickness T is equal to or smaller than 210 µm, the above-described effect is exhibited, and a size of the resonator element 2 is prevented from being excessively increased.

It can be seen from FIGS. 29 to 32 and 34 that in a case of 150 µm≤T≤210 µm, the normalized high performance index is equal to or higher than 0.9 in a range of 0.067≤W2/W1≤0.871. Therefore, as in the above-described pattern 4, if the relationship of 150 µm≤T≤210 µm is satisfied, and the relationship of 0.067≤W2/W1≤0.871 is satisfied, it is proven that it is possible to provide the quartz crystal resonator blank 3 (the resonator element 2) which can sufficiently reduce the vibration leakage and has sufficiently excellent impact resistance. There is a case where the normalized high performance index exceeds 0.9 even at the thickness T of below 150 µm, but when the thickness T is equal to or greater than 150 µm, it is possible to more effectively achieve a reduction in a CI value than in the pattern 3. The reason why the thickness T is made equal to or smaller than 210 µm is the same as the reason described for the pattern 3.

From the above description, if one of the patterns 3 and 4 is satisfied, it is possible to provide the resonator element 2 which can sufficiently reduce the vibration leakage and has sufficiently excellent impact resistance.

Second Embodiment

Figure 35:
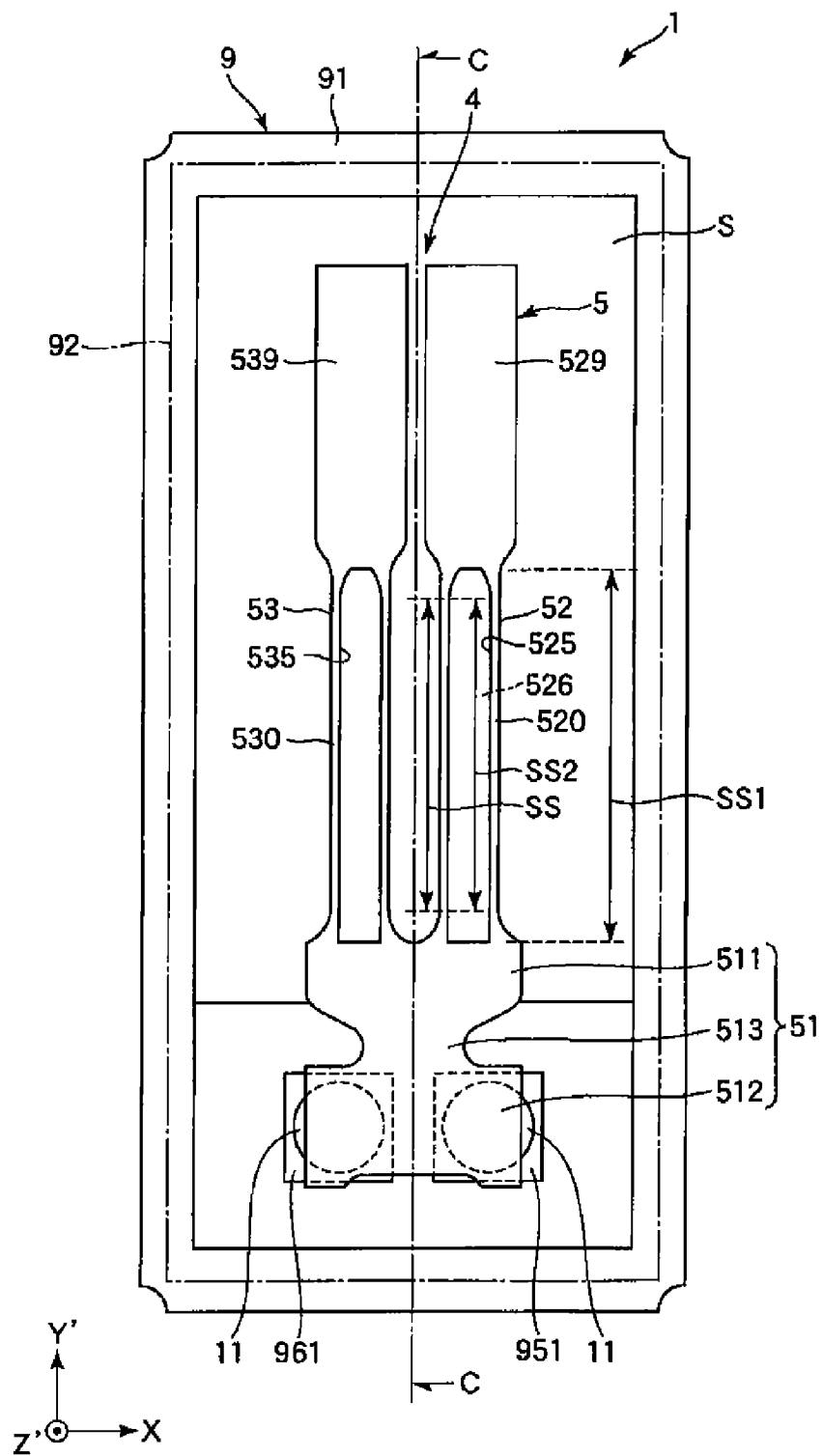
FIG. 35 is a plan view of a resonator according to a second embodiment of the invention.
Figure 36:
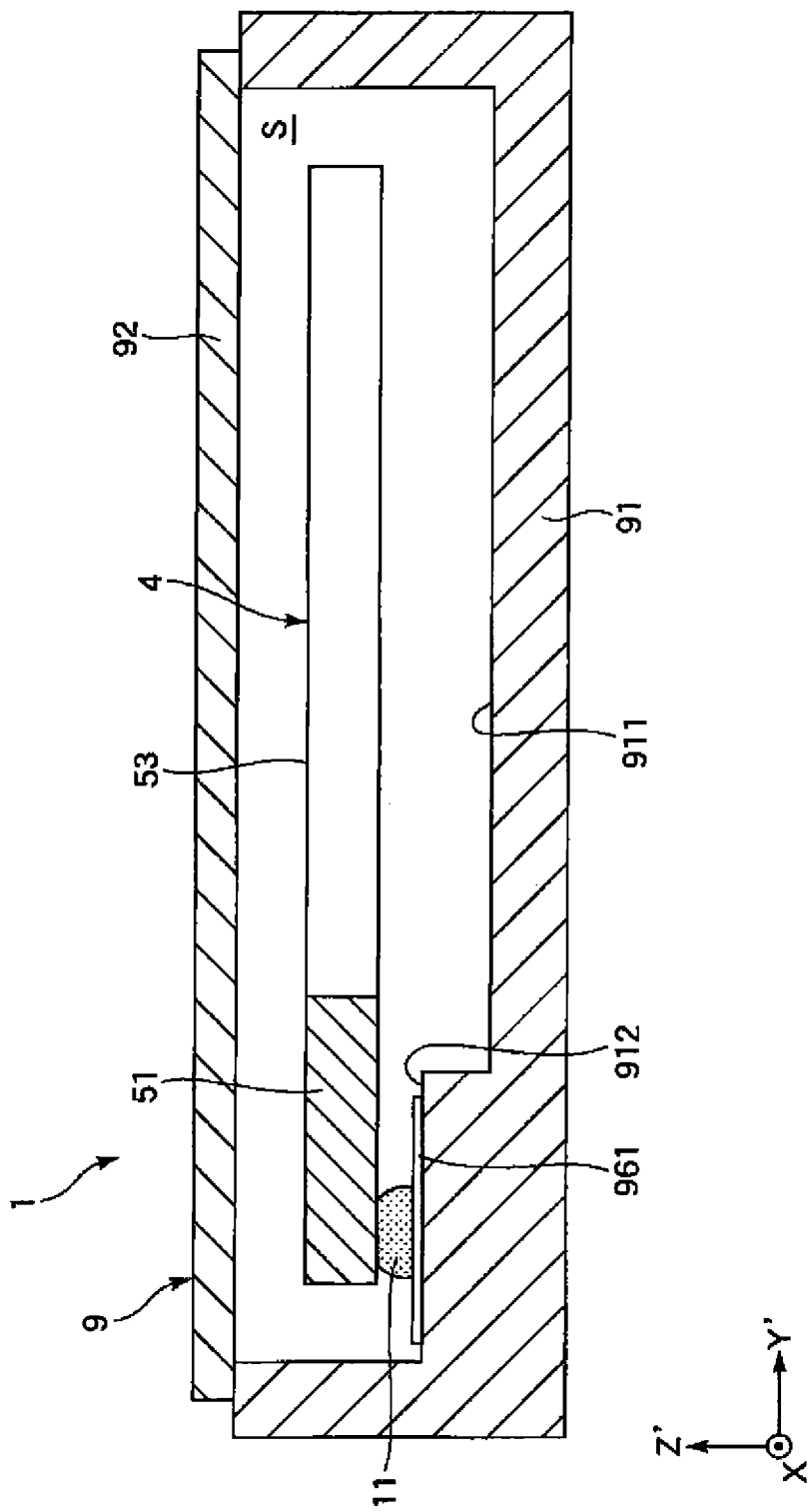
FIG. 36 is a cross-sectional view taken along the line C-C of FIG. 35.
Figure 37:
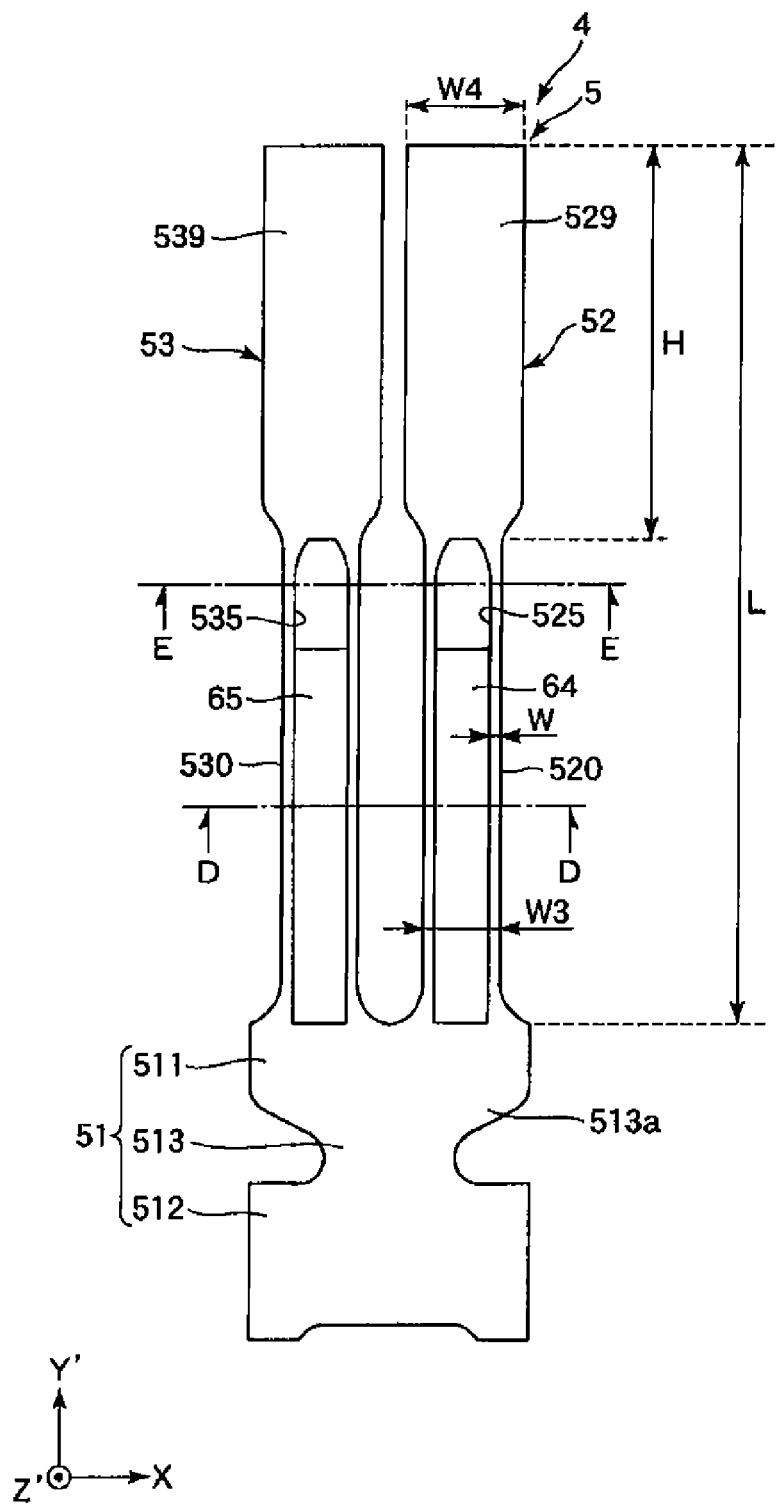
FIG. 37 is a plan view of a resonator element included in the resonator illustrated in FIG. 35.
Figure 38A:
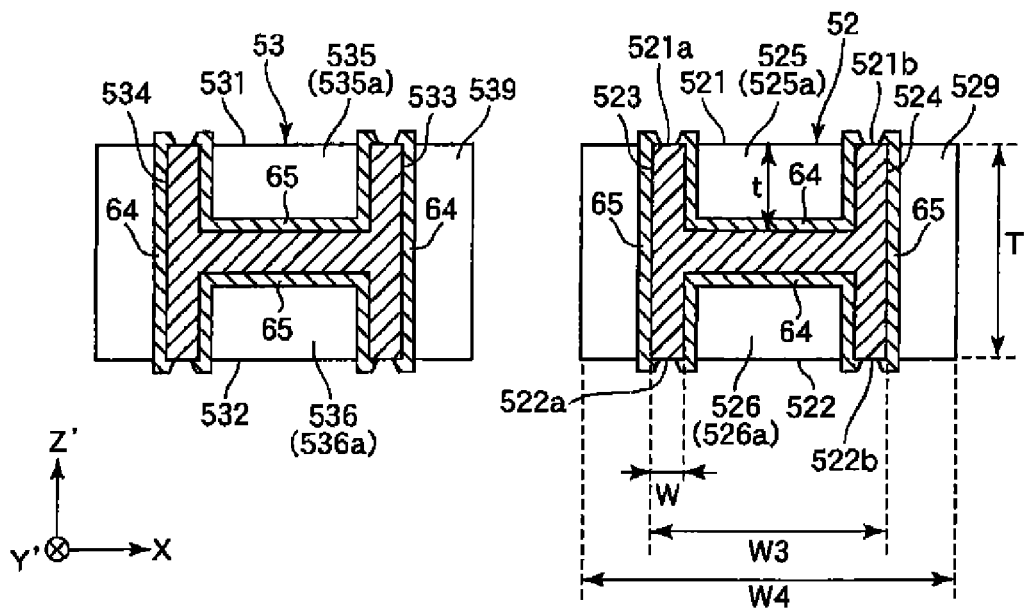
FIG. 38A is a cross-sectional view taken along the line D-D of FIG. 37.
Figure 38B:
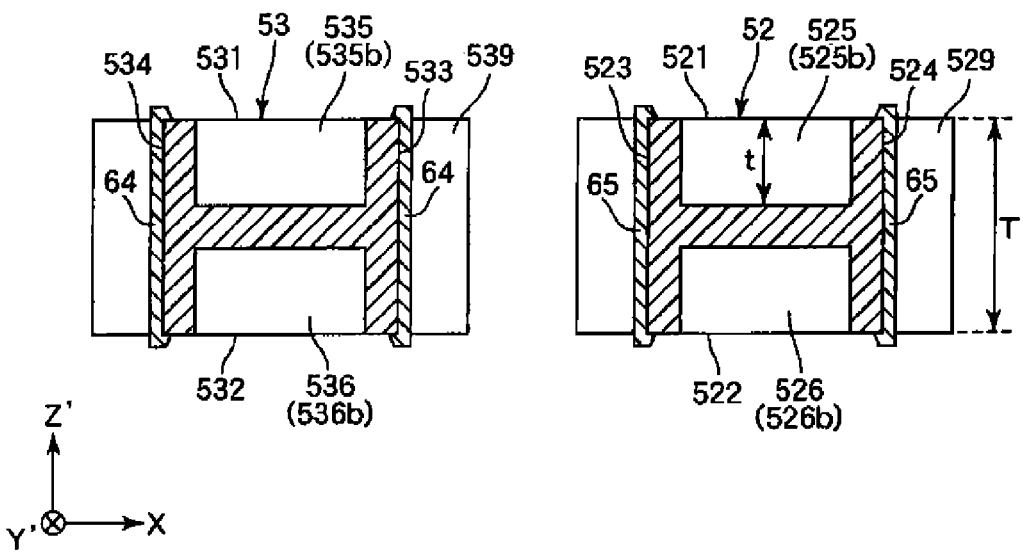
FIG. 38B is a cross-sectional view taken along the line E-E of FIG. 37.
Figure 39:
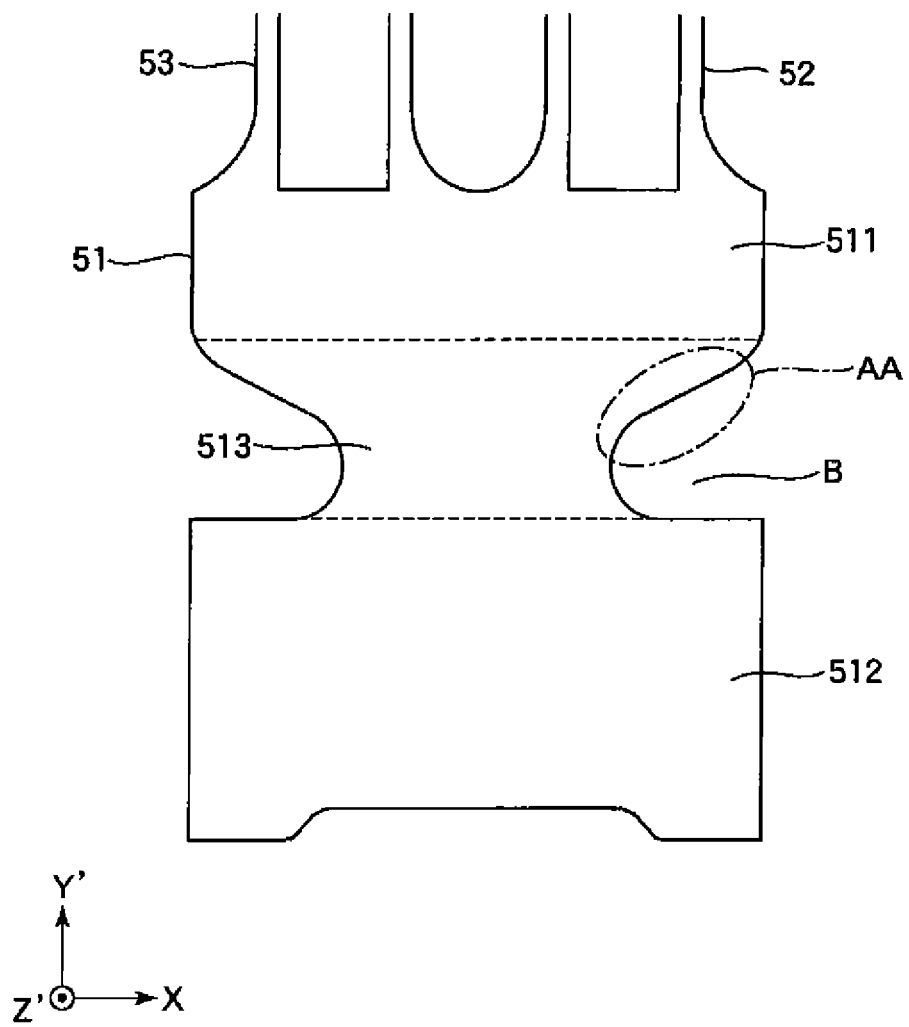
FIG. 39 is a partially enlarged plan view illustrating a base portion of the resonator element illustrated in FIG. 37.

FIG. 35 is a plan view of a resonator according to a second embodiment of the invention. FIG. 36 is a cross-sectional view taken along the line C-C of FIG. 35. FIG. 37 is a plan view of a resonator element included in the resonator illustrated in FIG. 35. FIG. 38A is a cross-sectional view taken along the line D-D of FIG. 37. FIG. 38B is a cross-sectional view taken along the line E-E of FIG. 37. FIG. 39 is a partially enlarged plan view illustrating a base portion of the resonator element illustrated in FIG. 37.

Hereinafter, the second embodiment will be described focusing on a difference from the above-described embodiment, and description of the same content will be omitted.

The second embodiment is the same as the first embodiment except for a difference in a configuration of a resonator element.

As illustrated in FIGS. 35 and 36, a resonator 1 includes a resonator element 4 and a package 9 which stores the resonator element 4 therein. Hereinafter, the resonator element 4 and the package 9 will be sequentially described in detail.

Resonator Element

As illustrated in FIGS. 37, 38A and 38B, the resonator element 4 includes a quartz crystal substrate 5, and a first driving electrode 64 and a second driving electrode 65 formed on the quartz crystal substrate 5. In FIG. 37, for convenience of description, parts of the first driving electrode 64 and the second driving electrode 65 are not illustrated.

The quartz crystal substrate 5 is made of a quartz crystal. The quartz crystal substrate 5 is a so-called Z-cut Quartz crystal plate in which when, in an orthogonal coordinate system which has the electrical axis which is a crystal axis of the quartz crystal as an X axis, the mechanical axis thereof as a Y axis, and the optical axis thereof as a Z axis, an axis which is tilted by a predetermined angle (for example, below) 15° so that a +Z side of the Z axis is rotated in a −Y direction of the Y axis with the X axis as a rotation axis is set to a Z' axis, and an axis which is tilted by a predetermined angle (for example, below 15°) so that a+Y side of the Y axis is rotated in a +Z direction of the Z axis is set to a Y' axis. The quartz crystal substrate 5 has a plane including the X axis and the Y' axis as a main surface, and a thickness in a direction along the Z' axis. In the quartz crystal substrate 5 with this configuration, an axis in a longitudinal direction of the quartz crystal substrate 5 may be set to a Y' axis, an axis in a transverse direction may be set to an X axis, and an axis in a thickness direction may be set to a Z' axis. In the present embodiment, an upper surface of the quartz crystal substrate 5 is a +Z' surface of the quartz crystal, and a lower surface thereof is a −Z' surface of the quartz crystal.

The Y' axis and the Z' axis may respectively match the Y axis and the Z axis (that is, the predetermined angle may be 0°). A quartz crystal substrate used in the embodiment of the invention is not limited to a Z-cut quartz crystal plate, and, for example, an AT-cut, BT-cut, ST-cut, CT-cut, DT-cut, GT-cut or SC-cut quartz crystal plate, or the like may be widely used.

As illustrated in FIGS. 35 and 37, the quartz crystal substrate 5 includes a base portion 51 and a pair of (two) vibrating arms 52 and 53, so as to be formed of, a so-called "tuning fork type". The base portion 51 and the vibrating arms 52 and 53 are integrally formed with each other. The resonator element 4 including the quartz crystal substrate 5 with this configuration flexurally vibrates in an in-surface direction (XY' plane direction) at a predetermined frequency so that the pair of vibrating arms 52 and 53 repeatedly come close to or separate from each other. A resonance frequency is, for example, equal to or higher than 31.768 kHz and equal to or lower than 33.768 kHz.

The base portion 51 extends on the XY' plane which is a plane parallel to the X axis and the Y' axis, and has a plate shape which has the Z' axis direction as a thickness direction. In a plan view (hereinafter, simply referred to as a "plan view") which is viewed from the Z axis direction, the base portion 51 has a shape in which the middle section of the base portion 51 in the Y' axis direction is narrow. In other words, as illustrated in FIGS. 35 and 37, the base portion 51 includes a first base section 511 from which the vibrating arms 52 and 53 extend, a second base section 512 which is provided on an opposite side to the vibrating arms 52 and 53 with respect to the first base section 511, and a connecting section 513 which connects the first base section 511 to the second base section 512. In FIG. 39, a boundary between the first base section 511 and the connecting section 513 and a boundary between the second base section 512 and the connecting section 513 are respectively indicated by dashed lines.

Here, an outer edge of the connecting section 513 in the X axis direction is formed as a notch B having a constricted shape in which a width thereof in the X axis direction gradually becomes smaller than that of the first base section 511. In other words, the connecting section 513 has a narrow part 513a of which a width in the X axis direction continuously decreases from the end on the first base section 511 side toward the second base section 512 side. Consequently, it is possible to effectively reduce deformation of the first base section 511 due to flexural vibration in which the pair of vibrating arms 52 and 53 come close to or separate from each other in the same surface. As a result, even if a length of the first base section 511 in the Y axis direction is made to be shortened, it is possible to reduce deformation of the first base section 511 due to flexural vibration in which the pair of vibrating arms 52 and 53 come close to or separate from each other substantially in the surface, and thus to reduce vibration leakage outward from the base portion 51.

As illustrated in FIG. 39, in the outer edge of the connecting section 513 in the X axis direction, the outer edge of a region AA surrounded by the ellipse, that is, one end of the notch B on the first base section 511 side and the outer edge close to the center of the connecting section 513 are formed of a continuous line which does not include a corner. Therefore, since there is no corner in which a linkage between a curved line and a straight line causes discontinuity of a curvature, a location on which stress easily concentrates is removed, and thus it is possible to sufficiently increase impact resistance.

Hereinafter, with reference to FIGS. 40A to 41D, an action of the narrow part 513a will be described in detail.

Figure 40A:
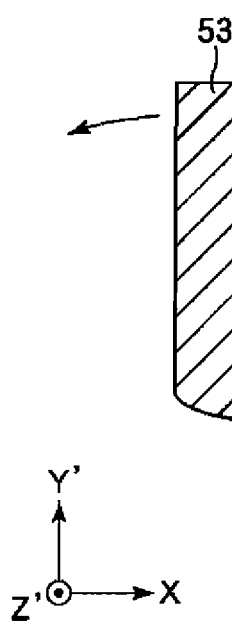
FIG. 40A is a plan view (a view in which a narrow section is taken into consideration) schematically illustrating the resonator element illustrated in FIG. 37.
Figure 40B:
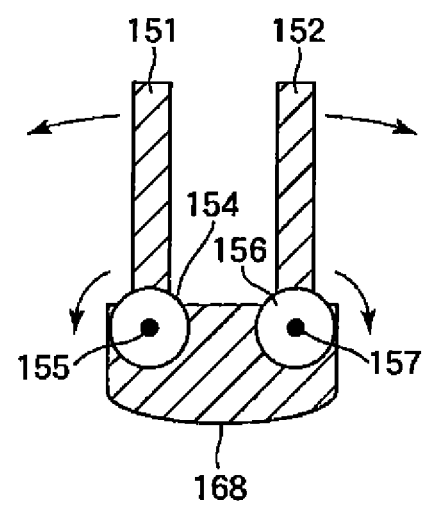
FIG. 40B is a plan view illustrating a simplified model of the resonator element illustrated in FIG. 40A.

FIG. 40A is a plan view schematically illustrating the resonator element illustrated in FIG. 37 (a view in which the narrow part is taken into consideration), and FIG. 40B is a plan view illustrating a simplified model of the resonator element illustrated in FIG. 40A. FIGS. 41A to 41D are plan views for explaining a principle of minimizing the vibration leakage of the resonator element illustrated in FIGS. 40A and 403 and are views for explaining actions of respective sections (first to fourth connecting sections) of the base portion.

In the outer edge of the connecting section 513 in the X axis direction, the outer edge of the narrow part 513a on the first base section 511 side has an effect of reducing deformation which occurs between the first base section 511 and the region of the connecting section 513 on the first base section 511 side due to the flexural vibration of the vibrating arms.

FIG. 40A illustrates a case where the narrow part 513a is formed on an opposite side to a distal end direction of the vibrating arms 52 and 53. As illustrated in FIG. 40B, this may be regarded as a case where a connection between a rotation body 154 which is a pseudo-rigid body having a predetermined radius R with a rotation axis 155 as rotation center and an elastic rod 151 is linked to a connection between a rotation body 156 which is a pseudo-rigid body having a predetermined radius R with a rotation axis 157 as rotation center and an elastic rod 152, via a simplified base portion 168.

As illustrated in FIGS. 41A to 41D, as a representative connecting section of the simplified base portion 168, a first connecting section 158 which is provided further toward the elastic rods 151 and 152 side than the rotation axes 155 and 157, a second connecting section 159 which is provided between the rotation axes 155 and 157, a third connecting section 160 which is provided further toward an opposite side to the electric rods than the rotation axes 155 and 157, and a fourth connecting section 169 which is provided further toward an opposite side to distal ends of the elastic rods than the third connecting section 160, are considered.

A case where the two vibrating arms 52 and 53 flexurally vibrate to separate from each other is regarded as a case where the elastic rods 151 and 152 flexurally vibrate to separate from each other, but, in this case, a vortex of the displacement vector is formed at a predetermined location from the vicinities of roots of the vibrating arms 52 and 53 in a direction opposite to the distal end direction of the vibrating arms. A center of the vortex is located in the vicinities of the roots of the vibrating arms 52 and 53 including the base portion 51 for the most parts, but may be formed in a virtual region which is not included in regions of the vibrating arms 52 and 53 or the base portion 51.

Herein, for convenience of description, it is assumed that the center of the vortex is included in the region of the base portion 51, distances from the elastic rods 151 and 152 are the same as each other, and the center of the vortex is set to the rotation axes 155 and 157 in FIG. 40B. When the rotation axes 155 and 157 are set as rotation centers, tangential displacements of outer circumferences of the rotation bodies 154 and 156 which are pseudo-rigid bodies with the radius R are greatest on the distal end side of the elastic rods 151 and 152, and are smallest on an opposite direction side to the distal end direction of the elastic rods 151 and 152.

Figure 41A:
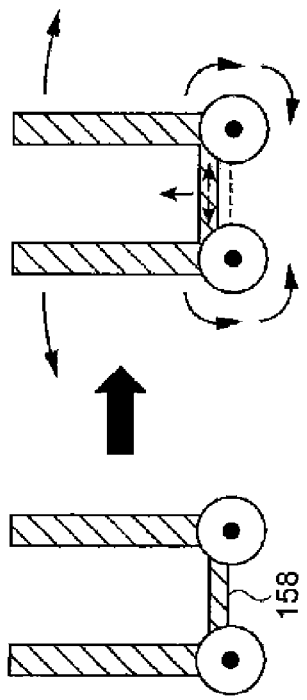
FIGS. 41A to 41D are plan views for explaining a principle of minimizing the vibration leakage of the resonator element illustrated in FIGS. 40A and 40B and are views for explaining actions of respective sections (first to fourth connecting sections) of the base portion.

In FIG. 41A, the representative first connecting section 158 of the simplified base portion 168 is greatly expanded due to rotation movements of the rotation bodies 154 and 156 which are pseudo-rigid bodies and is slightly moved in the distal end direction of the elastic rods 151 and 152.

Figure 41B:
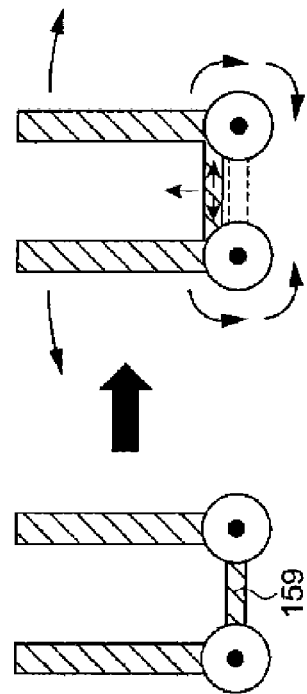

In FIG. 41B, similarly, the representative second connecting section 159 of the simplified base portion 168 is greatly expanded due to rotation movements of the rotation bodies 154 and 156 which are pseudo-rigid bodies and is slightly moved in the distal end direction of the elastic rods 151 and 152.

Figure 41C:
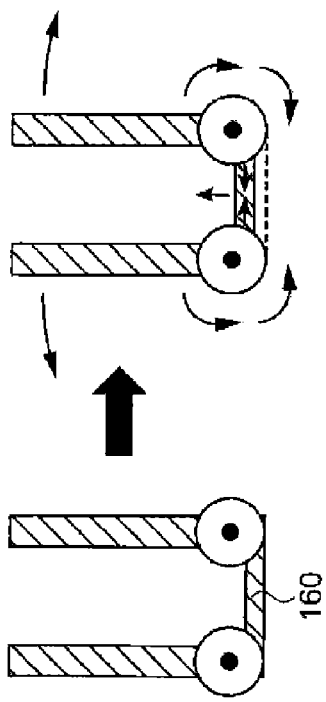

In FIG. 41C, the representative third connecting section 160 of the simplified base portion 168 is contracted due to rotation movements of the rotation bodies 154 and 156 which are pseudo-rigid bodies and is moved in the distal end direction of the elastic rods 151 and 152, but, at this time, a central periphery of the third connecting section 160 in the length direction has a latent force so as to be deformed in the distal end direction of the elastic rods 151 and 152 or in an opposite direction to the distal end direction of the elastic rods 151 and 152.

Figure 41D:
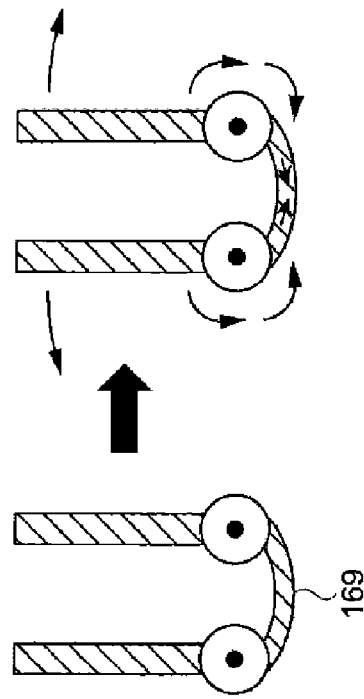

In FIG. 41D, the representative fourth connecting section 169 of the simplified base portion 168 is contracted due to rotation movements of the rotation bodies 154 and 156 which are pseudo-rigid bodies but has an arch shape and is thus hardly deformed. In addition, in a case where the fourth connecting section 169 is deformed, the fourth connecting section 169 is deformed so that a central periphery thereof in the length direction is displaced in an opposite direction to the distal end direction of the elastic rods 151 and 152.

Therefore, an action, which causes deformation such as contraction or expansion and cancels out a vibration displacement, works in a direction connecting the rotation axes 155 and 157 to each other, in the representative first, second, third and fourth connecting sections 158, 159, 160 and 169 of the simplified base portion 168, due to the separation movements of the elastic rods 151 and 152. In addition, the difficulty of a displacement of the fourth connecting section 169 inhibits the first, second and third connecting sections 158, 159 and 160 from being displaced in the distal end direction of the elastic rods 151 and 152, and also the central periphery of the fourth connecting section 169 is deformed to be displaced in the opposite direction to the distal end direction of the elastic rods 151 and 152, thereby canceling out the displacements of the first, second and third connecting sections 158, 159 and 160.

As a result, in a case where a fixed member is formed at the simplified base portion 168, that is, the fixed member is formed at the base portion 168, energy which leaks outward via the fixed member is reduced. Therefore, the vibration leakage can be reduced, and thus it is possible to minimize a reduction in a Q value.

As illustrated in FIG. 37, the vibrating arms 52 and 53 are arranged in the X axis direction and extend in the +Y' axis direction from the distal end of the base portion 51 so as to be parallel to each other. In addition, each of the vibrating arms 52 and 53 is rectangular, and the basal end thereof is a fixed end, and the distal end is a free end.

The vibrating arms 52 and 53 respectively have arm sections 520 and 530, and hammer heads 529 and 539 as weight sections provided at the distal ends of the arm sections 520 and 530. The hammer heads 529 and 539 have widths (lengths in the X axis direction) than those of the arm sections 520 and 530, and protrude toward both sides in the X axis direction from the arm sections 520 and 530. The vibrating arms 52 and 53 have the same configuration (a shape and a size) as each other.

Since the hammer heads 529 and 539 are provided, it is possible to increase the mass of the distal ends of the vibrating arms 52 and 53 while minimizing the entire length of the vibrating arms 52 and 53. Since the entire length of the vibrating arms 52 and 53 can be minimized, that is, the length L of the vibrating arms 52 and 53 can be reduced, it is possible to reduce a displacement amount of the distal end sections of the vibrating arms 52 and 53 which are displaced due to the flexural vibration of the vibrating arms 52 and 53 in the surface, and thus to lower a vibration speed. In other words, since the hammer heads 529 and 539 are provided, in a case where vibration is performed at a predetermined frequency (for example, 32.768 kHz), a vibration speed can be made lower than that in a case where the hammer heads 529 and 539 are not provided. As mentioned above, since a vibration speed can be lowered, air resistance applied to the resonator element 4 can be reduced, and thus it is possible to further reduce deterioration in a Q value.

Since the hammer heads 529 and 539 are provided, it is possible to miniaturize the resonator element 4 and thus to miniaturize the resonator 1. In a case where the entire length of the vibrating arms 52 and 53 is made constant, a resonance frequency of the flexural vibration which is reduced due to the hammer heads 529 and 539 being provided at the distal ends of the vibrating arms 52 and 53 can be maintained to be the same as a resonance frequency in a case where the hammer heads 529 and 539 are not provided by increasing the width (a length in the X axis direction) of each of the arm sections 520 and 530. Therefore, a since a path is lengthened through which heat generated from the arm sections 520 and 530 during the flexural vibration flows in the X axis direction of the arm sections 520 and 530, as described above, a thermoelastic loss in a heat insulation region is reduced, and thus it is possible to improve a Q value, thereby reducing a CI value.

A weight material for adjusting a frequency may be formed on at least one of front and rear main surfaces of each of the hammer heads 529 and 539.

As illustrated in FIGS. 38A and 38B, the vibrating arm 52 has a pair of main surfaces 521 and 522 which are formed of the XY' plane and are front and rear surfaces with respect to each other, and a pair of side surfaces 523 and 524 which are formed of the Y'Z' plane and connect the pair of main surfaces 521 and 522 to each other. In addition, the vibrating arm 52 has a bottomed groove 525 (groove section) which is open to the main surface 521, and a bottomed groove 526 (groove section) which is open to the main surface 522. Each of the grooves 525 and 526 extends in the Y' axis direction. The vibrating arm 52 has a substantially H cross-sectional shape at the locations where the grooves 525 and 526 are formed.

In the same manner as the vibrating arm 52, the vibrating arm 53 has a pair of main surfaces 531 and 532 which are formed of the XY' plane and are front and rear surfaces with respect to each other, and a pair of side surfaces 533 and 534 which are formed of the Y'Z' plane and connect the pair of main surfaces 531 and 532 to each other. In addition, the vibrating arm 53 has a bottomed groove 535 (groove section) which is open to the main surface 531, and a bottomed groove 536 (groove section) which is open to the main surface 532. Each of the grooves 535 and 536 extends in the Y' axis direction. The vibrating arm 53 has a substantially H cross-sectional shape at the locations where the grooves 535 and 536 are formed.

As mentioned above, the grooves 525, 526, 535 and 536 are formed in the vibrating arms 52 and 53, and thus it is possible to reduce a thermoelastic loss in the same manner as in the above-described first embodiment.

As illustrated in FIGS. 38A and 38B, the grooves 525 and 526 are preferably formed to be symmetric (vertically symmetric) with respect to a line segment which equally divides the length of the vibrating arm 52 in the thickness direction into two sections. Similarly, the grooves 535 and 536 are preferably formed to be symmetric (vertically symmetric) with respect to a line segment which equally divides the length of the vibrating arm 53 in the thickness direction into two sections. Consequently, it is possible to reduce unnecessary vibration of the vibrating arms 52 and 53, and thus it is possible to make the vibrating arms 52 and 53 effectively vibrate in an in-surface direction (XY' plane direction) of the quartz crystal substrate 5.

As described above, in the present embodiment, the grooves 525 and 526 are provided on both of the pair of main surfaces 521 and 522, but the groove may be provided on one of the pair of main surfaces 521 and 522, and may be omitted. This is also the same for the grooves 535 and 536 of the vibrating arm 53.

As illustrated in FIGS. 38A and 38B, the vibrating arm 52 is provided with a pair of first driving electrodes 64 and a pair of second driving electrodes 65. Specifically, one of the first driving electrodes 64 is formed on the inner surface of the groove 525, and the other first driving electrode 64 is formed on the groove 526. One of the second driving electrodes 65 is formed on the side surface 523, and the other second driving electrode 65 is formed on the side surface 524.

Similarly, the vibrating arm 53 is also provided with a pair of first driving electrodes 64 and a pair of second driving electrodes 65. Specifically, one of the first driving electrodes 64 is formed on the side surface 533, and the other first driving electrode 64 is formed on the side surface 534. One of the second driving electrodes 65 is formed on an inner surface of the groove 535, and the other second driving electrode 65 is formed on an inner surface of the groove 536.

If alternating voltages are applied to the first and second driving electrodes 64 and 65, the vibrating arms 52 and 53 vibrate in the in-surface direction (XY' plane direction) at a predetermined frequency so as to repeatedly come close to or separate from each other.

A material forming each of the first and second driving electrodes 64 and 65 is not particularly limited, but each of the first and second driving electrodes 64 and 65 may be made of a metal material such as gold (Au), a gold alloy, platinum (Pt), aluminum (Al), an aluminum alloy, silver (Ag), a silver alloy, chromium (Cr), a chrome alloy, nickel (Ni), copper (Cu), molybdenum (Mo), niobium (Nb), tungsten (W), iron (Fe), titanium (Ti), cobalt (Co), zinc (Zn), or zirconium (Zr), or a conductive material such as an indium tin oxide (ITO).

As illustrated in FIGS. 38A and 38B, the groove 525 has an electrode formation region 525a in which the first driving electrode 64 is provided, and an electrode non-formation region 525b which is located on an opposite side to the base portion 51 with respect to the electrode formation region 525a and in which the first driving electrode 64 is not provided. Similarly, the groove 526 has an electrode formation region 526a and an electrode non-formation region 526b; the groove 535 has an electrode formation region 535a and an electrode non-formation region 535b; and the groove 536 has an electrode formation region 536a and an electrode non-formation region 536b. As a result of the electrode non-formation regions 525b, 526b, 535b and 536b being formed, it is possible to reduce the occurrence of vibration (harmonics) in a higher order mode and also to generate vibration (fundamental mode) in a main mode in which an equivalent series capacitor C1 is reduced. In the above-described manner, since an equivalent series resistance value in the higher order mode can be made greater than an equivalent series resistance value in the main mode, it is possible to reduce a concern that an oscillation circuit equipped with the resonator element 4 oscillates at a resonance frequency in the higher order mode and also to prevent an increase in a change of an oscillation frequency relative to a change of load capacitance.

The above description relates to the resonator element 4. The thickness T (thicknesses of the base portion 51 and the vibrating arms 52 and 53) of the quartz crystal substrate 5 is not particularly limited but is preferably smaller than 70 μm. In this numerical value range, for example, in a case where the quartz crystal substrate 5 is formed (patterned) through wet etching, it is possible to effectively prevent an unnecessary portion (which is to be originally removed) from remaining at a boundary between the vibrating arm 52 and the base portion 51 or a boundary between an arm section 520 described later and the hammer head 529. For this reason, it is possible to provide the resonator element 4 which can effectively reduce the vibration leakage. From another viewpoint, the thickness T is preferably equal to or greater than 70 μm and equal to or smaller than 300 μm, and is more preferably equal to or greater than 100 μm and equal to or smaller than 150 μm. In this numerical value range, the first and second driving electrodes 64 and 65 can be widely formed on the side surfaces of the quartz crystal substrate 5, and thus it is possible to achieve miniaturization and a reduction in a CI value.

In the resonator element 4, a range of f/fm>1 is satisfied at fm=πk/(2πCpa$^2$), and the grooves 525, 526, 535 and 536 are formed in the vibrating arms 52 and 53. Therefore, a Q value higher than that in the related art can be obtained. Hereinafter, configurations of the grooves 525, 526, 535 and 536 formed in the vibrating arms 52 and 53 will be described in detail. Since the vibrating arms 52 and 53 have the same configuration as each other, hereinafter, the grooves 525 and 526 formed in the vibrating arm 52 will be described as a representative, and description of the grooves 535 and 536 formed in the vibrating arm 53 will be omitted.

As illustrated in FIGS. 38A and 38B, in the resonator element 4, widths (lengths in the X axis direction) of banks (main surfaces arranged with the groove 525 interposed therebetween in the width direction perpendicular to the longitudinal direction of the vibrating arm 52) 521a and 521b located on both sides of the groove 525 of the main surface 521 in the X axis direction are substantially the same as each other. When the width of each of the banks 521a and 521b is set to W, a thickness (a length in the Z' axis direction) of the vibrating arm 52 is set to T, a total of the maximum depths t of the grooves 525 and 526 is set to ta (=2t), and ta/T is set to η, a relationship expressed in the following Expression (5) is satisfied.

$$4.236 \times 10 \times \eta^2 - 8.473 \times 10 \times \eta + 4.414 \times 10 \leq W \leq -3.367 \times 10 \times \eta^2 + 7.112 \times 10 \times \eta - 2.352 \times 10 \ [\mu m] \qquad (5)$$

where, $0.75 \leq \eta < 1.00$

In addition, widths of banks (sections) 522a and 522b located on both sides of the groove 526 of the main surface 522 in the X axis direction also satisfy the same relationship.

A region SS satisfying Expression (5) is present in at least part of the vibrating arm 52, and thus it is possible to provide the resonator element 4 which exhibits a more excellent vibration characteristic than in the related art. The region SS satisfying Expression (5) may be present in part of the vibrating arm 52 in the longitudinal direction, but is preferably present so as to include a basal end section of the vibrating arm 52. The basal end section is notably flexurally deformed in the vibrating arm 52 and easily influences a vibration characteristic of the entire vibrating arm 52. For this reason, if the region SS is present so as to include at least the basal end section, it is possible to provide the resonator element 4 which more reliably and effectively exhibits a more excellent vibration characteristic than in the related art. In other words, when the region SS is present in at least a location where a flexural deformation amount of the vibrating arm 52 is the maximum, it is possible to provide the resonator element 4 which more reliably and effectively exhibits a more excellent vibration characteristic than in the related art. More specifically, it can be said that the region SS is preferably present so as to include 30% of a length of the arm section 520 from the basal end of the arm section 520 to the distal end thereof.

As illustrated in FIG. 35, in the resonator element of the present embodiment, the arm section 520 has substantially constant width and thickness in the almost entire region (region SS1) excluding both ends in the extension direction thereof, and the grooves 525 and 526 have substantially constant widths and thicknesses in the entire region (region SS2). In the resonator element 4, a region in which these regions SS1 and SS2 overlap each other forms the region SS, and thus the region SS can be made present so as to be lengthened in the longitudinal direction of the vibrating arm 52. Therefore, the above-described effects can be more remarkably exhibited.

When a Q value in which only a thermoelastic loss is taken into consideration is set to $Q_{TED}$, the above Expression (5) is a condition in which $Q_{TED}$ is greater than a predetermined value.

Hereinafter, normalized $Q_{TED}$ will be described. $Q_{TED}$ is normalized with $Q_{TED}$ expected when η endlessly approaches 1 as 1. In other words, if $Q_{TED}$ expected when η endlessly approaches 1 is set as $Q_{TED}$ (η=1), unnormalized $Q_{TED}$ is set as $Q_{TED}$b, and normalized $Q_{TED}$ is set as $Q_{TED}$a, $Q_{TED}$a is represented by $Q_{TED}$b/$Q_{TED}$ (η=1).

First, the above Expression (5) corresponds to a condition satisfying $Q_{TED}$a≥0.65. Conditions satisfying $Q_{TED}$a≥0.70, $Q_{TED}$a≥0.75, $Q_{TED}$a≥0.80, and $Q_{TED}$a≥0.85 are respectively as follows.

$Q_{TED}$a≥0.70

A condition satisfying $Q_{TED}$a≥0.70 satisfies a relationship expressed in the following Expression (6).

$$5.459\times10\times\eta^2-1.110\times10^2\times\eta+5.859\times10 \leq W \leq -4.500\times10\times\eta^2+9.490\times10\times\eta-3.698\times10 \text{ [μm]} \qquad (6)$$

where, 0.80≤η<1.00

$Q_{TED}$a≥0.75

A condition satisfying $Q_{TED}$a≥0.75 satisfies a relationship expressed in the following Expression (7).

$$6.675\times10\times\eta^2-1.380\times10^2\times\eta+7.392\times10 \leq W \leq -5.805\times10\times\eta^2+1.228\times10^2\times\eta-5.267\times10 \text{ [μm]} \qquad (7)$$

where, 0.85≤η<1.00

$Q_{TED}$a≥0.80

A condition satisfying $Q_{TED}$a≥0.80 satisfies a relationship expressed in the following Expression (8).

$$7.752\times10\times\eta^2-1.634\times10^2\times\eta+8.903\times10 \leq W \leq -6.993\times10\times\eta^2+1.496\times10^2\times\eta-6.844\times10 \text{ [μm]} \qquad (8)$$

where, 0.90≤η<1.00

$Q_{TED}$a≥0.85

A condition satisfying $Q_{TED}$a≥0.85 satisfies a relationship expressed in the following Expression (9).

$$-1.847\times10\times\eta2.217\times10 \leq W \leq 1.189\times10\times\eta-8.433 \text{ [μm]} \qquad (9)$$

where, 0.95≤η≤1.00

$Q_{TED}$a≥0.90

A condition satisfying $Q_{TED}$a≥0.90 satisfies a relationship expressed in the following Expression (10).

$$-3.300\times10\times\eta+3.730\times10 \leq W \leq 3.302\times10\times\eta-2.333\times10 \text{ [μm]} \qquad (10)$$

where, 0.957≤η<1.00

These conditions will be verified on the basis of results which were analyzed through simulation performed by the present inventors.

Figure 42:
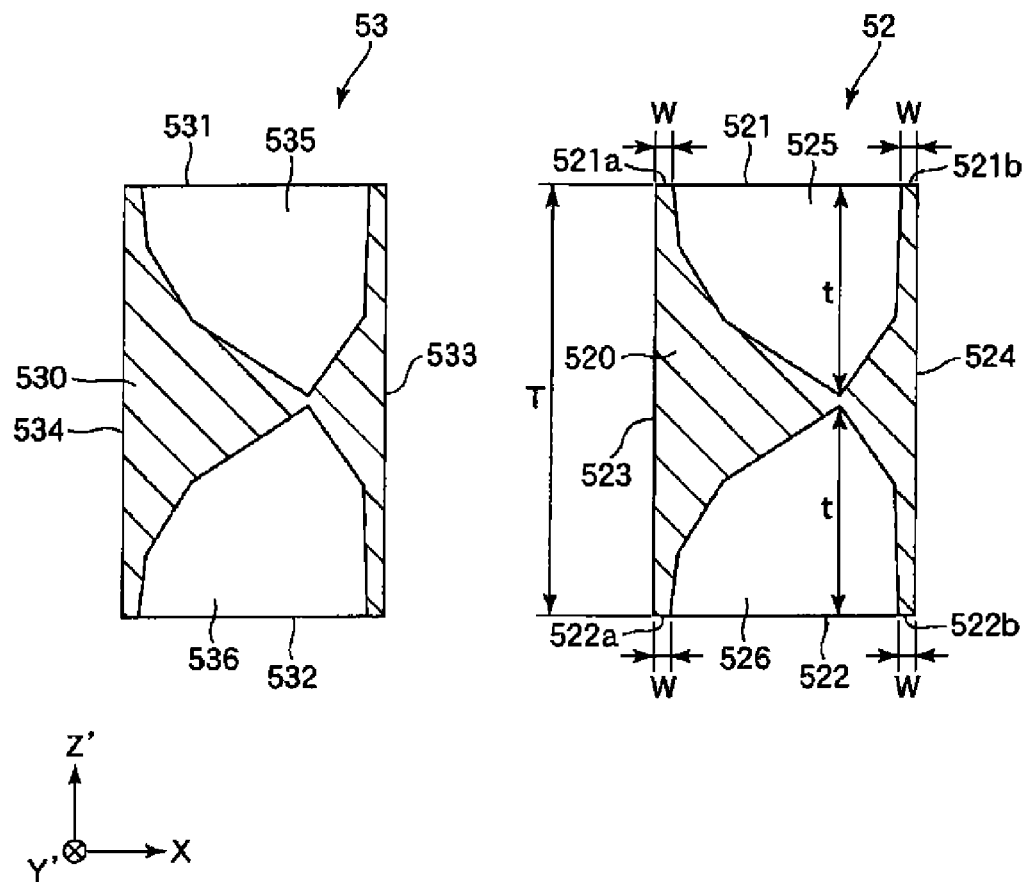
FIG. 42 is a cross-sectional view illustrating vibrating arms which are formed through wet etching.
Figure 43:
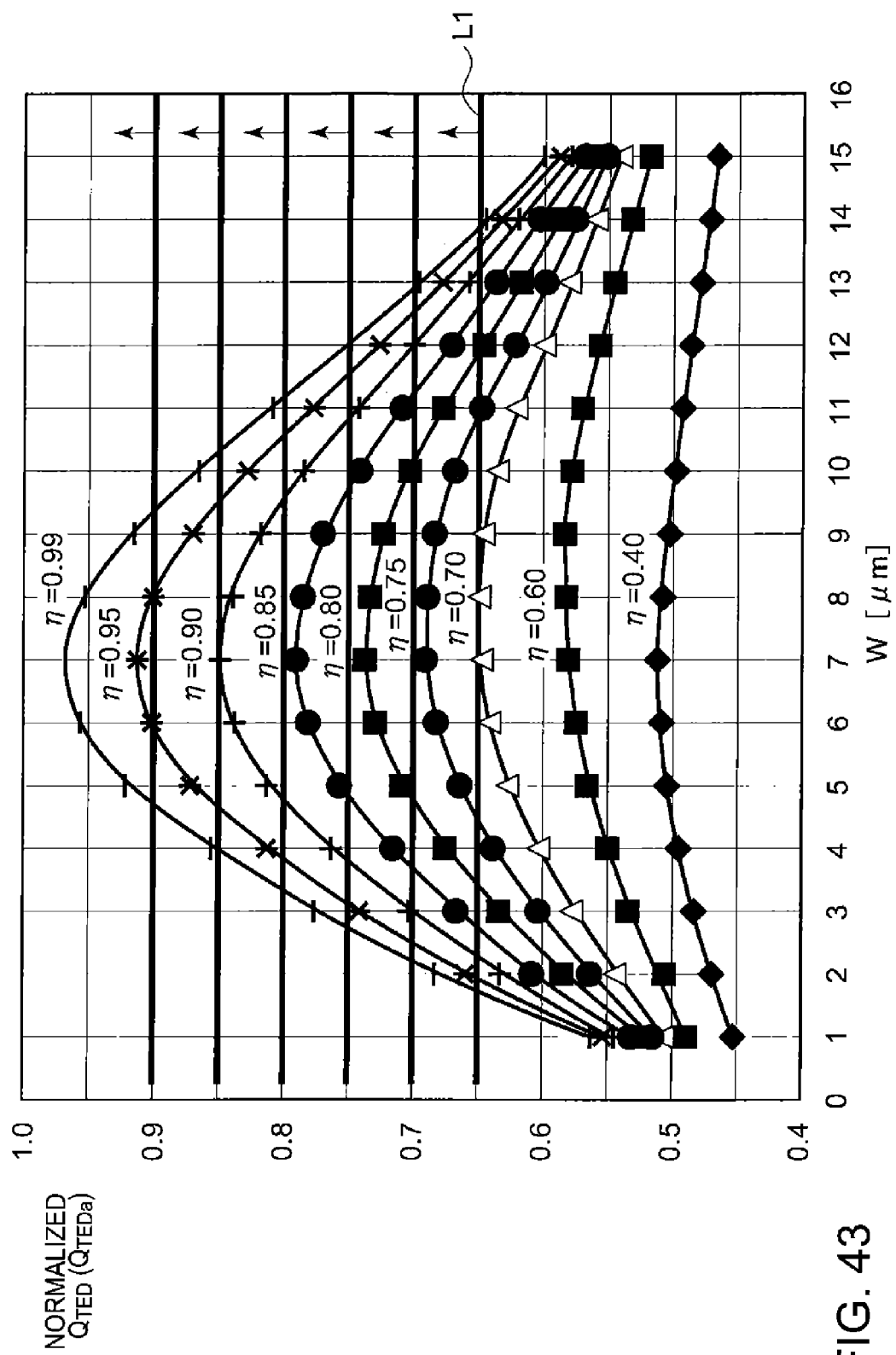

FIG. 42 is a cross-sectional view illustrating the vibrating arms 52 and 53 which are formed through wet etching. FIG. 43 is a graph illustrating a relationship between W and $Q_{TED}$a. FIGS. 44 to 47 are graphs illustrating between η and W.

Hereinafter, simulation performed by using the resonator element 2 which was formed by patterning a Z-cut quartz crystal plate and vibrated at a flexural vibration frequency (mechanical flexural vibration frequency) f=32.768 kHz will be described as a representative, but it has been confirmed by the present inventors that there was little difference from analysis results obtained through the simulation described below in a range in which the flexural vibration frequency f is changed to 32.768 kHz±1 kHz.

In the present simulation, the resonator element 4 obtained by patterning the quartz crystal substrate 5 through wet etching was used. Therefore, the grooves 525 and 526 have shapes in which a surface of the quartz crystal is exposed as illustrated in FIG. 42. FIG. 42 illustrates a cross section taken along the line D-D of FIG. 37. Since an etching rate in the −X axis direction is lower than an etching rate in the +X axis direction, the side surface in the −X axis direction is tilted relatively smoothly, and the side surface in the +x axis direction is tilted approximately vertically.

The quartz crystal substrate 5 of the resonator element 4 used in the present simulation has a length of 1160 μm, a width of 520 μm, and a thickness of 120 μm which is the thickness T of each of the vibrating arms 52 and 53. It has been confirmed by the present inventors that, even if a length, a width, and a thickness are changed, there was little difference from results of the present simulation described below. The resonator element 4 in which the first and second driving electrodes 64 and 65 were not formed was used in the present simulation.

FIG. 43 is a graph illustrating a relationship between the width W of each of the banks 521a, 521b, 522a and 522b and $Q_{TED}$a when η is set to 0.40, 0.60, 0.70, 0.75, 0.80, 0.85, 0.90, 0.95, and 0.99. A lower limit value $Q_{min}$ of $Q_{TED}$a, which is to be achieved in the resonator element 4 is set to 0.65, and is indicated by a line segment L1. If $Q_{TED}$a is equal to or higher than this value, it is possible to exhibit an excellent vibration characteristic.

It can be seen from FIG. 43 that a region in which $Q_{TED}$a is equal to or higher than 0.65 is present when η is 0.75, 0.80, 0.85, 0.90, 0.95, and 0.99. As described above, it be seen from the fact that a relationship of $0.75 \leq \eta < 1.00$ is required to be satisfied in order to set $Q_{TED}a$ to be equal to or higher than 0.65.

Figure 44:
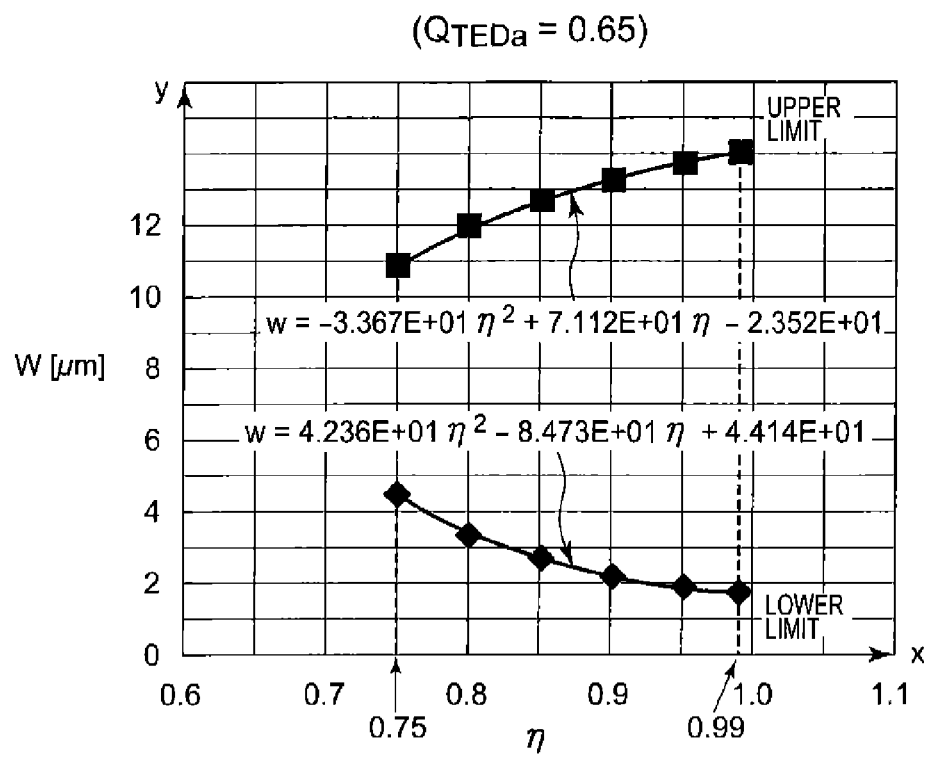
FIG. 44 is a graph illustrating a relationship between η and W.

FIG. 44 is a graph obtained by plotting the respective points at which the graphs cross $Q_{TED}a=0.65$ in FIG. 43, and is a graph illustrating a relationship between $\eta$ and W in a case of $Q_{TED}a=0.65$ ($Q_{min}$).

In this case, the graph indicating a lower limit value of the width W is expressed by the following Equation (11).

$$W\ [\mu m]=4.236\times10\times\eta^2-8.473\times10\times\eta+4.414\times10\ [\mu m] \quad (11)$$

The graph indicating an upper limit value of the width W is expressed by the following Equation (12).

$$W\ [\mu m]=-3.367\times10\times\eta^2+7.112\times10\times\eta-2.352\times10\ [\mu m] \quad (12)$$

Therefore, it can be seen from FIG. 44 that if the relationship expressed in the above Expression (5) is satisfied, it is possible to obtain the resonator element 4 which has $Q_{TED}a$ equal to or higher than 0.65. From the above description, it is proven that if the Expression (5) is satisfied, the resonator element 4 is provided which has $Q_{TED}a$ equal to or higher than 0.65 and thus has an excellent vibration characteristic.

Similarly, it can be seen from FIG. 43 that a region in which $Q_{TED}a$ is equal to or higher than 0.70 is present when $\eta$ is 0.80, 0.85, 0.90, 0.95, and 0.99. As described above, it can be seen from the fact that a relationship of $0.80 \leq \eta < 1.00$ is required to be satisfied in order to set $Q_{TED}a$ to be equal to or higher than 0.70.

Figure 45:
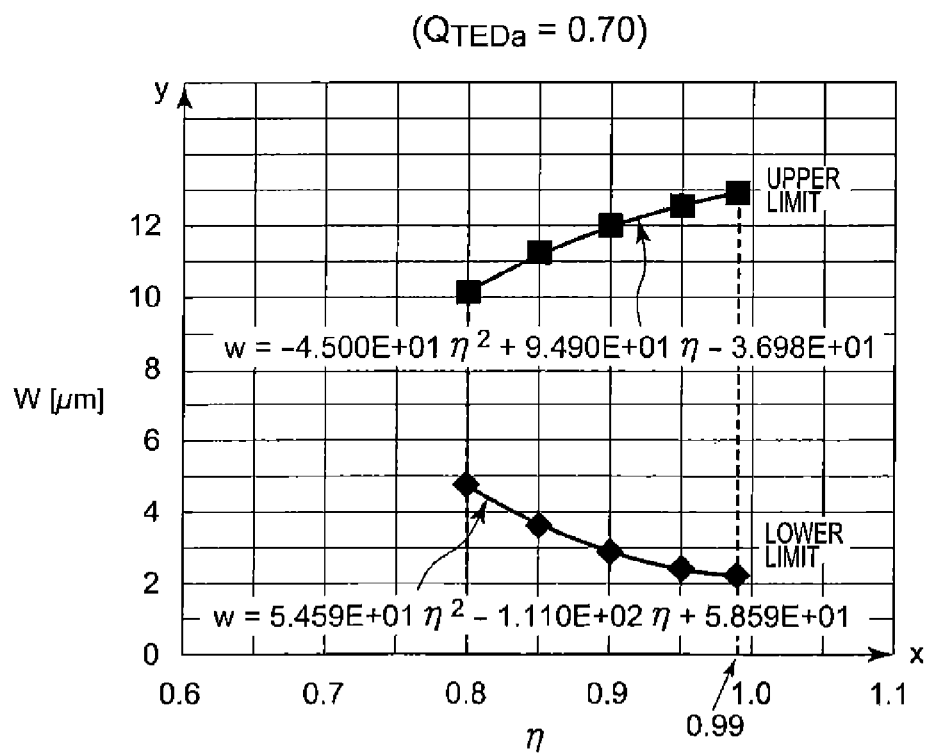
FIG. 45 is a graph illustrating a relationship between η and W.

FIG. 45 is a graph obtained by plotting the respective points at which the graphs cross $Q_{TED}a=0.70$ in FIG. 43, and is a graph illustrating a relationship between $\eta$ and W in a case of $Q_{TED}a=0.70$ ($Q_{min}$).

In this case, the graph indicating a lower limit value of the width W is expressed by the following Equation (13).

$$W\ [\mu m]=5.459\times10\times\eta^2-1.110\times10^2\times\eta+5.859\times10\ [\mu m] \quad (13)$$

The graph indicating an upper limit value of the width W is expressed by the following Equation (14).

$$W\ [\mu m]=-4.500\times10\times\eta^2+9.490\times10\times\eta-3.6989\times10\ [\mu m] \quad (14)$$

Therefore, it can be seen from FIG. 45 that if the relationship expressed in the above Expression (6) is satisfied, it is possible to obtain the resonator element 4 which has $Q_{TED}a$ equal to or higher than 0.70. From the above description, it is proven that if the Expression (6) is satisfied, the resonator element 4 is provided which has $Q_{TED}a$ equal to or higher than 0.70 and thus has an excellent vibration characteristic.

Similarly, it can be seen from FIG. 43 that a region in which $Q_{TED}a$ is equal to or higher than 0.75 is present when $\eta$ is 0.85, 0.90, 0.95, and 0.99. As described above, it can be seen from the fact that a relationship of $0.85 \leq \eta < 1.00$ is required to be satisfied in order to set $Q_{TED}a$ to be equal to or higher than 0.75.

Figure 46:
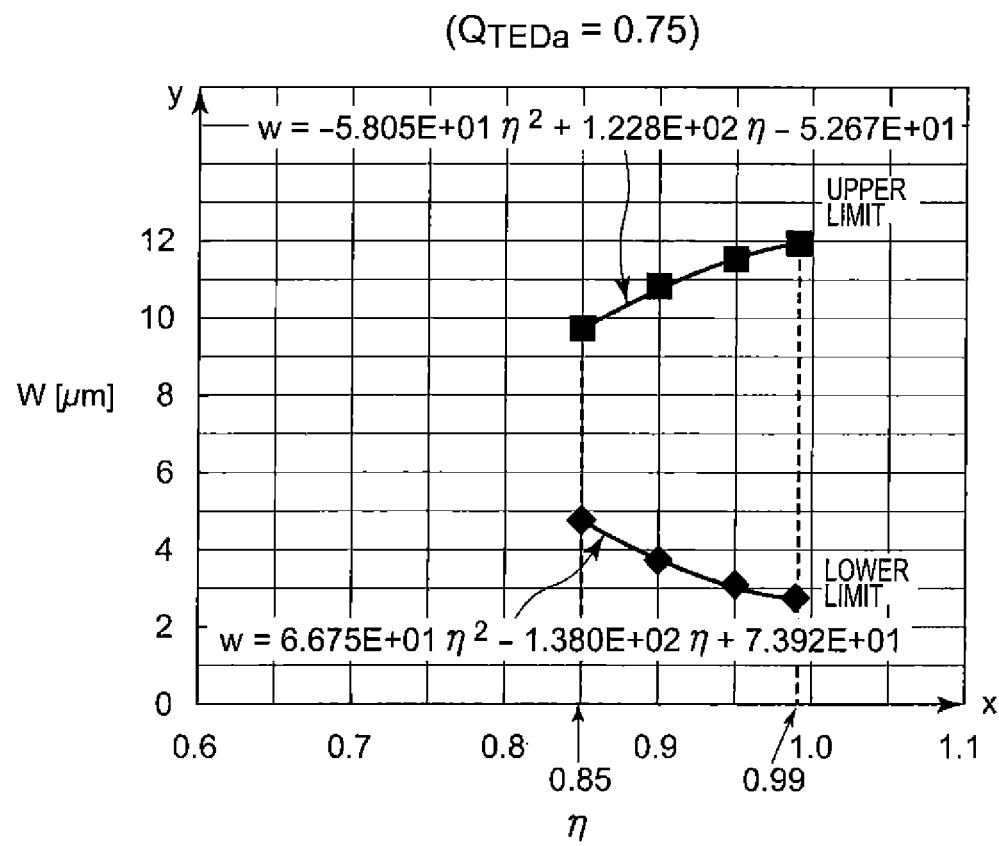
FIG. 46 is a graph illustrating a relationship between η and W.

FIG. 46 is a graph obtained by plotting the respective points at which the graphs cross $Q_{TED}a=0.75$ in FIG. 43, and is a graph illustrating a relationship between $\eta$ and W in a case of $Q_{TED}a=0.75$ ($Q_{min}$).

In this case, the graph indicating a lower limit value of the width W is expressed by the following Equation (15).

$$W\ [\mu m]=6.675\times10\times\eta^2-1.380\times10^2\times\eta+7.392\times10\ [\mu m] \quad (15)$$

The graph indicating an upper limit value of the width W is expressed by the following Equation (16).

$$W\ [\mu m]=-5.805\times10\times\eta^2+1.228\times10^2\times\eta-5.267\times10\ [\mu m] \quad (16)$$

Therefore, it can be seen from FIG. 46 that if the relationship expressed in the above Expression (7) is satisfied, it is possible to obtain the resonator element 4 which has $Q_{TED}a$ equal to or higher than 0.75. From the above description, it is proven that if the Expression (7) is satisfied, the resonator element 4 is provided which has $Q_{TED}a$ equal to or higher than 0.75 and thus has an excellent vibration characteristic.

Similarly, it can be seen from FIG. 43 that a region in which $Q_{TED}a$ is equal to or higher than 0.80 is present when $\eta$ is 0.90, 0.95, and 0.99. As described above, it can be seen from the fact that a relationship of $0.90 \leq \eta < 1.00$ is required to be satisfied in order to set $Q_{TED}a$ to be equal to or higher than 0.80.

Figure 47:
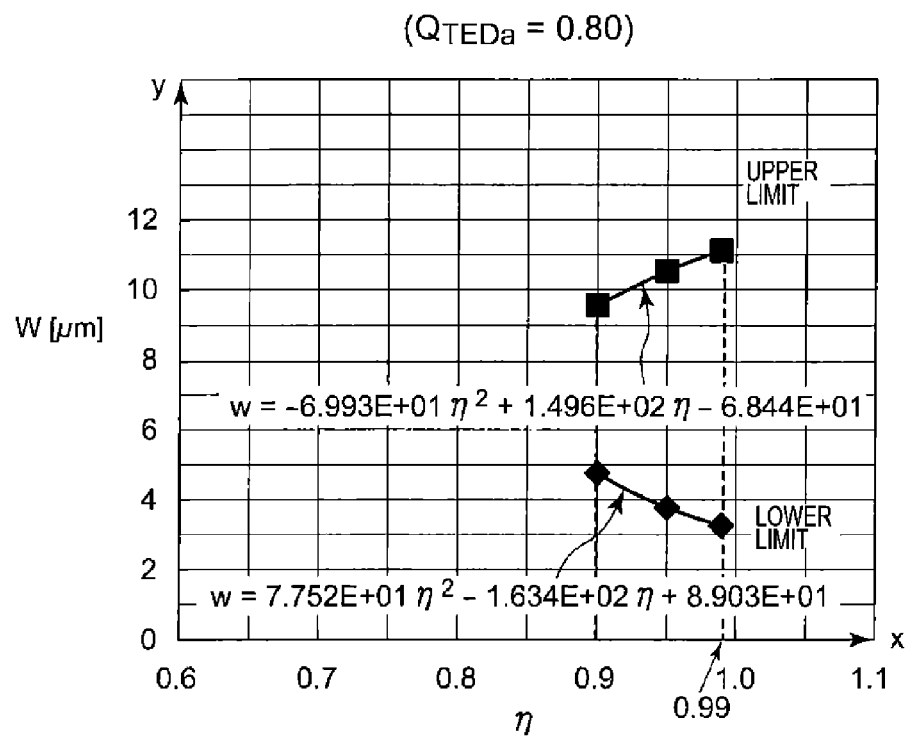
FIG. 47 is a graph illustrating a relationship between η and W.

FIG. 47 is a graph obtained by plotting the respective points at which the graphs cross $Q_{TED}a=0.80$ in FIG. 43, and is a graph illustrating a relationship between $\eta$ and W in a case of $Q_{TED}a=0.80$ ($Q_{min}$).

In this case, the graph indicating a lower limit value of the width W is expressed by the following Equation (17).

$$W\ [\mu m]=7.752\times10\times\eta^2-1.634\times10^2\times\eta+8.903\times10\ [\mu m] \quad (17)$$

The graph indicating an upper limit value of the width W is expressed by the following Equation (18).

$$W\ [\mu m]=-6.993\times10\times\eta^2+1.496\times10^2\times\eta-6.844\times10\ [\mu m] \quad (18)$$

Therefore, it can be seen from FIG. 47 that if the relationship expressed in the above Expression (8) is satisfied, it is possible to obtain the resonator element 4 which has $Q_{TED}a$ equal to or higher than 0.80. From the above description, it is proven that if the Expression (8) is satisfied, the resonator element 4 is provided which has $Q_{TED}a$ equal to or higher than 0.80 and thus has an excellent vibration characteristic.

Similarly, it can be seen from FIG. 43 that a region in which $Q_{TED}a$ is equal to or higher than 0.85 is present when $\eta$ is 0.95 and 0.99. As described above, it can be seen from the fact that a relationship of $0.95 \leq \eta < 1.00$ is required to be satisfied in order to set $Q_{TED}a$ to be equal to or higher than 0.85.

Figure 48:
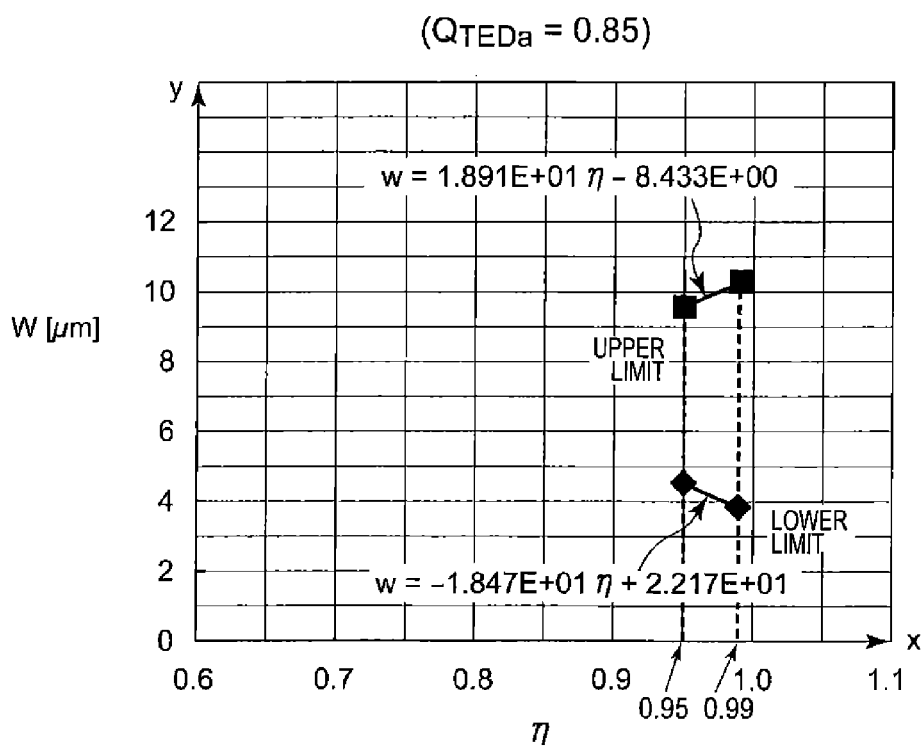
FIG. 48 is a graph obtained by plotting respective points at which graphs cross $Q_{TED}a=0.85$ in FIG. 43.

FIG. 48 is a graph obtained by plotting the respective points at which the graphs cross $Q_{TED}a=0.85$ in FIG. 43, and is a graph illustrating a relationship between $\eta$ and W in a case of $Q_{TED}a=0.85$ ($Q_{min}$).

In this case, the graph indicating a lower limit value of the width W is expressed by the following Equation (19).

$$W\ [\mu m]=-1.847\times10\times\eta+2.217\times10\ [\mu m] \quad (19)$$

The graph indicating an upper limit value of the width W is expressed by the following Equation (20).

$$W\ [\mu m]=1.189\times10\times\eta-8.433\ [\mu m] \quad (20)$$

Therefore, it can be seen from FIG. 48 that if the relationship expressed in the above Expression (9) is satisfied, it is possible to obtain the resonator element 4 which has $Q_{TED}a$ equal to or higher than 0.85. From the above description, it is proven that if the Expression (9) is satisfied, the resonator element 4 is provided which has $Q_{TED}a$ equal to or higher than 0.85 and thus has an excellent vibration characteristic.

Figure 49:
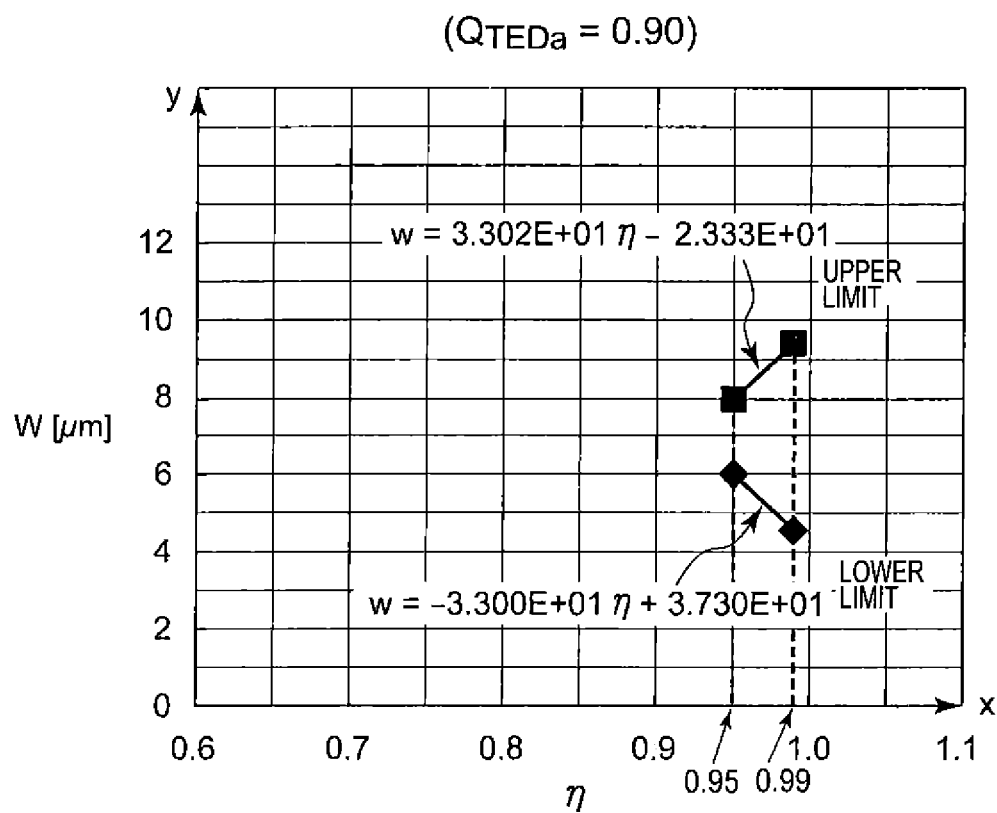
FIG. 49 is a graph obtained by plotting respective points at which graphs cross $Q_{TED}a=0.90$ in FIG. 43.

FIG. 49 is a graph obtained by plotting the respective points at which the graphs cross $Q_{TED}a=0.90$ in FIG. 43, and is a graph illustrating a relationship between $\eta$ and W in a case of $Q_{TED}a=0.90$ ($Q_{min}$).

In this case, the graph indicating a lower limit value of the width W is expressed by the following Equation (21).

$$W\ [\mu m]=-3.300\times10\times\eta+3.730\times10\ [\mu m] \qquad (21)$$

The graph indicating an upper limit value of the width W is expressed by the following Equation (22).

$$W\ [\mu m]=3.302\times10\times\eta-2.333\times10\ [\mu m] \qquad (22)$$

Therefore, it can be seen from FIG. 49 that if the relationship expressed in the above Expression (10) is satisfied, it is possible to obtain the resonator element 4 which has $Q_{TED}$a equal to or higher than 0.90. From the above description, it is proven that if the Expression (10) is satisfied, the resonator element 4 is provided which has $Q_{TED}$a equal to or higher than 0.90 and thus has an excellent vibration characteristic.

Next, a description will be made of a relationship between the entire length of the vibrating arms 52 and 53 and a length of the hammer heads 529 and 539. Since the vibrating arms 52 and 53 have the same configuration as each other, the vibrating arm 52 will be described as a representative thereof, and description of the vibrating arm 53 will be omitted.

In the resonator element 4, when the entire length (a length in the Y' axis direction) of the vibrating arm 52 is set to L, and the entire length (a length in the Y' axis direction) of the hammer head 529 is set to H, the vibrating arm 52 preferably satisfies a relationship of 0.183≤H/L≤0.597. If this relationship is satisfied, air resistance applied to the resonator element 4 can be reduced, and thus it is possible to further improve a Q value.

Here, in the present embodiment, a basal end of the vibrating arm 52 is set to a location at a center of the width (a length in the X axis direction) of the vibrating arm 52 in a line segment which connects a location where the side surface 524 is connected to the base portion 51 to a location where the side surface 523 is connected to the base portion 51. In addition, in the present embodiment, the hammer head 529 is set to a region which has a width which is 1.5 or more times the width (a length in the X axis direction) of the arm section 520.

Hereinafter, it will be proven that if the relationship of 0.183≤H/L≤0.597 is satisfied, the above-described effect can be exhibited, on the basis of simulation results.

Figure 50:
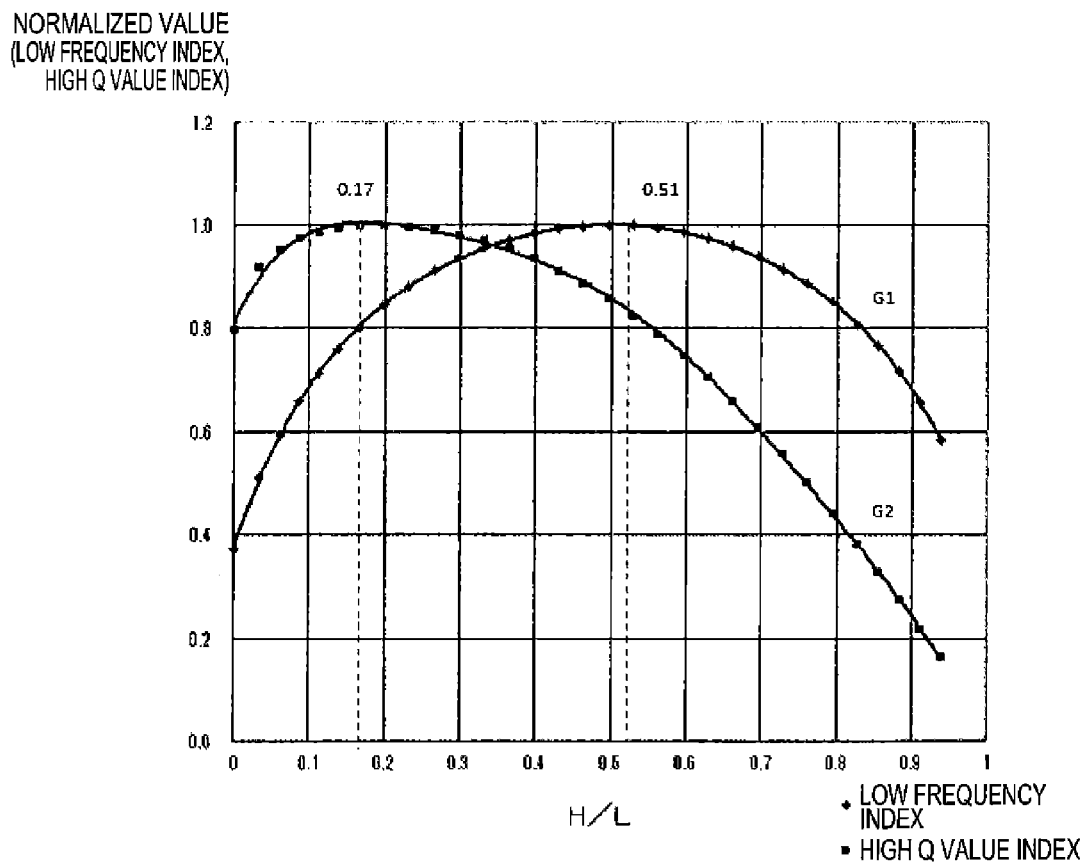
FIG. 50 is a graph illustrating a relationship between H/L and a normalized value.
Figure 51:
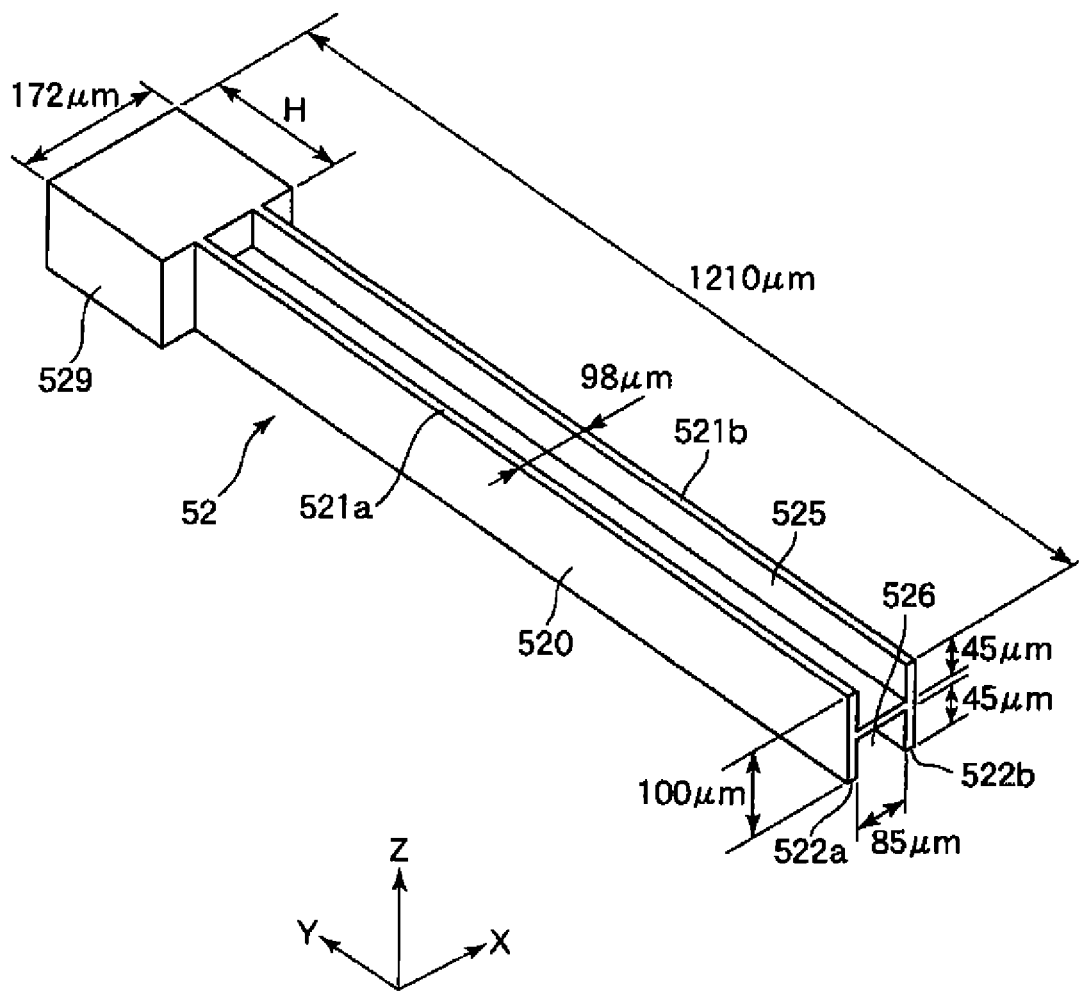
FIG. 51 is a perspective view illustrating a shape and a size of the vibrating arm used in the simulation.
Figure 52:
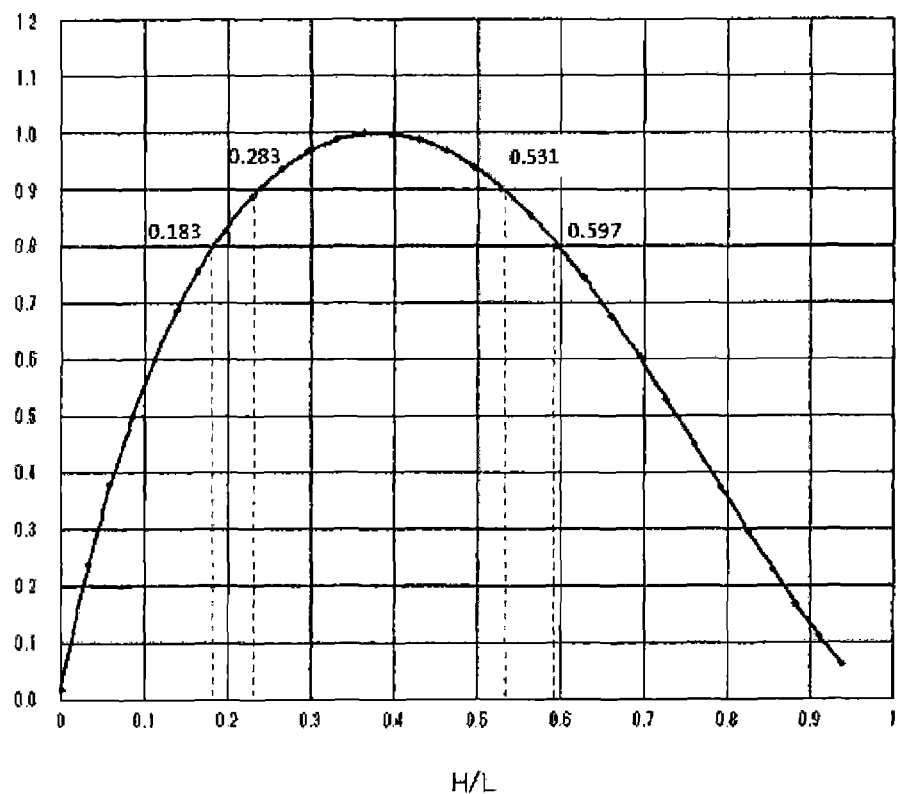
FIG. 52 is a graph illustrating a relationship between H/L and the high performance index 1.

FIG. 50 is a graph illustrating a relationship between H/L and a normalized value. FIG. 51 is a perspective view illustrating a shape and a size of the vibrating arm 52 used in the simulation. FIG. 52 is a graph illustrating between H/L and the high performance index 1.

FIG. 50 illustrates a curve G1 obtained by indexing a relationship between the length H of the hammer head 529 and a resonance frequency of the vibrating arm 52 and a curve G2 obtained by indexing a relationship between the length H of the hammer head 529 and a Q value of the vibrating arm 52. A Q value indicated by the curve G2 is a value in which only a thermoelastic loss is taken into consideration. Hereinafter, the longitudinal axis of the curve G1 is also referred to as a "low frequency index", and the longitudinal axis of the curve G2 is also referred to as a "high Q value index".

A single vibrating arm 52 was used in simulation for obtaining the curves G1 and G2. The vibrating arm 52 used in the present simulation is formed of a quartz crystal Z plate (rotation angle of 0°). FIG. 51 illustrates an X axis, a Y axis, a Z axis, which are three axes perpendicular to each other. The X axis, the Y axis, and the Z axis illustrated in FIG. 51 respectively correspond to an X axis (electrical axis), a Y axis (mechanical axis), and a Z axis (optical axis) of the quartz crystal.

As illustrated in FIG. 51, as sizes of the vibrating arm 52, the entire length L is 1210 µm, the thickness T is 100 µm, the width W3 of the arm section 520 is 98 µm, the width W4 of the hammer head 529 is 172 µm, the depth t of each of the grooves 525 and 526 is 45 µm, and the width W of each of the banks 521a, 521b, 522a and 522b is 6.5 µm.

In the vibrating arm 52, the simulation was performed by changing the length H of the hammer head 529. In addition, it has been confirmed by the present inventors that, even if sizes (L, W, W3, W4, and T) of the vibrating arm 52 are changed, the same tendency as in simulation results described below was shown.

In FIG. 50, the curve G1 indicates that a resonance frequency of the vibrating arm 52 is lowest at a point (H/L=0.51) of a normalized value (low frequency index)=1, and the curve G2 indicates that a Q value of the vibrating arm 52 is highest at a point (H/L=0.17) of a normalized value (high Q value index)=1. As a resonance frequency of the vibrating arm 52 is reduced, the resonator element 4 can be miniaturized. Thus, the resonator element 4 can be miniaturized most at H/L=0.51 (hereinafter, referred to as a "condition 1"). As a Q value becomes higher, a thermoelastic loss is reduced, and an excellent vibration characteristic can be exhibited. Thus, it is possible to provide the resonator element 4 with the most excellent vibration characteristic at H/L=0.17 (hereinafter, referred to as a "condition 2").

However, as can be from FIG. 50, the high Q value index is not sufficiently high at H/L=0.51, and the low frequency index is not sufficiently high at H/L=0.17. Therefore, if only the condition 1 is satisfied, an excellent vibration characteristic cannot be obtained, and, conversely, if only the condition 2 is satisfied, the resonator element 4 cannot be sufficiently miniaturized.

Therefore, as an index for achieving both the miniaturization of the resonator element 4 and the improvement in a vibration characteristic, the "high performance index 1" is set, and a relationship between the high performance index 1 and H/L is illustrated in FIG. 52. In addition, [high performance index 1] is expressed by [low frequency index]×[high Q value index]×[correction value]. The high performance index 1 is an index when the maximum numerical value of indexes is set to 1. The [correction value] is a value for making the simulation performed by using the single vibrating arm 52 suitable for the resonator element 4 having the two vibrating arms 52 and 53. For this reason, as a result of using the correction value, the high performance index 1 can be made more similar to the physical property of the resonator element 4.

Here, if the high performance index 1 is equal to or higher than 0.8, it is possible to provide the resonator element 4 which achieves the miniaturization and the improvement in a vibration characteristic. For this reason, in the resonator element 4, the length H of the hammer head 529 is preferably set in order to satisfy the relationship of 0.183≤H/L≤0.597. Even in this range, a relationship of 0.238≤H/L≤0.531 is more preferably satisfied so that the high performance index 1 is equal to or higher than 0.9. Consequently, air resistance applied to the resonator element 4 can be further reduced, and thus it is possible to further improve a Q value. Therefore, it is possible to provide the resonator element 4 which further achieves both the miniaturization and the improvement in a vibration characteristic.

From the viewpoint different from the above-described viewpoint, the vibrating arm 52 preferably satisfies a relationship of 0.012<H/L<0.30, and more preferably satisfies a relationship of 0.046<H/L<0.223. If this relationship is satisfied, air resistance applied to the resonator element 4 can be further reduced, a CI value of the resonator element 4 can be miniaturized, and a vibration loss can be further reduced. Consequently, it is possible to provide the resonator element 2 which can reduce deterioration in a Q value and thus has an excellent vibration characteristic.

When a width (a length in the X axis direction) of the arm section 520 is set to W3, and a width (a length in the X axis direction) of the hammer head 529 is set to W4, the vibrating arm 52 preferably satisfies a relationship of 1.5≤W4/W3≤10.0, and more preferably satisfies a relationship of 1.6≤W4/W3≤7.0. If this relationship is satisfied, a width of the hammer head 529 can be widely secured. For this reason, even if the length H of the hammer head 529 is relatively small (even below 30% of L) as described above, a sufficient mass effect can be exhibited by the hammer head 529. Therefore, if the relationship is satisfied, since the entire length L of the vibrating arm 52 is miniaturized, it is possible to further reduce deterioration in a Q value due to air resistance applied to the resonator element 4 and to further miniaturize the resonator element 4. In addition, it is possible to minimize an increase in the vibration leakage caused by increasing torsion of the vibrating arm 52 during flexural vibration due to a width of the hammer head 529 being too large.

As mentioned above, in the vibrating arm 52, when the relationship of 0.012<H/L<0.30 and the relationship of 1.5≤W4/W3≤10.0 are satisfied, it is possible to provide the small-sized resonator element 4 which can further reduce air resistance applied to the resonator element 4 and can further minimize a CI value, due to the synergy effect of the two relationships.

If L≤2 μm, preferably L≤1 μm is satisfied, it is possible to provide a small-sized resonator element used in an oscillator which is mounted in a portable music player or an IC card. In addition, if W3≤100 μm, preferably W3≤50 μm is satisfied, it is possible to provide a resonator element which vibrates at a low frequency and is used in an oscillation circuit realizing low power consumption even in the range of L. In a heat insulation region, in a case where a vibrating arm extends in the Y' axis direction and flexurally vibrates in the X axis direction in a quartz crystal Z plate, W3≥12.8 μm is preferable; in a case where a vibrating arm extends in the X axis direction and flexurally vibrates in the Y' axis direction in a quartz crystal Z plate, W3≥14.4 μm is preferable; and in a case where a vibrating arm extends in the Y' axis direction and flexurally vibrates in the Z' axis direction in a quartz crystal X plate, W3≥15.9 μm is preferable. In the above-described manner, since a heat insulation region is reliably obtained, a thermoelastic loss due to formation of a groove is reduced, and a Q value is increased. In addition, driving is performed in a region where the groove is formed, and thus (electric field efficiency is increased and a driving area is increased) a CI value is reduced.

Hereinafter, it will be proven that if a relationship of 0.012≤H/L<0.30 and a relationship of 1.5≤W4/W3≤10.0 are satisfied, the above-described effect can be exhibited, on the basis of simulation results.

Figure 53:
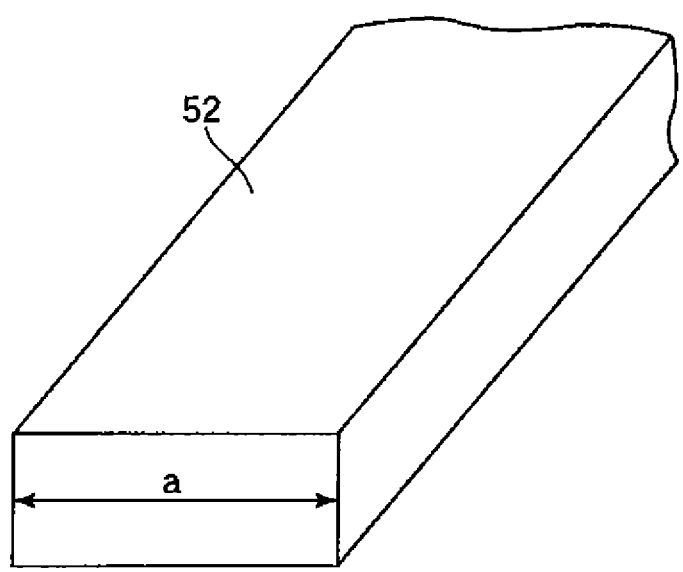
Figure 54A:
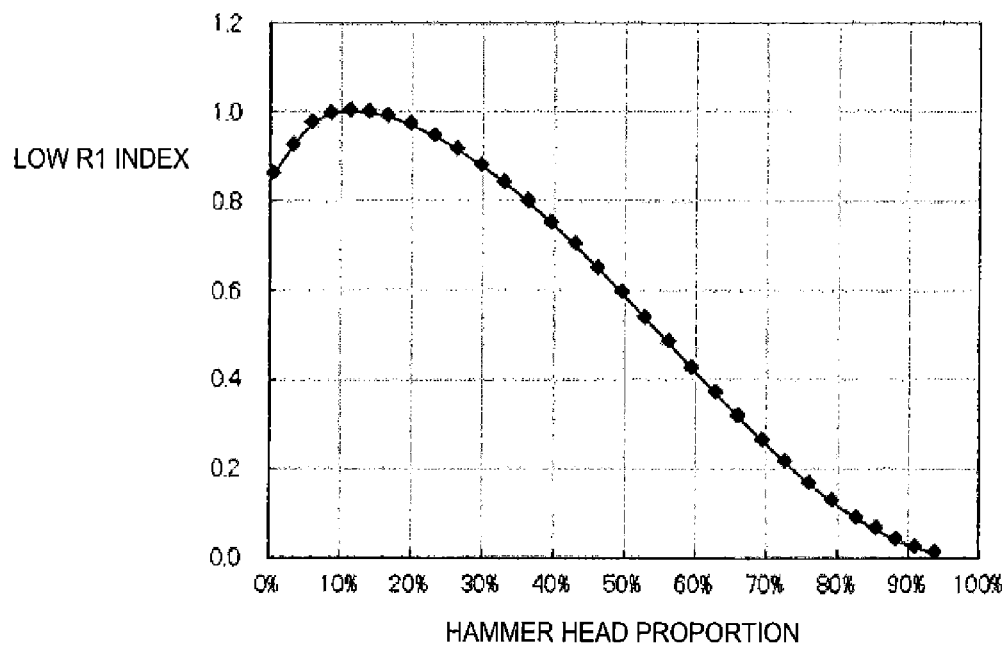
FIGS. 54A and 54B are graphs illustrating a relationship between a proportion of a hammer head and a low R1 index.
Figure 54B:
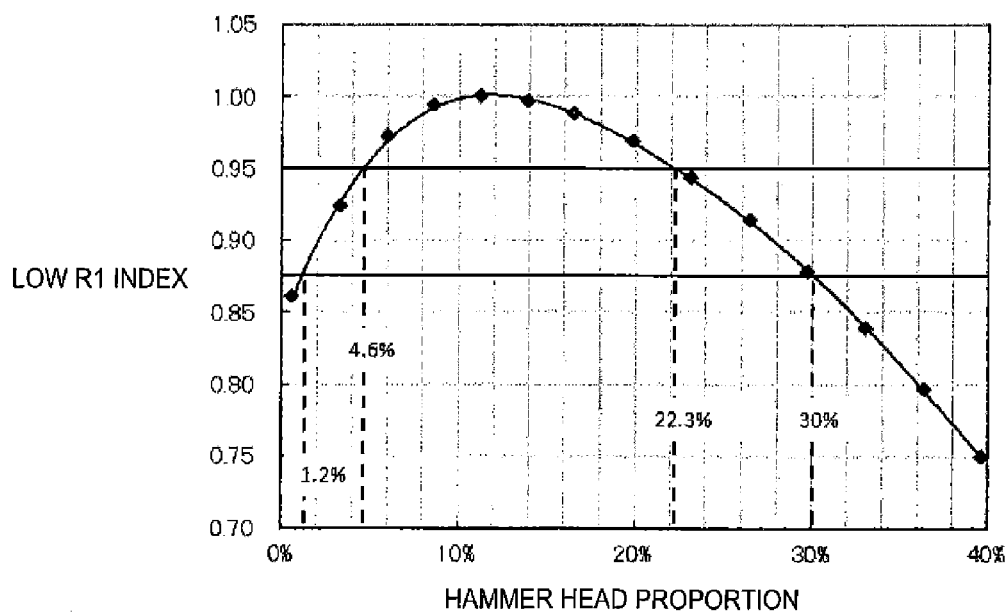

FIG. 53 is a perspective view for explaining an effective width a. FIGS. 54A and 54B are graphs illustrating a proportion of the hammer head and a low R1 index. The following Table 1 is a table showing a change in a CI value when the length H of the hammer head 529 is changed.

The present simulation was performed by using a single vibrating arm 52 as illustrated in FIG. 51. In addition, it has been confirmed by the present inventors that, even if sizes (L, W, W3, W4, and T) of the vibrating arm 52 are changed, the same tendency as in simulation results described below was shown.

In the present simulation, a CI value of each sample is calculated as follows. First, a Q value in which only a thermoelastic loss is taken into consideration is obtained according to a finite element method. Next, since the Q value has a frequency dependency, the obtained Q value is converted into a Q value (F-converted Q value) at 32.768 kHz. Next, R1 (CI value) is calculated on the basis of the F-converted Q value. In a case where a Q value is sufficiently great (for example, ten thousand or more), the equivalent series resistance value R1 is substantially the same as the crystal impedance CI, and thus the two values are regarded to be the same as each other in the present embodiment of the invention. Next, since the CI value also has a frequency dependency, the obtained R1 is converted into R1 at 32.768 kHz, and an inverse thereof is referred to as a "low R1 index". The low R1 index is an index when the maximum index in all simulations is set to 1. Therefore, it is indicated that the closer to 1 the low R1 index, the smaller the CI value. FIG. 54A illustrates a graph of which a transverse axis expresses a hammer head proportion (H/L), and a longitudinal axis expresses a low R1 index, and FIG. 54B illustrates a graph which enlarges part of FIG. 54A.

A method of converting a Q value into an F-converted Q value is as follows.

The following calculation is performed by using the following Equations (23) and (24).

$$f_0 = \pi k/(2\rho C p a^2) \qquad (23)$$

$$Q = \{\rho C p/(C\alpha^2 H)\} \times [\{1+(f/f_0)^2\}/(f/f_0)] \qquad (24)$$

Here, in Equations (23) and (24), π is a circular constant, k is thermal conductivity of the vibrating arm 52 in the width direction, ρ is mass density, Cp is heat capacity, C is an elastic stiffness constant of expansion and contraction of the vibrating arm 52 in the length direction, α is a thermal expansion coefficient of the vibrating arm 52 in the length direction, H is an absolute temperature, and f is an inherent frequency. In addition, a indicates a width (effective width) when the vibrating arm 52 is regarded to have a plate shape as illustrated in FIG. 53. In FIG. 53, although the grooves 525 and 526 are not formed in the vibrating arm 52, conversion into an F-converted Q value can be performed even by using a value of a in this case.

First, the inherent frequency of the vibrating arm 52 used in the simulation is set to F1, the obtained Q value is set to Q1, and a value of a which causes f=F1 and Q=Q1 is obtained by using Equations (23) and (24). Next, the obtained a is used, f is set to 32.768 kHz, and a value of Q is calculated from Equation (24). The Q value obtained in this way is an F-converted Q value.

TABLE 1

| | H/L | Inherent frequency f1[Hz] | Q1 | F-converted Q value | R1 [Ω] | 1/R1 | LowR1 index |
|---|---|---|---|---|---|---|---|
| SIM001 | 0.6% | 7.38E+04 | 159.398 | 76.483 | 3.50E+03 | 1.270E−04 | 0.861 |
| SIM002 | 3.3% | 5.79E+04 | 135.317 | 76.606 | 4.15E+03 | 1.363E−04 | 0.923 |
| SIM003 | 6.0% | 4.99E+04 | 120.906 | 79.442 | 4.58E+03 | 1.435E−04 | 0.972 |
| SIM004 | 8.6% | 4.48E+04 | 111.046 | 81.157 | 4.98E+03 | 1.467E−04 | 0.994 |
| SIM005 | 11.2% | 4.13E+04 | 103.743 | 82.223 | 5.37E+03 | 1.476E−04 | 1.000 |
| SIM006 | 13.9% | 3.88E+04 | 98.038 | 82.843 | 5.74E+03 | 1.471E−04 | 0.997 |
| SIM007 | 16.5% | 3.68E+04 | 93.507 | 83.225 | 6.10E+03 | 1.458E−04 | 0.988 |
| SIM008 | 19.8% | 3.49E+04 | 88.856 | 83.328 | 6.56E+03 | 1.430E−04 | 0.969 |
| SIM009 | 23.1% | 3.35E+04 | 85.017 | 83.115 | 7.02E+03 | 1.393E−04 | 0.944 |
| SIM010 | 26.4% | 3.24E+04 | 81.772 | 82.657 | 7.50E+03 | 1.348E−04 | 0.914 |
| SIM011 | 29.8% | 3.16E+04 | 78.811 | 81.824 | 8.01E+03 | 1.296E−04 | 0.878 |
| SIM012 | 33.1% | 3.09E+04 | 76.247 | 80.864 | 8.56E+03 | 1.239E−04 | 0.839 |
| SIM013 | 36.4% | 3.04E+04 | 73.813 | 79.591 | 9.17E+03 | 1.176E−04 | 0.796 |
| SIM014 | 39.7% | 3.00E+04 | 71.409 | 77.963 | 9.87E+03 | 1.106E−04 | 0.749 |
| SIM015 | 43.0% | 2.98E+04 | 69.077 | 76.078 | 1.07E+04 | 1.032E−04 | 0.699 |
| SIM016 | 46.3% | 2.96E+04 | 66.818 | 73.978 | 1.16E+04 | 9.557E−05 | 0.648 |
| SIM017 | 49.6% | 2.95E+04 | 64.449 | 71.494 | 1.27E+04 | 8.750E−05 | 0.593 |
| SIM018 | 52.9% | 2.96E+04 | 62.042 | 68.733 | 1.40E+04 | 7.928E−05 | 0.537 |
| SIM019 | 56.2% | 2.97E+04 | 59.670 | 65.800 | 1.55E+04 | 7.104E−05 | 0.481 |
| SIM020 | 59.5% | 3.00E+04 | 57.018 | 62.370 | 1.75E+04 | 6.257E−05 | 0.424 |
| SIM021 | 62.8% | 3.03E+04 | 54.502 | 58.918 | 1.98E+04 | 5.447E−05 | 0.369 |
| SIM022 | 66.1% | 3.08E+04 | 51.676 | 54.983 | 2.29E+04 | 4.640E−05 | 0.314 |
| SIM023 | 69.4% | 3.14E+04 | 48.788 | 50.857 | 2.69E+04 | 3.871E−05 | 0.262 |
| SIM024 | 72.7% | 3.23E+04 | 45.699 | 46.416 | 3.23E+04 | 3.140E−05 | 0.213 |
| SIM025 | 76.0% | 3.33E+04 | 42.398 | 41.687 | 4.00E+04 | 2.461E−05 | 0.167 |
| SIM026 | 79.3% | 3.47E+04 | 39.084 | 36.902 | 5.08E+04 | 1.857E−05 | 0.126 |
| SIM027 | 82.6% | 3.65E+04 | 35.523 | 31.872 | 6.77E+04 | 1.325E−05 | 0.090 |
| SIM028 | 85.5% | 3.86E+04 | 32.226 | 27.387 | 9.12E+04 | 9.314E−06 | 0.063 |
| SIM029 | 88.3% | 4.13E+04 | 28.763 | 22.842 | 1.31E+05 | 6.056E−06 | 0.041 |
| SIM030 | 91.1% | 4.50E+04 | 24.918 | 18.132 | 2.11E+05 | 3.448E−06 | 0.023 |
| SIM031 | 93.9% | 5.07E+04 | 21.042 | 13.614 | 4.04E+05 | 1.602E−06 | 0.011 |

The present inventors aim to provide the resonator element 4 in which the low R1 index is equal to or higher than 0.87. As can be from Table 1 and the graphs of FIGS. 54A and 54B, in the simulations (SIM002 to SIM011) which satisfy the relationship of 0.012<H/L<0.30, the low R1 index is equal to or higher than aimed 0.87. Particularly, in the simulations (SIM003 to SIM008) which satisfy a relationship of 0.046<H/L<0.223, it can be seen that the low R1 index exceeds 0.95 and thus a CI value is further reduced. It is proven from the above simulation results that if the relationship of 0.012<H/L<0.30 is satisfied, it is possible to provide the resonator element 4 in which a CI value is further minimized.

The resonator element 4 with the above-described configuration is fixed to the package 9 via the conductive adhesive material 11. Hereinafter, the package 9 will be described.

Package

As illustrated in FIGS. 35 and 36, the package 9 includes a box-like base 91 having a recess 911 which is open upward, and a tabular lid 92 which closes an opening of the recess 911 and is joined to the base 91. The package 9 has an accommodation space S which is formed as a result of the recess 911 being closed by the lid 92, and the resonator element 4 is accommodated in an air-tight manner in the accommodation space S. In other words, the accommodation space S formed by the base 91 and the lid 92 functions as an accommodation portion which accommodates the resonator element 4. An inert gas such as nitrogen, helium, or argon may be sealed into the accommodation space S.

A step difference 912 is provided at the recess 911, and the resonator element 4 is fixed to the step difference 912 in the second base section 512 of the base portion 51 via the conductive adhesive material 11 in which conductive pillars are mixed with, for example, an epoxy-based or acryl-based resin.

A material forming the base 91 is not particularly limited, but may use various ceramics such as aluminum oxide. A material forming the lid 92 is not particularly limited, but may be a material having a linear expansion coefficient similar to that of a material forming the base 91. For example, in a case where a material forming the base 91 uses the above-described ceramics, an alloy such as Kovar is preferably used. Joining between the base 91 and the lid 92 is not preferably limited, and, for example, the base 91 and the lid 92 may be joined to each other via an adhesive material, and may be joined to each other through seam welding.

In addition, connection terminals 951 and 961 are formed on the step difference 912 of the base 91. Although not illustrated, the first driving electrode 64 of the resonator element 4 is extracted up to the second base section 512 of the base portion 51 and is electrically connected to the connection terminal 951 via the conductive adhesive material 11 at the corresponding section. Similarly, although not illustrated, the second driving electrode 65 of the resonator element 4 is extracted up to the second base section 512 of the base portion 51 and is electrically connected to the connection terminal 961 via the conductive adhesive material 11 at the corresponding section.

The connection terminal 951 is electrically connected to an external terminal (not illustrated) formed on the bottom surface of the base 91 via a through electrode (not illustrated) which penetrates through the base 91, and the connection terminal 961 is electrically connected to an external terminal (not illustrated) formed on the bottom surface of the base 91 via a through electrode (not illustrated) which penetrates through the base 91.

A material forming each of the connection terminals 951 and 961, the through electrodes, and the external terminals is not particularly limited as long as the material is conductive, and there may be a configuration of a metal coating film in which, for example, a coating film such as nickel (Ni), gold (Au), silver (Ag), or copper (Cu) is formed on a metalized layer (base layer) such as chromium (Cr) or tungsten (W).

Here, as described above, the resonator 1 vibrates in an in-surface direction (XY' plane direction) at a predetermined frequency so that the vibrating arms 52 and 53 of the resonator element 4 repeatedly come close to or separate from each other. However, a Q value of the resonator 1 (the resonator element 4) deteriorates and a CI value increases depending on the magnitude of air resistance (viscosity of air) in the package 9 in which the resonator element 4 is accommodated.

Therefore, in the present embodiment of invention, a degree of decompression (vacuum degree) of the accommodation space S, that is, an atmospheric pressure (pressure) in the package 9 is set to be equal to or lower than 100 Pa. Consequently, it is possible to reduce air resistance applied to the resonator element 4. For this reason, it is possible to reduce deterioration in a Q value of the resonator 1 (the resonator element 4) caused by the air resistance in the package 9 and thus to minimize an increase in a CI value. Therefore, it is possible to improve a Q value, and to stabilize a vibration characteristic of the resonator 1.

An atmospheric pressure in the package 9 is not particularly limited, and may be equal to or lower than 100 Pa, and is preferably equal to or lower than 10 Pa. Consequently, it is possible to further reduce air resistance applied to the resonator element 2 and thus to further improve a Q value.

In addition, an atmospheric pressure in the package 9 is preferably equal to or higher than $7 \times 10^{-4}$. Therefore, it is possible to reduce inadvertent warpage or deflection of the package 9 due to a difference between atmospheric pressures inside the package 9 and outside the package 9 and the occurrence of crack caused thereby. For this reason, it is possible to provide the resonator 1 with higher reliability. If an atmospheric pressure in the package 9 is lower than the above-described numerical value, there is a concern that an improvement or more of the effect of reducing deterioration in a Q value caused by air resistance applied to the resonator element 2 may not be expected, and productivity of the resonator 1 may be reduced.

From this fact, an atmospheric pressure in the package 9 is not particularly limited and may be equal to or lower than 100 Pa, but is preferably in a range of $7 \times 10^{-4}$ Pa to 10 Pa, more preferably in a range of $7 \times 10^{-4}$ Pa to 1 Pa, and most preferably in a range of $7 \times 10^{-4}$ Pa to $10^{-1}$ Pa. If this relationship is satisfied, it is possible to reduce inadvertent warpage or deflection of the package 9 and also to further reduce deterioration in a Q value caused by air resistance applied to the resonator element 2. For this reason, when the relationship is satisfied, it is possible to provide the resonator 1 which has an especially excellent vibration characteristic and notably high reliability.

Hereinafter, it will be proven that if an atmospheric pressure in the package 9 is equal to or lower than 100 Pa, the above-described effects are exhibited, on the basis of a result of examining a Q value ($Qv^{-1}$) for an atmospheric pressure in the package 9.

Figure 55:
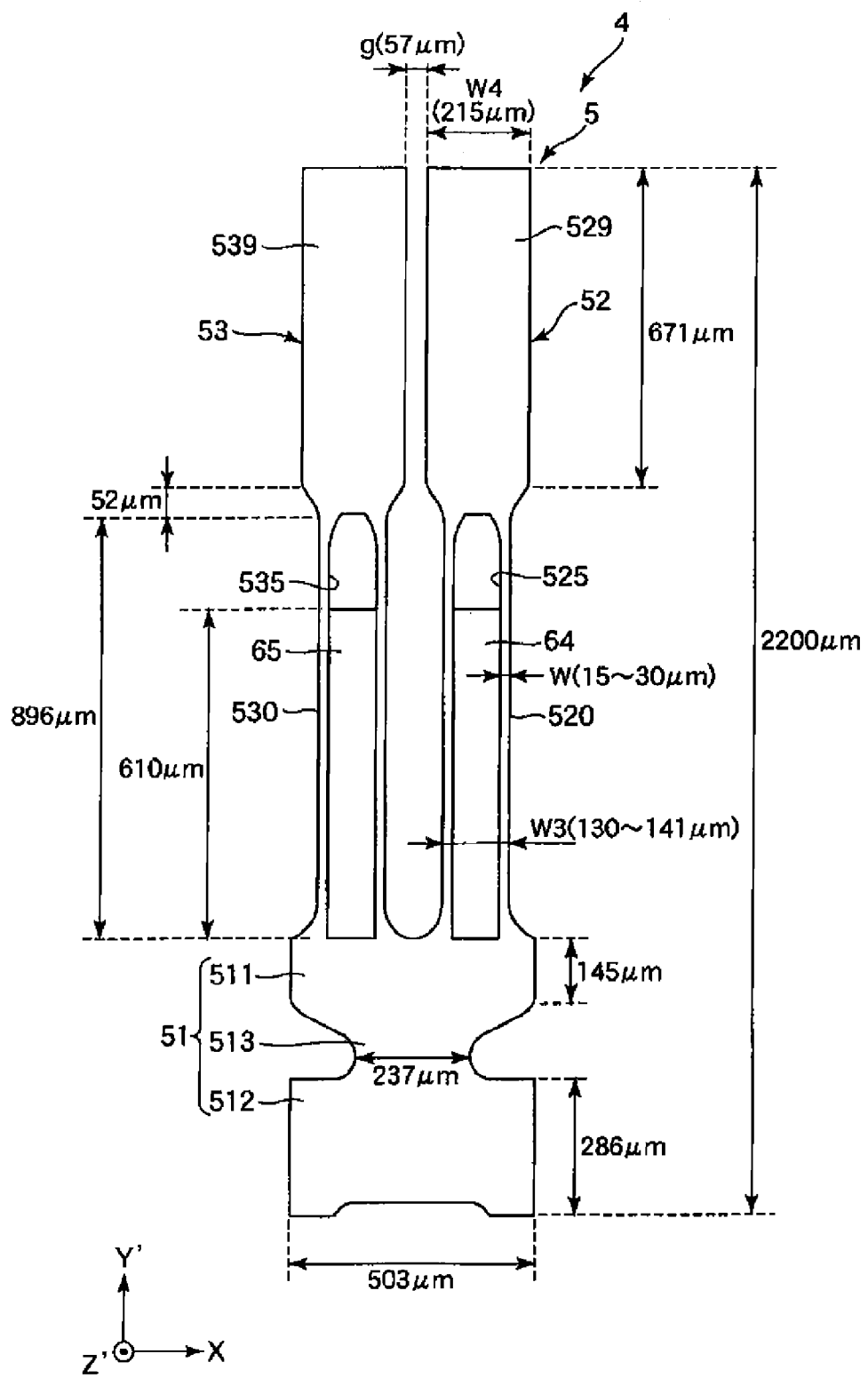
FIG. 55 is a plan view illustrating a shape and a size of a resonator element in which a relationship between $Qv^{-1}$ and an atmospheric pressure is used for examination.
Figure 56:
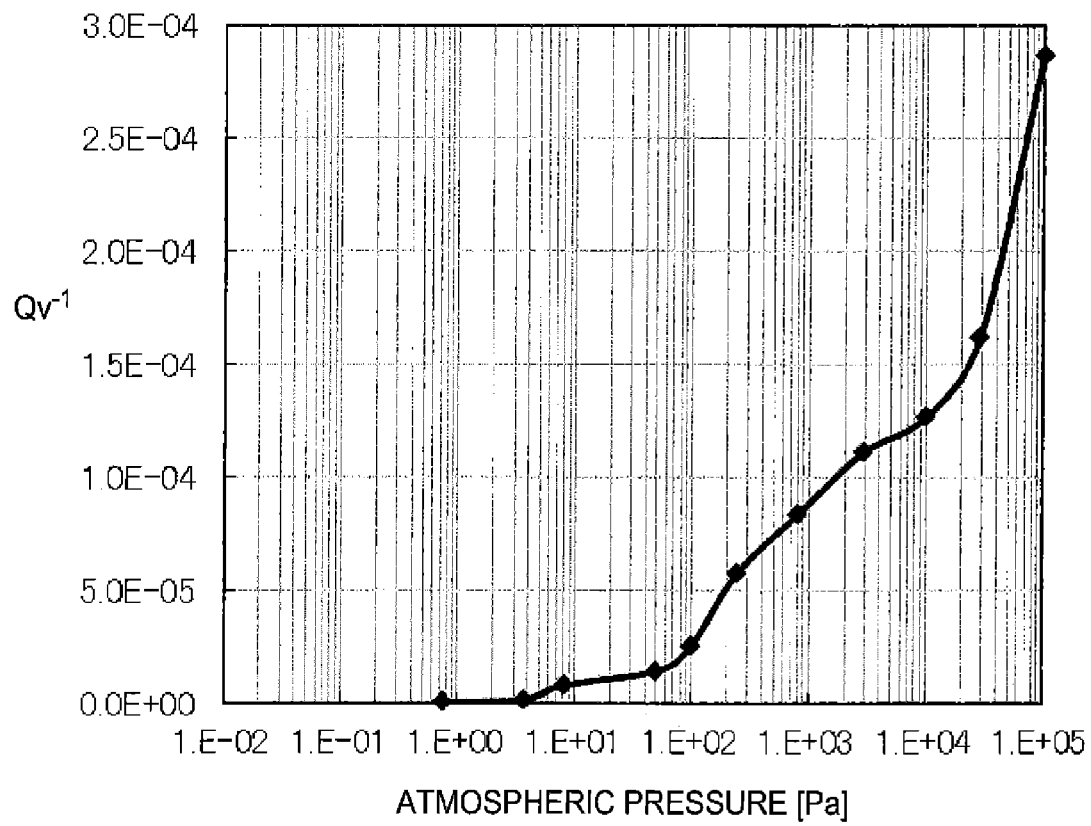
FIG. 56 is a graph illustrating a relationship between $Qv^{-1}$ and an atmospheric pressure.
Figure 57:
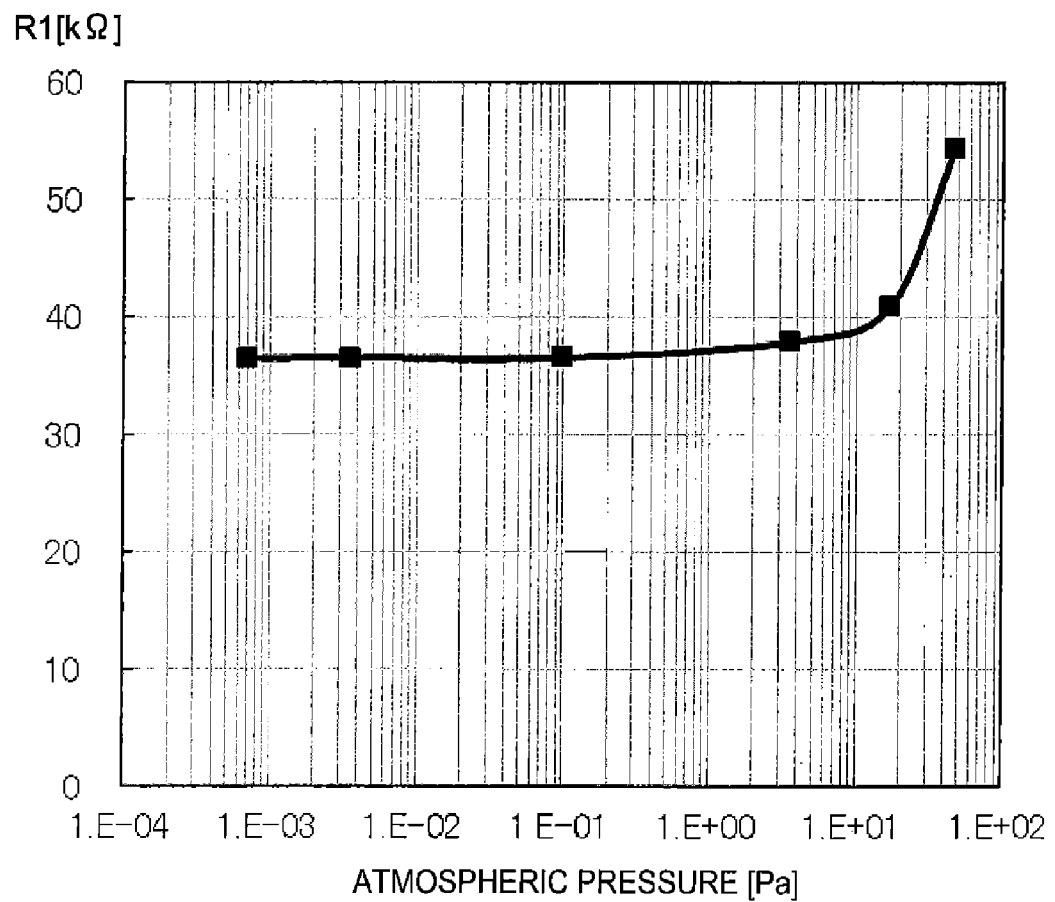
FIG. 57 is a graph illustrating a relationship between an equivalent series resistance value R1 and an atmospheric pressure.

FIG. 55 is a plan view illustrating a shape and a size of the resonator element 4 used to examine a relationship between $Qv^{-1}$ and an atmospheric pressure. FIG. 56 is a graph illustrating a relationship between $Qv^{-1}$ and an atmospheric pressure. FIG. 57 is a graph illustrating a relationship between an equivalent series resistance value R1 and an atmospheric pressure.

A transverse axis of the graph illustrated in FIG. 56 expresses a pressure [Pa], and a longitudinal axis thereof expresses $Qv^{-1}$ (an inverse of a Q value in which only air resistance is taken into consideration). A transverse axis of the graph illustrated in FIG. 57 expresses a pressure [Pa], and a longitudinal axis thereof expresses a CI value (R1) [kΩ].

For the present examination, the resonator element 4 as illustrated in FIG. 55 was used, and the resonator 1 in which the resonator element 4 is accommodated in the package 9 was used.

Each dimension of the resonator element 4 used for the present examination is as follows. A length of the quartz crystal substrate 5 in the longitudinal direction (a length of the quartz crystal substrate 5 in the Y' axis direction) is 2200 μm, and a length of the quartz crystal substrate 5 in the transverse direction (a length of the base portion 51 in the X axis direction) is 503 μm. A length of the first base section 511 in the Y' axis direction is 286 μm, a length of the second base section 512 in the Y' axis direction is 145 μm, and a length of the connecting section 513 is 237 μm. A length (a length in the Y' axis direction) of each of the arm sections 520 and 530 is 896 μm, and a length (a length in the Y' axis direction) of each of the hammer heads 529 and 539 is 671 μm. A length (a length in the Y' axis direction) of each of a boundary between the hammer head 529 and the arm section 520 and a boundary between the hammer head 539 and the arm section 530 is 52 μm. A width (a length in the X axis direction) W3 of each of the arm sections 520 and 530 is 130 μm to 141 μm, and a width (a length in the X axis direction) W4 of the hammer heads 529 and 539 is 215 μm. A width W of each of the banks is 15 μm to 30 μm. A thickness T of the quartz crystal substrate 5 is 120 μm, and a depth of each of the grooves 525, 526, 535 and 536 is 50 μm. A length (a length in the Y' axis direction) of each of the electrode formation regions 525a, 526a, 535a and 536a is 610 μm.

It has been confirmed by the present inventors that, even if sizes (L, W, W3, W4, and T) of the resonator element 4 are changed, a tendency equivalent to that in results described below was shown. In addition, it has been confirmed by the present inventors that, even in a case where the electrode non-formation region 525b, 526b, 535b and 536b are not formed, and driving electrodes are provided on the whole inner surfaces of the grooves 525, 526, 535 and 536, a tendency equivalent to that in results described below was shown.

In the present examination, $Qv^{-1}$ for an atmospheric pressure in the package 9 is calculated as follows. First, Q (actually measured Q value) at each atmospheric pressure is actually measured while changing an atmospheric pressure in the package 9 (the accommodation space S). In a case where a vacuum degree is sufficiently high (an atmospheric pressure is sufficiently low), there may be little air resistance, and thus no loss due to the air resistance is regarded, and a Q value at this time is set to $Q_0$. In other words, a vacuum degree is increased, and a Q value when a Q value is saturated is set to $Q_0$ (saturated Q value). Therefore, from Q (actually measured Q value) and $Q_0$ (saturated Q value), Qv (a Q value in which only air resistance is taken into consideration at each atmospheric pressure) can be expressed by the following Equation (25).

$$Q^{-1}=Qv^{-1}+Q_0^{-1} \qquad (25)$$

In Equation (25), $Q^{-1}$ is an inverse of Q (actually measured Q value), $Q_0^{-1}$ is an inverse of $Q_0$ (saturated Q value), and $Qv^{-1}$ is an inverse of Qv (a Q value in which only air resistance is taken into consideration at each atmospheric pressure).

An atmospheric pressure in the package 9 (accommodation space S) may be actually measured as follows. First, the resonator 1 is placed in a vacuum chamber (not illustrated), and a CI value of the resonator 1 is measured. Next, the package 9 of the resonator 1 is opened, the resonator 1 is placed in the vacuum chamber, a vacuum degree is increased while measuring a CI value, and a vacuum degree is read when a CI value is the same as the CI value of the resonator 1 measured before the package 9 is opened. An atmospheric pressure in the package 9 can be calculated from the CI value of the resonator 1 after the package 9 is opened and the CI value of the resonator 1 before the package 9 is opened. In the present examination shown in Table 2, the resonator 1 is placed in the vacuum chamber in a state in which the package 9 of the resonator 1 is opened, and a Q value is measured in a state in which a vacuum degree of the vacuum chamber is set to a predetermined atmospheric pressure shown in Table 2.

Table 2 shows Q (actually measured Q value), Qv (a Q value in which only air resistance is taken into consideration), and $Qv^{-1}$ (an inverse of a Q value in which only air resistance is taken into consideration) at each atmospheric pressure [Pa]. FIG. 56 is a graph obtained by plotting $Qv^{-1}$ at each atmospheric pressure [Pa] on the basis of Table 2.

TABLE 2

| Atmospheric pressure [Pa] | Q | Qv | $Qv^{-1}$ |
|---|---|---|---|
| 100000 | 3,174 | 3,492 | 2.9E−04 |
| 29000 | 5,253 | 6,184 | 1.6E−04 |
| 10000 | 6,448 | 7,909 | 1.3E−04 |
| 2900 | 7,167 | 9,018 | 1.1E−04 |
| 810 | 8,906 | 11,956 | 8.4E−05 |
| 240 | 11,670 | 17,530 | 5.7E−05 |
| 100 | 18,507 | 39,380 | 2.5E−05 |
| 50 | 23,354 | 70,532 | 1.4E−05 |
| 8.3 | 27,362 | 126,479 | 7.9E−06 |
| 3.7 | 33,214 | 681,788 | 1.5E−06 |
| 0.75 | 34,758 | 7,704,898 | 1.3E−07 |
| 0.0036 | 34,916 | | |
| 0.00095 | 34,915 | | |

It can be seen from the graph illustrated in FIG. 56 that if the atmospheric pressure is lowered (the vacuum degree is increased), $Qv^{-1}$ is reduced, and when the atmospheric pressure is equal to or lower than 100 [Pa], $Qv^{-1}$ is notably reduced. $Qv^{-1}$ is an inverse of Qv (a Q value in which only air resistance is taken into consideration at each atmospheric pressure), and it can be said that as $Qv^{-1}$ of FIG. 56 is lowered, deterioration in a Q value can be reduced. Therefore, as can be seen from the graph of FIG. 56, it is proven that if an atmospheric pressure in the package 9 is equal to or lower than 100 [Pa], air resistance applied to the resonator element 4 can be further reduced, and a Q value can be further increased.

FIG. 57 is a graph obtained by plotting a result of measuring a CI value (R1) [kΩ] for an atmospheric pressure in the package 9 according to the above-described method.

It can be seen from the graph illustrated in FIG. 57 that if the atmospheric pressure is lowered (the vacuum degree is increased), R1 is reduced, and when the atmospheric pressure is equal to or lower than 100 [Pa], R1 is notably reduced. Particularly, it can be seen that when the atmospheric pressure is equal to or lower than 10 [Pa], R1 is further reduced. A CI value (R1) corresponds to air resistance applied to the resonator element 4, and it can be said that as a CI value (R1) of FIG. 57 is lowered, deterioration in a Q value can be reduced. Therefore, as can be seen from the graph of FIG. 57, it is proven that if an atmospheric pressure in the package 9 is equal to or lower than 100 [Pa], air resistance applied to the resonator element 4 can be further reduced, and a Q value can be further increased. Particularly, it is proven that, if an atmospheric pressure is equal to or lower than 10 [Pa], air resistance applied to the resonator element 4 can be further reduced; if an atmospheric pressure is equal to or lower than 1 [Pa], air resistance applied to the resonator element 4 can be even further reduced; and, most preferably, if an atmospheric pressure is equal to or lower than $10^{-1}$ [Pa], air resistance applied to the resonator element 4 can be reduced most.

From the values of R1 of FIG. 57, a lower limit value of an atmospheric pressure in the package is sufficiently $7\times10^{-4}$ Pa, and it is observed that values of R1 are saturated even an atmospheric pressure is reduced to the value or lower. Therefore, in a sealing step of the package, increasing a vacuum degree by reducing an atmospheric pressure to an atmospheric pressure lower than $7\times10^{-4}$ Pa has proven to be a cause of a time loss and cost increase in work. Therefore, it can be seen that a lower limit value of an atmospheric pressure is sufficiently $7\times10^{-4}$ Pa as a level of the vacuum degree.

2. Oscillator

Next, an oscillator having the resonator element according to the embodiments of the invention will be described.

Figure 58:
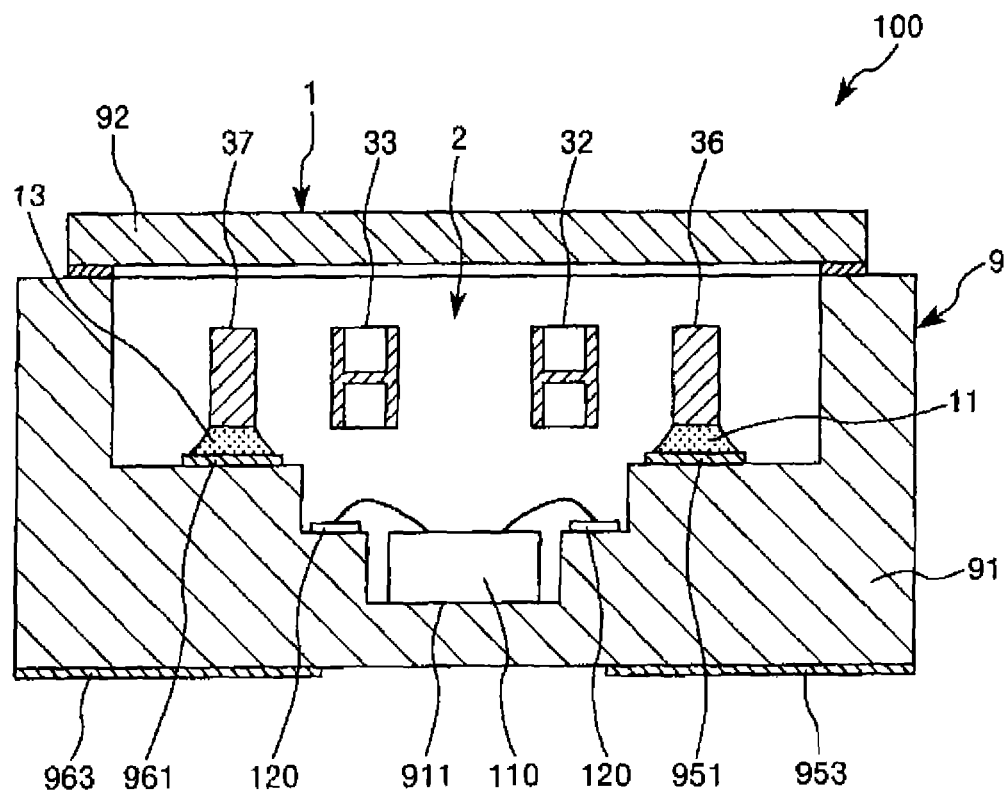
FIG. 58 is a cross-sectional view illustrating an oscillator according to an embodiment of the invention.

FIG. 58 is a cross-sectional view illustrating an oscillator according to an embodiment of the invention.

An oscillator 100 illustrated in FIG. 58 includes the resonator 1, and an IC chip 110 driving the resonator element 2. Hereinafter, the oscillator 100 will be described focusing on a difference from the above-described resonator, and description of the same content will be omitted.

As illustrated in FIG. 58, in the oscillator 100, the IC chip 110 is fixed to the recess 911 of the base 91. The IC chip 110 is electrically connected to a plurality of internal terminals 120 formed on the bottom surface of the recess 911 via wires. The plurality of internal terminals 120 may be connected to the connection terminals 951 and 961 and may be connected to the external terminals 953 and 963. The IC chip 110 includes an oscillation circuit (circuit) for controlling driving of the resonator element 2. When the resonator element 2 is driven by the IC chip 110, a signal with a predetermined frequency can be extracted.

The resonator element 4 may be used instead of the resonator element 2.

In FIG. 58, a description has been made of the configuration in which the IC chip 110 is disposed in the accommodation space, but an arrangement of the IC chip 110 is not particularly limited, and, for example, the IC chip 110 may be disposed on the outside (the bottom surface of the base) of the package 9.

According to the oscillator 100, it is possible to exhibit good reliability.

3. Electronic Apparatus

Next, a description will be made of an electronic apparatus including the resonator element to which the invention is applied.

Figure 59:
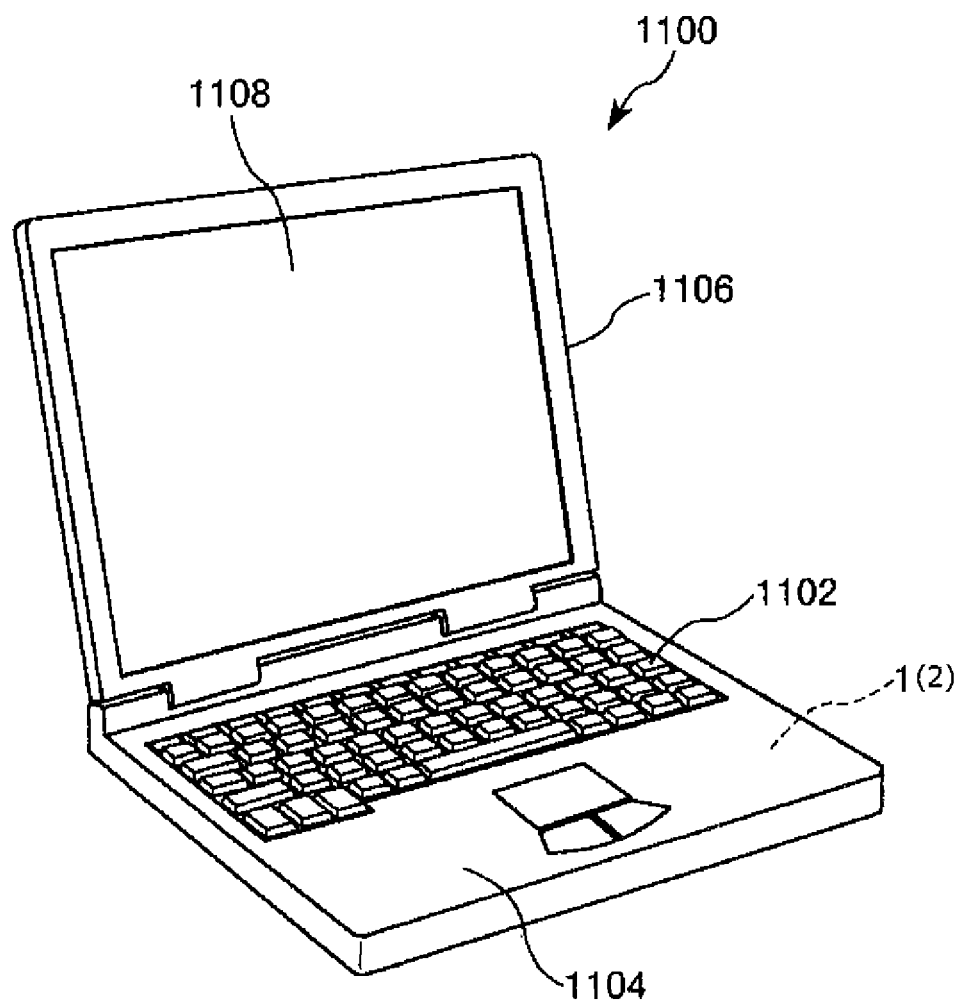
FIG. 59 is a perspective view illustrating a configuration of a mobile type (or a notebook type) personal computer as an example of an electronic apparatus to which the invention is applied.

FIG. 59 is a perspective view illustrating a configuration of a mobile type (or a notebook type) personal computer as an example of an electronic apparatus to which the invention is applied. In FIG. 59, a personal computer 1100 is constituted by a main body portion 1104 having a keyboard 1102 and a display unit 1106 having a display portion 1108, and the display unit 1106 is supported so as to be rotatably moved with respect to the main body portion 1104 via a hinge structure portion. The personal computer 1100 includes the resonator 1 (the resonator element 2 or 4), embedded therein, which functions as a filter, a resonator, a reference clock and the like.

Figure 60:
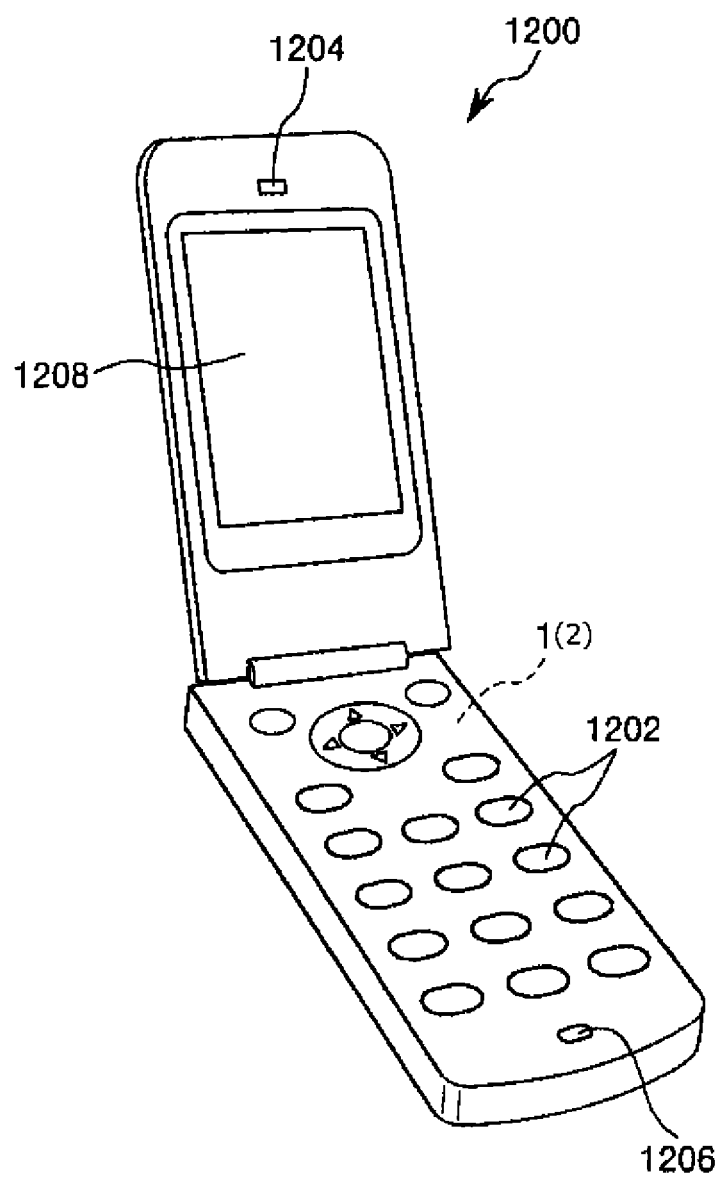
FIG. 60 is a perspective view illustrating a configuration of a mobile phone (including a PHS) as an example of an electronic apparatus to which the invention is applied.

FIG. 60 is a perspective view illustrating a configuration of a mobile phone (including PHS) as an example of an electronic apparatus to which the invention is applied. In FIG. 60, a mobile phone 1200 includes a plurality of operation buttons 1202, an earpiece 1204, and a mouthpiece 1206, and a display portion 1208 is disposed between the operation buttons 1202 and the mouthpiece 1204. The mobile phone 1200 includes the resonator 1 (the resonator element 2 or 4), embedded therein, which functions as a filter, a resonator, and the like.

Figure 61:
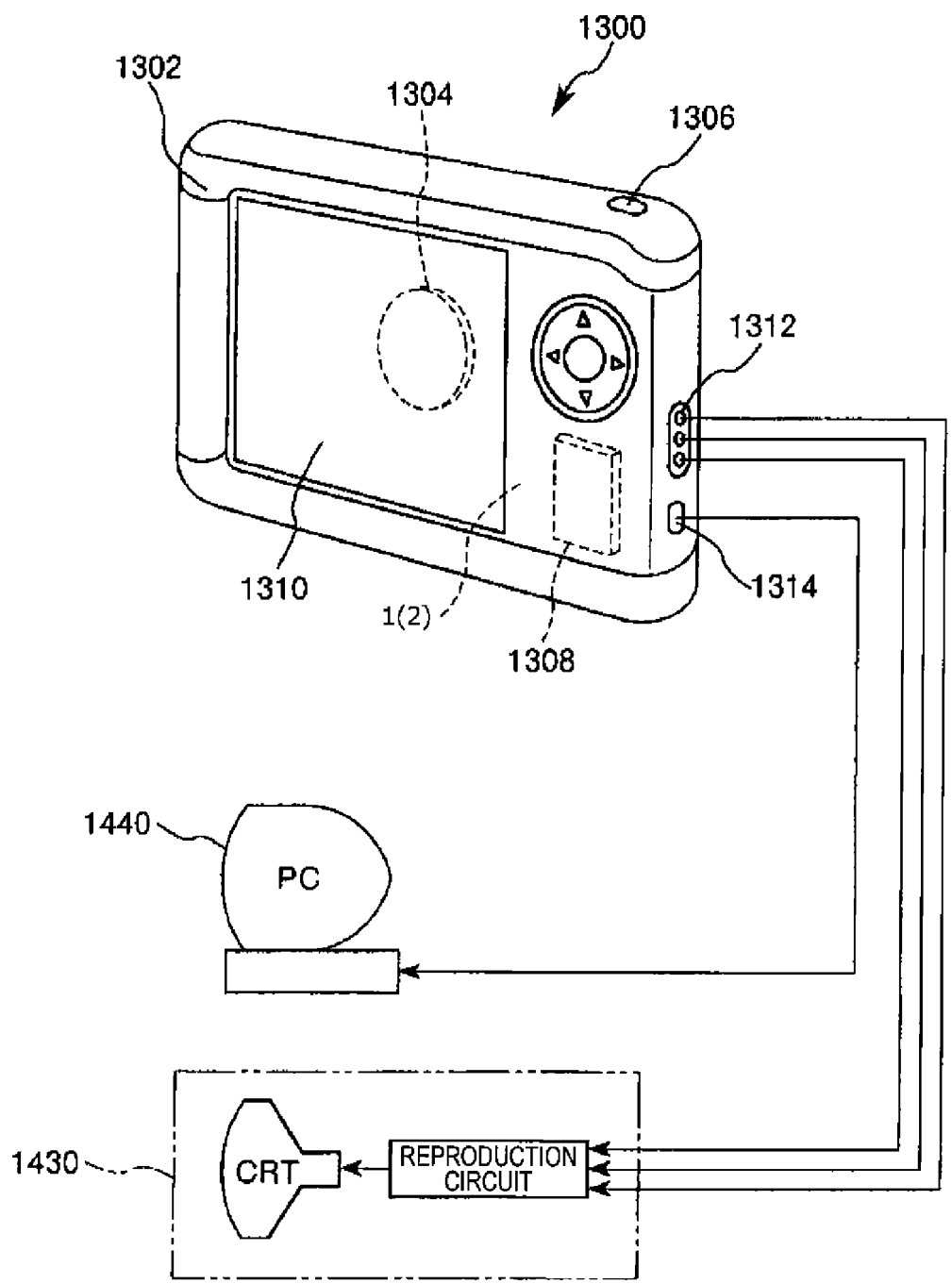
FIG. 61 is a perspective view illustrating a configuration of a digital still camera as an example of an electronic apparatus to which the invention is applied.

FIG. 61 is a perspective view illustrating a configuration of a digital still camera as an example of an electronic apparatus to which the invention is applied. In addition, in FIG. 61, connection to an external apparatus is also briefly illustrated. Here, a typical camera exposes a silver halide photography film to light using a light image of a subject, whereas the digital still camera 1300 performs photoelectric conversion on a light image of a subject by using an imaging device such as a charge coupled device (CCD) so as to generate an imaging signal (image signal).

A display portion 1310 is provided on a rear side of a case (body) 1302 of the digital still camera 1300 and performs display on the basis of an imaging signal generated by the CCD, and the display portion functions a view finder which displays a subject as an electronic image. In addition, a light sensing unit 1304 which includes an optical lens (imaging optical system), a CCD, and the like is provided on a front side (the rear side in FIG. 61) of the case 1302.

When a photographer confirms a subject image displayed on the display portion and presses a shutter button 1306, an imaging signal of the CCD at this point is transmitted to and stored in a memory 1308. In addition, in this digital camera 1300, video signal output terminals 1312 and input and output terminals 1314 for data communication are provided on a side surface of the case 1302. Further, as illustrated in FIG. 61, the video signal output terminals 1312 are connected to a television monitor 1430 and the input and output terminals 1314 for data communication are connected to a personal computer (PC) 1440 as necessary. Furthermore, an imaging signal stored in the memory 1308 is output to the television monitor 1430 or the personal computer 1440 through a predetermined operation. The digital still camera 1300 includes the resonator 1 (resonator element 2 or 4), embedded therein, which functions as a filter, a resonator, a reference clock, and the like.

The electronic apparatus including the resonator element to which the invention is applied is applicable not only to the personal computer (a mobile type personal computer) of FIG. 59, the mobile phone of FIG. 60, and the digital camera of FIG. 61, but also to, for example, an ink jet type ejection apparatus (for example, an ink jet printer), a laptop type personal computer, a television, a video camera, a video tape recorder, a car navigation apparatus, a pager, an electronic organizer (including a communication function), an electronic dictionary, an electronic calculator, an electronic gaming machine, a wordprocessor, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), and a flight simulator.

4. Mobile Object

Next, a description will be made of a mobile object including the resonator element to which the invention is applied.

Figure 62:
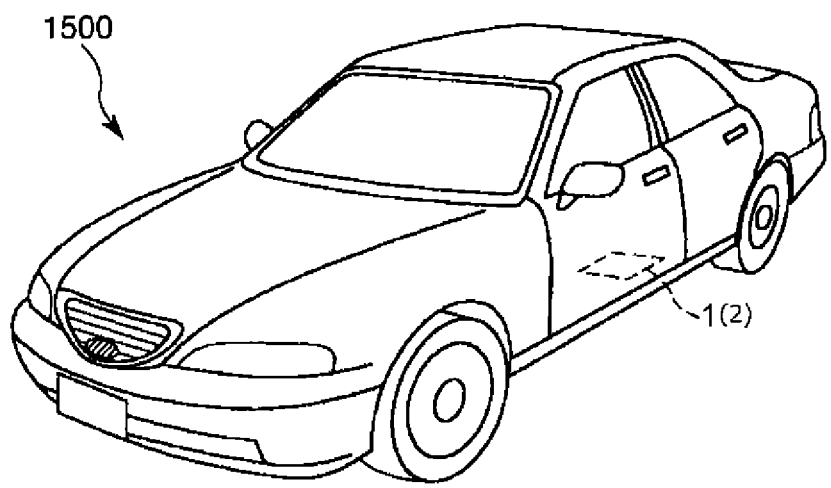
FIG. 62 is a perspective view illustrating an automobile as an example of a mobile object to which the invention is applied.

FIG. 62 is a perspective view schematically illustrating an automobile as an example of a mobile object to which the invention is applied. The automobile 1500 includes the resonator 1 (resonator element 2) mounted therein. The resonator 1 is widely applicable to electronic control units (ECU) such as, for example, a keyless entry, an immobilizer, a car navigation system, a car air conditioner, an antilock brake system (ABS), an air bag, a tire pressure monitoring system (TPMS), engine control, a battery monitor of a hybrid car or an electric car, and a vehicle dynamic control system.

As mentioned above, although the resonator element, the resonator, the oscillator, the electronic apparatus, and the mobile object according to the embodiments of the invention have been described on the basis of the illustrated embodiments, the invention is not limited thereto, and a configuration of each section may be replaced with any configuration having the same function. In addition, any other configuration may be added to the invention. Further, the above-described embodiments may be combined as appropriate.

What is claimed is:
1. A resonator element comprising:
 a resonator blank including:
  a base portion;
  a vibrating arm that extends from a first end side of the base portion in a plan view;
  a linking portion that is disposed on a second end side of the base portion in the plan view; and
  a connecting portion that is disposed between the base portion and the linking portion, and connects the base portion and the linking portion to each other,
  the vibrating arm including:
   a weight section; and
   an arm section that is disposed between the base portion and the weight section,
 when a thickness of the resonator blank is set to T, a width of the base portion in a direction intersecting an extending direction of the vibrating arm is set to W1, and a width of the connecting portion in the intersecting direction is set to W2, a relationship of 50 µm≤T≤210 µm is satisfied, and a relationship of 0.067≤W2/W1≤0.335 is satisfied, and
 when a width of the arm section in the intersecting direction is set to W3, and a width of the weight section in the intersecting direction is set to W4, a relationship of W4≥2.8×W3 is satisfied.

2. The resonator element according to claim 1, wherein a relationship of 110 µm≤T≤210 µm is satisfied.

3. A resonator comprising:
 the resonator element according to claim 2; and
 a package in which the resonator element is mounted.

4. An oscillator comprising:
the resonator element according to claim 2; and
a circuit.

5. An electronic apparatus comprising the resonator element according to claim 2.

6. A resonator comprising:
the resonator element according to claim 1; and
a package in which the resonator element is mounted.

7. The resonator according to claim 6,
wherein the vibrating arm vibrates in a flexural vibration mode, and
wherein an atmospheric pressure in the package is equal to or lower than 100 Pa.

8. The resonator according to claim 7,
wherein an atmospheric pressure in the package is equal to or lower than 10 Pa.

9. The resonator according to claim 7,
wherein an atmospheric pressure in the package is equal to or higher than $7\times10^{-4}$ Pa.

10. The resonator element according to claim 1,
wherein the linking portion extends in the intersection direction, and
wherein the resonator element further includes a support arm that is linked to the linking portion and extends in the extending direction of the vibrating arm.

11. The resonator element according to claim 1,
wherein a groove is provided on at least one main surface side of a pair of main surfaces which are front and rear surfaces with respect to each other in the arm section.

12. The resonator element according to claim 1,
wherein, when a length of the vibrating arm in the extending direction is set to L, and a length of the weight section in the extending direction is set to H, the vibrating arm satisfies $0.183 \leq H/L \leq 0.597$.

13. The resonator element according to claim 1,
wherein, when a length of the vibrating arm in the extending direction is set to L, and a length of the weight section in the extending direction is set to H, the vibrating arm satisfies $0.012 < H/L < 0.30$.

14. An oscillator comprising:
the resonator element according to claim 1; and
a circuit.

15. An electronic apparatus comprising the resonator element according to claim 1.

16. A mobile object comprising the resonator element according to claim 1.

17. A resonator element comprising:
a resonator blank including
a base portion;
a vibrating arm that extends from a first end side of the base portion in a plan view;
a linking portion that is disposed on a second end side of the base portion in the plan view; and
a connecting portion that is disposed between the base portion and the linking portion, and connects the base portion and the linking portion to each other,
the vibrating arm including:
a weight section; and
an arm section that is disposed between the base portion and the weight section,
when a thickness of the resonator blank is set to T, a width of the base portion in a direction intersecting an extending direction of the vibrating arm is set to W1, and a width of the connecting portion in the intersecting direction is set to W2, a relationship of $50\ \mu m \leq T \leq 100\ \mu m$ is satisfied, and a relationship of $0.603 \leq W2/W1 \leq 0.871$ is satisfied, and
when a width of the arm section in the intersecting direction is set to W3, and a width of the weight section in the intersecting direction is set to W4, a relationship of $W4 \geq 2.8 \times W3$ is satisfied.

18. The resonator element according to claim 17,
wherein a relationship of $50\ \mu m \leq T \leq 80\ \mu m$ is satisfied.

19. A resonator element comprising:
a resonator blank including
a base portion;
a vibrating arm that extends from a first end side of the base portion in a plan view;
a linking portion that is disposed on a second end side of the base portion in the plan view; and
a connecting portion that is disposed between the base portion and the linking portion, and connects the base portion and the linking portion to each other,
the vibrating arm including:
a weight section; and
an arm section that is disposed between the base portion and the weight section,
when a thickness of the resonator blank is set to T, a width of the base portion in a direction intersecting an extending direction of the vibrating arm is set to W1, and a width of the connecting portion in the intersecting direction is set to W2, a relationship of $110\ \mu m \leq T \leq 210\ \mu m$ is satisfied, and a relationship of $0.134 \leq W2/W1 \leq 0.335$ is satisfied, and
when a width of the arm section in the intersecting direction is set to W3, and a width of the weight section in the intersecting direction is set to W4, a relationship of $W4 \geq 2.8 \times W3$ is satisfied.

20. A resonator element comprising:
a resonator blank including:
a base portion;
a vibrating arm that extends from one end side of the base portion in a plan view;
a linking portion that is disposed on the other end side of the base portion in the plan view; and
a connecting portion that is disposed between the base portion and the linking portion, and connects the base portion and the linking portion to each other,
the vibrating arm including:
a weight section; and
an arm section that is disposed between the base portion and the weight section,
when a thickness of the resonator blank is set to T, a width of the base portion in a direction intersecting an extending direction of the vibrating arm is set to W1, and a width of the connecting portion in the intersecting direction is set to W2, a relationship of $150\ \mu m \leq T \leq 210\ \mu m$ is satisfied, and a relationship of $0.067 \leq W2/W1 \leq 0.871$ is satisfied, and
when a width of the arm section in the intersecting direction is set to W3, and a width of the weight section in the intersecting direction is set to W4, a relationship of $W4 \geq 2.8 \times W3$ is satisfied.

* * * * *